(12) United States Patent
Yu et al.

(10) Patent No.: US 11,429,027 B2
(45) Date of Patent: Aug. 30, 2022

(54) PHOTOLITHOGRAPHY METHOD AND APPARATUS

(71) Applicant: TAIWAN SEMICONDUCTOR MANUFACTURING CO., LTD., Hsinchu (TW)

(72) Inventors: Shinn-Sheng Yu, Hsinchu (TW); Ru-Gun Liu, Zhubei (TW); Hsu-Ting Huang, Hsinchu (TW); Chin-Hsiang Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 153 days.

(21) Appl. No.: 16/534,965

(22) Filed: Aug. 7, 2019

(65) Prior Publication Data
US 2020/0057375 A1 Feb. 20, 2020

Related U.S. Application Data

(60) Provisional application No. 62/719,313, filed on Aug. 17, 2018.

(51) Int. Cl.
*G03F 7/20* (2006.01)
*G03F 1/26* (2012.01)
*G03F 1/22* (2012.01)
*G03F 1/30* (2012.01)

(52) U.S. Cl.
CPC .............. *G03F 7/2022* (2013.01); *G03F 1/22* (2013.01); *G03F 1/26* (2013.01); *G03F 1/30* (2013.01); *G03F 7/70033* (2013.01); *G03F 7/70483* (2013.01)

(58) Field of Classification Search
None
See application file for complete search history.

(56) References Cited

U.S. PATENT DOCUMENTS

| 6,607,786 B2 | 8/2003 | Yan et al. |
| 7,169,514 B2 | 1/2007 | Lee |
| 9,041,908 B2 | 5/2015 | Ruoff |
| 9,075,313 B2 | 7/2015 | Yu et al. |

(Continued)

FOREIGN PATENT DOCUMENTS

| CN | 1902468 A | 1/2007 |
| CN | 108227396 A | 6/2018 |

(Continued)

OTHER PUBLICATIONS

Notice of Allowance issued in corresponding Korean Patent Application No. 10-2019-0100391, dated Jul. 29, 2021.

*Primary Examiner* — Kathleen Duda
(74) *Attorney, Agent, or Firm* — McDermott Will & Emery LLP

(57) ABSTRACT

An extreme ultraviolet lithography (EUVL) method includes providing at least two phase-shifting mask areas having a same pattern. A resist layer is formed over a substrate. An optimum exposure dose of the resist layer is determined, and a latent image is formed on a same area of the resist layer by a multiple exposure process. The multiple exposure process includes a plurality of exposure processes and each of the plurality of exposure processes uses a different phase-shifting mask area from the at least two phase-shifting mask areas having a same pattern.

20 Claims, 51 Drawing Sheets

(56) References Cited

U.S. PATENT DOCUMENTS

| | | | |
|---|---|---|---|
| 9,488,905 B2 | 11/2016 | Lu et al. | |
| 10,162,257 B2 | 12/2018 | Lu et al. | |
| 2005/0018164 A1* | 1/2005 | Hansen | G03F 7/70108 355/69 |
| 2007/0258071 A1* | 11/2007 | Case | G03F 7/70283 355/53 |
| 2010/0187658 A1 | 7/2010 | Wei | |
| 2014/0272720 A1 | 9/2014 | Yu et al. | |
| 2015/0077731 A1 | 3/2015 | Lin et al. | |
| 2017/0082926 A1 | 3/2017 | Lin et al. | |
| 2017/0248842 A1 | 8/2017 | Oster et al. | |

FOREIGN PATENT DOCUMENTS

| | | |
|---|---|---|
| JP | 2002-141275 A | 5/2002 |
| KR | 10-2012-0073117 A | 7/2012 |
| KR | 10-2014-0096750 A | 8/2014 |

\* cited by examiner

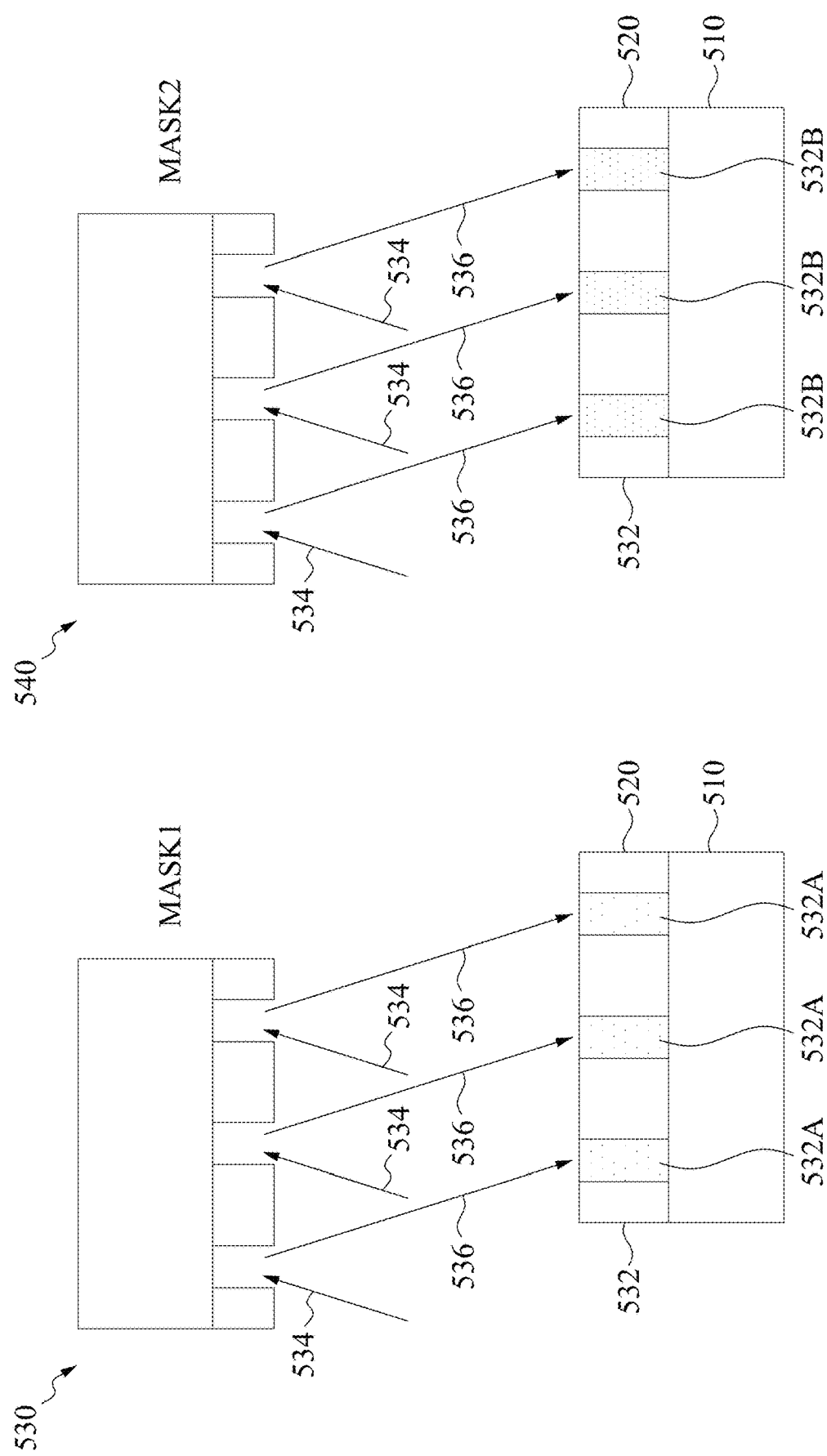

PHOTOLITHOGRAPHY METHOD AND APPARATUS

CROSS-REFERENCE TO RELATED APPLICATIONS

This application claims priority to U.S. Provisional Patent Application No. 62/719,313, filed Aug. 17, 2018, the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also increased the complexity of processing and manufacturing ICs and, for these advances to be realized, similar developments in IC processing and manufacturing are needed. For example, higher resolution lithography processes, such as extreme ultraviolet (EUV) lithography processes, are implemented to meet size constraints approaching critical dimension tolerances of 7-nm technology nodes and below. EUV lithography uses a reflective mask (also referred to as a reticle) to transfer a pattern of a layer of an integrated circuit device to a wafer. A reflective mask typically includes a reflective multilayer coating (multi-layered mirror stack) disposed on a substrate. Any defects, including microscopic defects, in the substrate, reflective multilayers, or absorbers can undesirably affect printability of the pattern of the reflective mask. Such defects are often difficult to inspect and, even if detected, difficult to repair. Accordingly, although existing EUV masks and methods of manufacturing EUV masks have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 8A, 8B, 8C, 8D, and 8F are diagrammatic cross-sectional views of a resist layer during various stages manufacturing a semiconductor device according to embodiments of the disclosure.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

The following description refers to an EUV photomask or an EUV phase-shifting mask (PSM) and a mask fabrication process. The terms photomask and mask are used interchangeably. The mask fabrication process includes two operations: a blank mask fabrication process and a mask patterning process. During the blank mask fabrication process, a blank mask is formed by depositing suitable layers (e.g., a reflective multilayer) on a suitable substrate. The blank mask is patterned during the mask patterning process to have a design of a layer of an integrated circuit (IC). The patterned mask is then used to transfer circuit patterns (e.g., the design of a layer of an IC) onto a semiconductor wafer. The patterns on the mask can be transferred over and over onto multiple wafers through various lithography processes. Several masks (for example, a set of 15 to 30 masks) may be used to construct a complete IC. In general, various masks are fabricated for use in various lithography processes. Types of masks include a binary intensity mask (BIM) and a phase-shifting mask (PSM).

Figure 1:
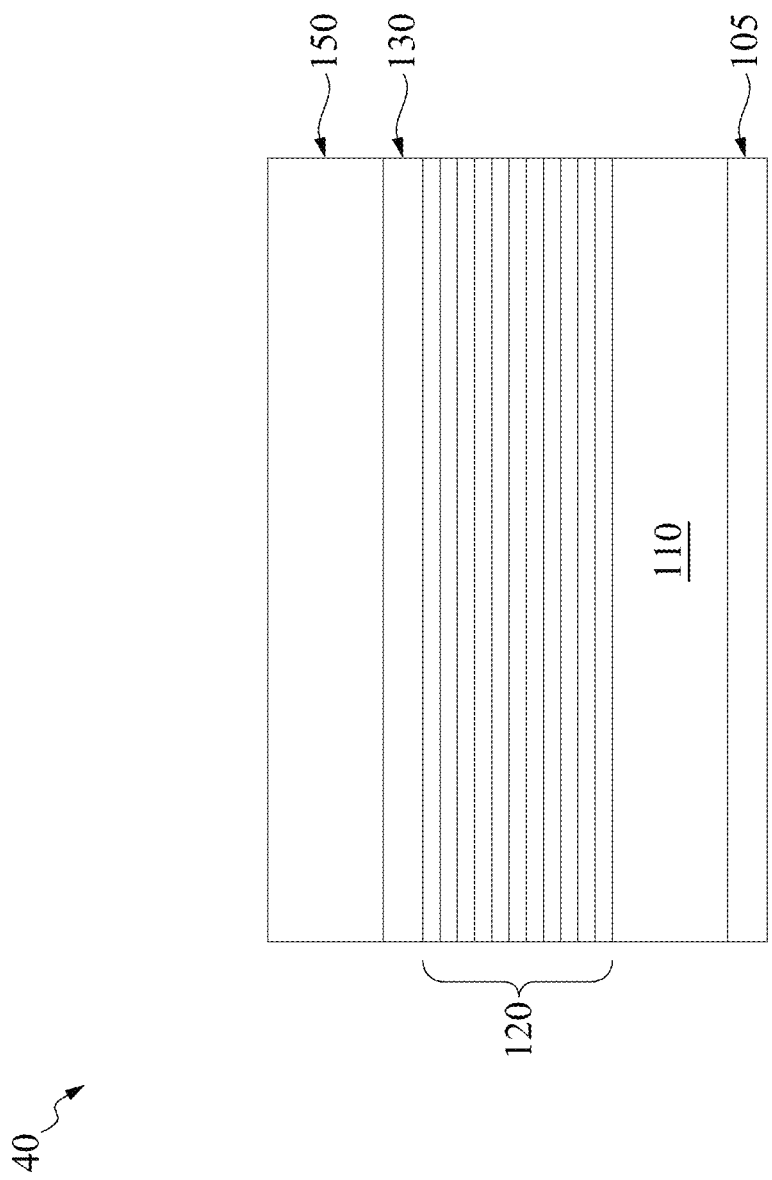
FIG. 1 is a diagrammatic cross-sectional view of an EUV mask at a fabrication stage constructed according to an embodiment of the disclosure.
Figure 2:
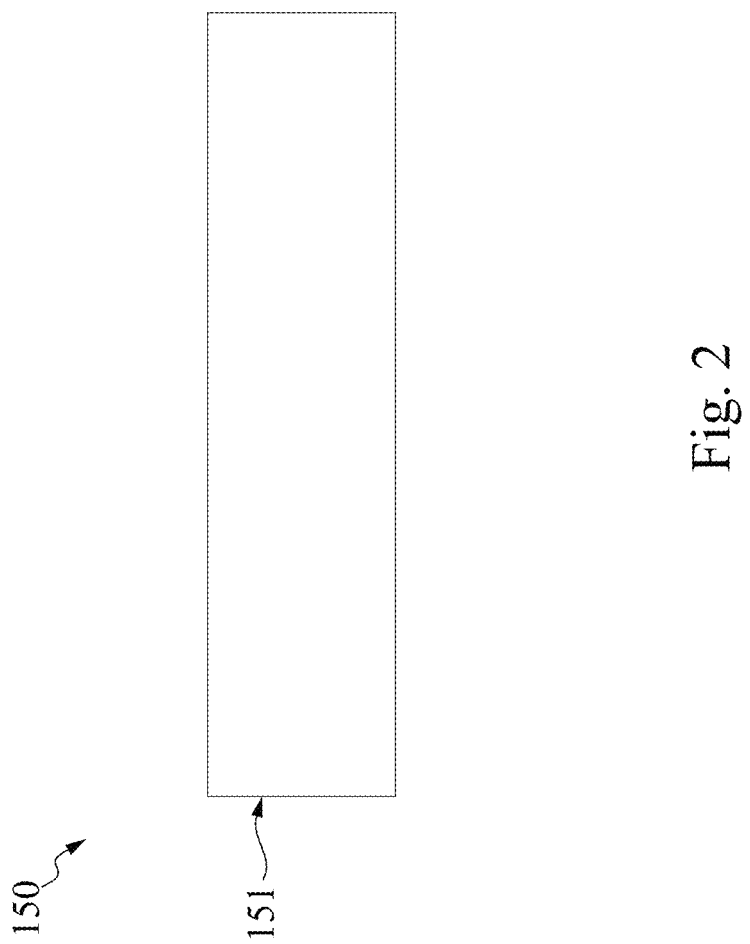
FIG. 2 is a diagrammatic cross-sectional view of the EUV mask (in portion) of FIG. 1 constructed according to an embodiment of the disclosure.

FIGS. 1 and 2 are sectional views of a photomask 40 at various fabrication stages constructed according to embodiments of the present disclosure. The mask 40 and the method of making the same are collectively described with reference to FIGS. 3 and 4 and other figures. In the following embodiments, the mask 40 is a phase-shifting mask (PSM).

Referring to FIG. 1, the mask 40 at this stage is a blank EUV mask that includes a substrate 110 made of low thermal expansion material (LTEM). The LTEM material may include $TiO_2$ doped $SiO_2$, or other low thermal expansion materials known in the art. The LTEM substrate 110 serves to minimize image distortion due to mask heating. In the present embodiment, the LTEM substrate 110 includes materials with a low defect level and a smooth surface. In addition, a conductive layer 105 may be disposed on back surface of the LTEM substrate 110 for the electrostatic chucking purpose. In an embodiment, the conductive layer 105 includes chromium nitride (CrN), though other compositions are possible.

A reflective multilayer (ML) 120 is deposited over the LTEM substrate 110 on the front surface. The ML 120 is also referred to as a first reflective layer, to avoid confusion when another reflective layer is introduced later. According to Fresnel equations, light reflection will occur when light propagates across the interface between two materials of different refractive indices. The reflected light is larger when the difference of refractive indices is larger. To increase the reflected light, one may also increase the number of interfaces by depositing a multilayer of alternating materials and let light reflected from different interfaces interfere constructively by choosing appropriate thickness for each layer inside the multilayer. However, the absorption of the employed materials for the multilayer limits the highest reflectivity that can be achieved. The ML 120 includes a plurality of film pairs, such as molybdenum-silicon (Mo/Si) film pairs (e.g., a layer of molybdenum above or below a layer of silicon in each film pair). Alternatively, the ML 120 may include molybdenum-beryllium (Mo/Be) film pairs, or any material that is highly reflective at EUV wavelengths can be used for the ML 120. The thickness of each layer of the ML 120 depends on the EUV wavelength and the incident angle. The thickness of the ML 120 is adjusted to achieve a maximum constructive interference of the EUV light reflected at each interface and a minimum absorption of the EUV light by the ML 120. The ML 120 is selected such that it provides a high reflectivity to a selected radiation wavelength in some embodiments. In some embodiments, the number of film pairs ranges from 20 to 80, however any number of film pairs is possible. In an embodiment, the ML 120 includes forty pairs of layers of Mo/Si. Each Mo/Si film pair has a thickness of about 7 nm, with a total thickness of 280 nm. In this case, an EUV reflectivity of about 70% is achieved.

A buffer layer 130 is formed above the ML 120 for one or more functions in some embodiments. In one embodiment, the buffer layer 130 functions as an etch stop layer in a patterning process or other operations, such as repairing or cleaning. In another embodiment, the buffer layer 130 functions to prevent oxidation of the ML 120. The buffer layer 130 may include one or more films to achieve the intended functions. In the present embodiment, the buffer layer 130 has different etching characteristics from a second reflective layer 150, which will be described later. In one embodiment, the buffer layer 130 includes ruthenium (Ru). In furtherance of the example, the buffer layer 130 includes a Ru film with a thickness ranging between about 2-5 nm. In other embodiments, the buffer layer 130 includes Ru compounds such as RuB and RuSi, chromium (Cr), Cr oxide, or Cr nitride. A low temperature deposition process is used in some embodiments, to form the buffer layer 130 to prevent inter-diffusion of the ML 120.

In an embodiment, the mask 40 includes the second reflective layer 150 formed over the first reflective layer 120. In the embodiment where the buffer layer 130 is present, the second reflective layer 150 is formed over the buffer layer 130, as illustrated in FIG. 1. The second reflective layer 150 is to be patterned according to an IC layout. The second reflective layer is designed to generate a 180° phase shift in the reflection coefficient (with respect to the region where the second reflective layer is removed after patterning) so that a phase-shifting mask for EUVL can be realized. Here, the relative reflection coefficient of a first region with respect to a second region is defined as the ratio of the amplitudes (complex numbers, including information of phases), evaluated at the same vertical height from a common mask surface of light reflected from the first region and the second region with the same incident light.

When the reflection coefficient is −1 ("1" meaning no attenuation and "−" meaning 180° phase shift), then the mask 40 is an alternating phase-shifting mask (Alt-PSM), in which case there is no 0-th order diffraction, if the line-to-space area ratio of the IC layout is 1:1, and the highest aerial image contrast can be achieved. However, if the required thickness of the second reflective layer is too large, there arises a mask shadowing effect, which in turn degrades the aerial image contrast. Therefore, the design of the second reflective layer needs to be compromise between the reflection coefficient and thickness. The highest aerial image contrast is achieved in some embodiments because the 0-th order diffraction is removed by a pupil filter. However, if the reflection coefficient is close to −1, then the amplitude of the 0-th diffraction order is close to 0 and the exposure dose loss due to removal of the 0-th diffraction order is minimized and the throughput of the exposure tool is maximized. Moreover, if the required thickness of the second reflective layer to achieve a 180° phase shift is smaller, light scattering due to the mask topography is reduced and the throughput of the exposure tool is further enhanced due to the increase of the strength of the +/−1-st diffraction order. In the EUV wavelength range, every material is highly absorptive. It is difficult to achieve a reflection coefficient close to −1 using a single material for the second reflective layer. In EUVL, a multilayer of alternating materials is used to achieve a high reflectivity. The reflectivity is defined as the absolute value squared of the reflection coefficient.

For EUVL using an imaging wavelength at 13.5 nm, Si and Mo are used as set forth above because they give the largest integrated reflectivity over the spectral range around 13.5 nm. A ML design consists of Si/Mo pairs with about 4 nm Si on about 3 nm Mo in each pair. When this ML design is employed for the second reflective layer 150 to realize a phase-shifting mask, each Si/Mo pair contributes a phase shift of about 12°. Thus, to achieve a 180° phase shift, 15 Si/Mo pairs are needed, with a total thickness of about 105 nm, in which case the mask shadowing effect should be prominent. Since the refractive index and the extinction coefficient of Si at the EUV wavelength are close to 1 and 0, respectively, Si contributes little to the phase shift (with reference to light propagating in air). Almost the entire phase shift is due to the presence of Mo. The role Si plays is to generate more Si/Mo interfaces, where the reflection of light takes place. Thus, the total thickness of Mo should be close to 44 nm, no matter what design is adopted for the second reflective layer. In an embodiment of the ML design, the phase difference of light reflected from adjacent Si/Mo pairs is 360° (the minimum value since only integer multiples of 360° provide high reflectivity). In such a case, every 3 nm Mo layer is accompanied by a 4 nm Si layer, resulting in a large film stack height. However, if the phase difference of light reflected from adjacent Si/Mo pairs is 720° then it is not necessary to insert so many Si layers and the total thickness required to generate a 180° phase shift for the second reflective layer can be reduced.

In the first embodiment, the second reflective layer 150 includes a single molybdenum (Mo) layer 151 with a thickness of about 44 nm, as illustrated in FIG. 2. As previously explained herein, this should be the thinnest design of the second reflective layer if Mo is used. In this embodiment, the reflection coefficient is about −0.7757 and the reflectivity is about 0.6017.

Figure 3:
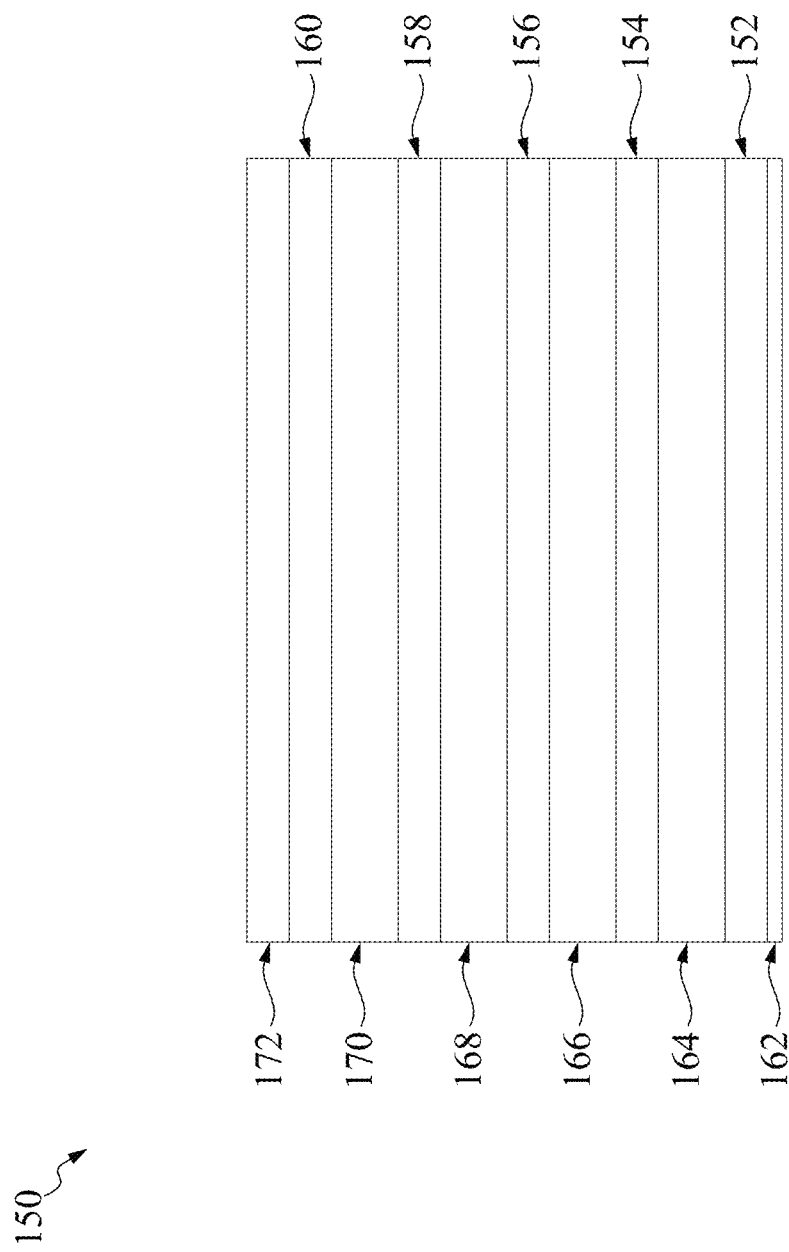
FIG. 3 is a diagrammatic cross-sectional view of the EUV mask (in portion) of FIG. 1 according to an embodiment of the disclosure.

In a second embodiment, the second reflective layer 150 includes multiple films, as illustrated in FIG. 3 (a cross-sectional view). Particularly, the second reflective layer 150 includes five Mo films 152, 154, 156, 158, and 160 as well as five Si films 162, 164, 166, 168, and 170 configured such that two adjacent Mo films sandwich a Si film and two adjacent Si films sandwich a Mo film. In the present embodiment, the Mo film 152 has a thickness of about 1 nm; the Mo films 154, 156, 156, and 158 have a same thickness of about 10.1 nm; the Si film 162 has a thickness of about 4 nm; the Si films 164, 166, and 168 have a same thickness of about 4.3 nm; the top Si film 170 has a thickness of about 2.6 nm. The second reflective layer 150 may further include another buffer layer 172 deposited on the top silicon film 160. In this embodiment, the reflection coefficient is about −0.8665 and the reflectivity is about 0.7508. In this embodiment, the total thickness of the second reflective layer 150 is about 63.4 nm, which is much smaller than 105 nm. Compared with the first embodiment (single Mo layer), though the total thickness of the second reflective layer is larger by about 19.4 nm, and the reflectivity is about 55.7% higher.

In either the first or second embodiment, each of the thickness is within 20% of its respective nominal value. Stated differently, each thickness is in a range from 80% to 120% of its respective nominal value. The buffer layer 172 is similar to the buffer layer 130. For example, the buffer layer 172 includes a Ru film. In some embodiments, the buffer layer 172 includes a Ru film with a thickness ranging from about 2 nm to about 5 nm. In other embodiments, the buffer layer 172 includes Ru compounds, such as ruthenium boron (RuB) and ruthenium silicon (RuSi), chromium (Cr), Cr oxide, or Cr nitride.

Referring back to FIG. 1, one or more of the layers 105, 120, 130, and 150 (such as 151 in FIG. 2 or 152-170 in FIG. 3) may be formed by various methods, including physical vapor deposition (PVD) process, such as evaporation and DC magnetron sputtering; a plating process, such as electrode-less plating or electroplating; a chemical vapor deposition (CVD) process such as atmospheric pressure CVD (APCVD), low pressure CVD (LPCVD), plasma enhanced CVD (PECVD), or high density plasma CVD (HDP CVD); atomic layer deposition (ALD); ion beam deposition; spin-on coating; metal-organic decomposition (MOD); and/or other methods known in the art. MOD is a deposition technique using a liquid-based method in a non-vacuum environment. By using MOD, a metal-organic precursor dissolved in a solvent, is spin-coated onto a substrate and the solvent is evaporated. A vacuum ultraviolet (VUV) source is used to convert the metal-organic precursors to its constituent metal elements.

Figure 4:
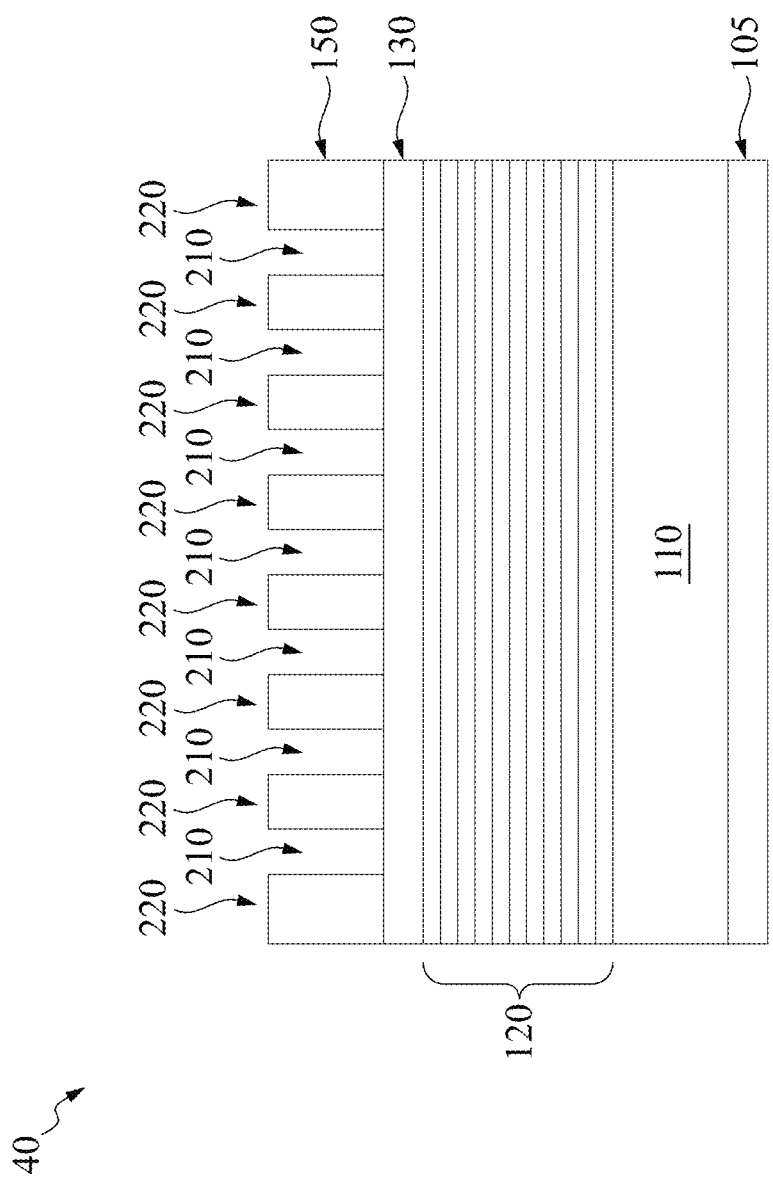
FIG. 4 is a diagrammatic cross-sectional view of the EUV mask (in portion) of FIG. 1 $d$ according to embodiments of the disclosure.

Referring to FIG. 4, in an embodiment, the second reflective layer 150 is patterned to form a mask with two states. The second reflective layer 150 is patterned to form a state 210 and a state 220 by a mask patterning process. The mask patterning process may include resist coating (e.g., spin-on coating), soft baking, mask aligning, exposure, post-exposure baking, developing, rinsing, drying (e.g., hard baking), other suitable processes, and/or combinations thereof to form a patterned resist layer. Electron, ion, or photon beam direct writing can be used for the exposure step in the mask patterning process.

In the patterning process of the previous section, an etching process is used subsequently to remove portions of the second reflective layer 150 with the patterned resist layer as an etching mask. The etching process may include dry (plasma) etching, wet etching, and/or other etching methods. For the state 210, the second reflective layer is removed. For the state 220, the second reflective layer remains.

Still referring to FIG. 4, now the EUV mask 40 includes two states, 210 and 220. The reflection coefficients of state 210 and state 220 are r1 and r2, respectively. The two states are configured such that the absolute value of r2 is substantially equal or close to the absolute value of r1. In this embodiment, the reflected EUV light from a region with the state 210 and the reflected EUV light from a region with the state 220 have an 180° phase difference.

Figure 5:
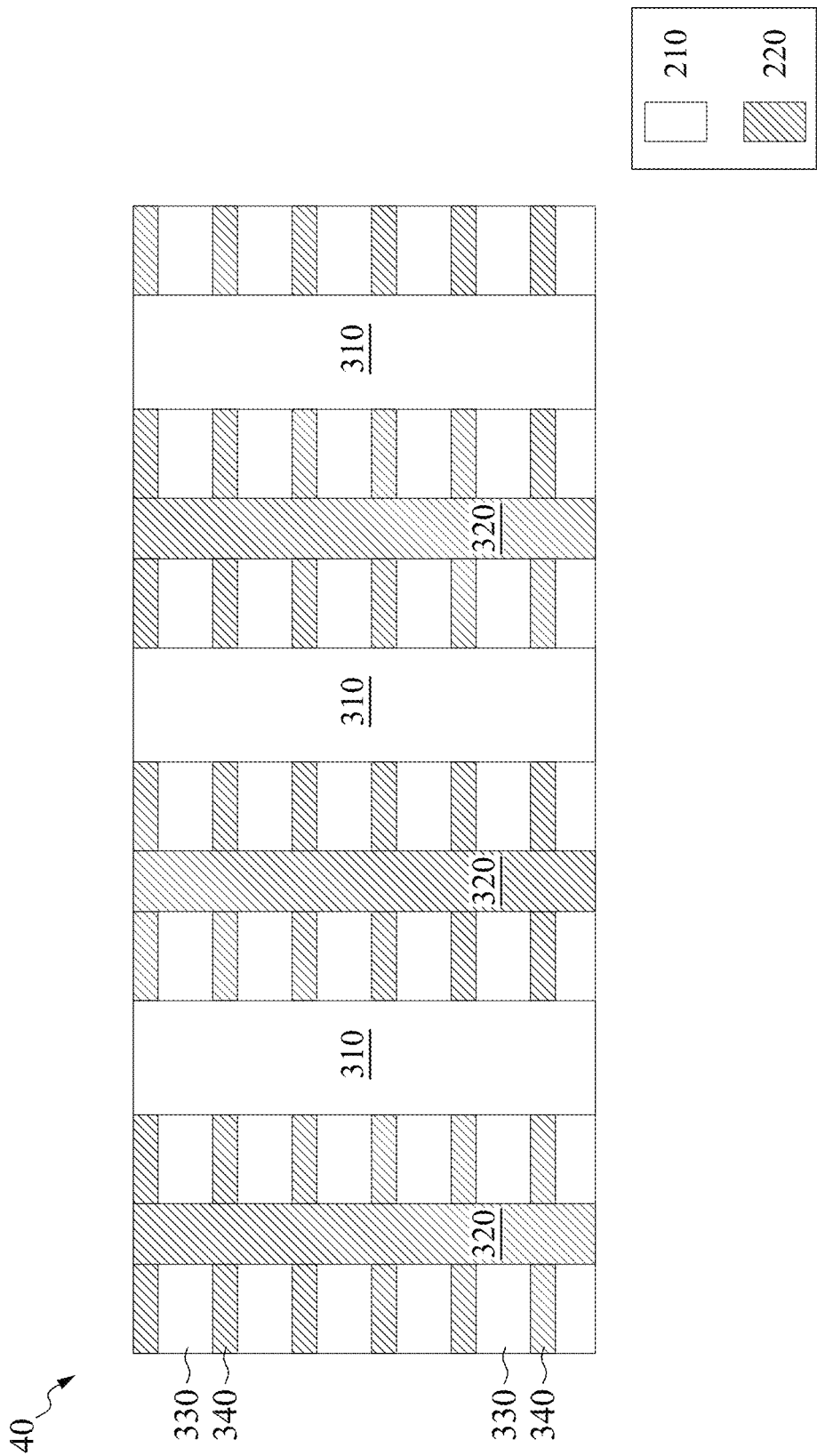
FIG. 5 is a diagrammatic top view of an EUV mask according to embodiments of the disclosure.

FIG. 5 is a top view of the mask 40 constructed according to an embodiment of the disclosure. Removing the 0th order diffraction (in the frequency space) leads to spatial frequency doubling (in the real space). Hence, spatial frequency halving on the mask 40 is necessary to obtain the desired IC patterns on the target. This can be achieved by a mask with three states, i.e., three different reflection coefficients, and by assigning different states to adjacent main polygons (for IC patterns) and the background (i.e., the region without main polygons). There are already two states, i.e., the states 210 and 220. In the present embodiment, a third state for the background is created by implementing sub-resolution assist polygons in the background and assigning a same state (e.g., the state 220) to all the sub-resolution assist polygons. Note that the background is defined as the regions without main polygons and the field is defined as the regions without main polygons and assist polygons. The field and the sub-resolution assist polygons collectively define the background. The field is then associated with another state (e.g., the state 210) different from that assigned to the assist polygons. The sub-resolution assist polygons are not printable during a lithography exposing process. At least one edge of the sub-resolution assist polygon is shorter than $\lambda/NA$, where $\lambda$ is a wavelength of a radiation source and NA is a numerical aperture of a projection optics box (POB). Since the sub-resolution assist polygons are not printable, the background collectively has an effective reflection coefficient different from those of the first and second states (210 and 220). Hence, the effective reflection coefficient of the background is the area weighted average of the reflection coefficients of various regions (the sub-resolution assist polygons and the field) in the background.

Thus, as illustrated in FIG. 5, the mask 40 has 3 different states. The adjacent main polygons 310 and 320 are assigned to different states (such as states 210 and 220 respectively). In the background, field 330 and the sub-resolution assist polygons 340 are assigned to different states (such as states 210 and 220 respectively), thereby generating the background with the third mask state different from the first and second mask states (210 and 220). Since the sub-resolution assist polygons 340 are not printable, the background has an effective reflection coefficient different from those of the first and second states but is tunable by the pattern density of the sub-resolution assist polygons 340 in the background.

During a lithography exposing process, the mask 40 is exposed by a nearly on-axis illumination (ONI) with partial coherence σ less than 0.3 to produce diffracted lights and non-diffracted lights, removing most of the non-diffracted lights, collecting and directing the diffracted lights and the not removed non-diffracted lights by the POB to expose a target.

In the present embodiment, the mask 40 is a phase-shifting mask, such as alternating phase-shifting mask (AltPSM) for an EUV lithography process. The mask 40 includes a plurality of main polygons (for IC patterns) and assist polygons. Adjacent main polygons are assigned different states. For example, various main polygons 310 and 320 are assigned states 210 and 220, respectively. The sub-resolution assist polygons are not imaged to the target (such as a wafer) during the EUV lithography process. However, they change the (effective) reflection coefficient of the background. In the present embodiment, the pattern density in the background is substantially uniform. The pattern density in the background is defined as the total area of assist polygons in a unit area. The (effective) reflection coefficient of the background can be tuned by varying the pattern density in the background. Main polygons and assist polygons are formed by patterning the second reflective layer 150.

Furthermore, in some embodiments, the reflected EUV light from the state 210 and the reflected EUV light from the state 220 have an 180° phase difference. In this case, the amplitude of the 0-th diffraction order (proportional to the area weighted reflection coefficients of various regions, including main polygons, assist polygons, and the field, on the mask 40) can be zero by tuning the pattern density. For example, when r2=r1 and the pattern density is 50%, the amplitude of the 0-th diffraction order is 0. Therefore, the exposure dose loss by removal of the 0-th diffraction order is minimized and the throughput of the exposure tool is maximized.

The second reflective layer 150 determines the reflection coefficient of the state 220 relative to that of the state 210. In an embodiment associated with FIG. 2, the (relative) reflection coefficient is about −0.7757. In an embodiment associated with FIG. 3, the (relative) reflection coefficient is about −0.8665. Here, the "-" sign stands for an 180° phase difference.

Various advantages are provided by the different embodiments of the disclosure. When the mask 40 is an alternating phase-shifting mask, the imaging quality, contrast and resolution are improved. The mask 40 does not suffer from pattern imbalance issues, compared to other alternating phase-shifting masks. In one embodiment, since the amplitude A is substantially close to 1 (0.776 in the embodiment associated with FIG. 2 and 0.867 in the embodiment associated with FIG. 3), the overall radiation energy loss is substantially low, about 40% or less. Accordingly, the exposing duration of the lithography exposing process is reduced and the throughput is increased. In various embodiments, the thickness of the patterned layer (the second reflective layer 150) of the mask 40 is reduced to below 90 nm, and the shadow effect during the exposing process is reduced or eliminated. Since no absorption layer is used or a less attenuating material is used to form a patterned layer 150, the radiation energy loss is reduced. In other embodiments, the mask 40 in FIG. 5 is designed such that the sub-resolution assist polygons 340 are in the first state 210 and the field 330 is in the second state 220.

Figure 6:
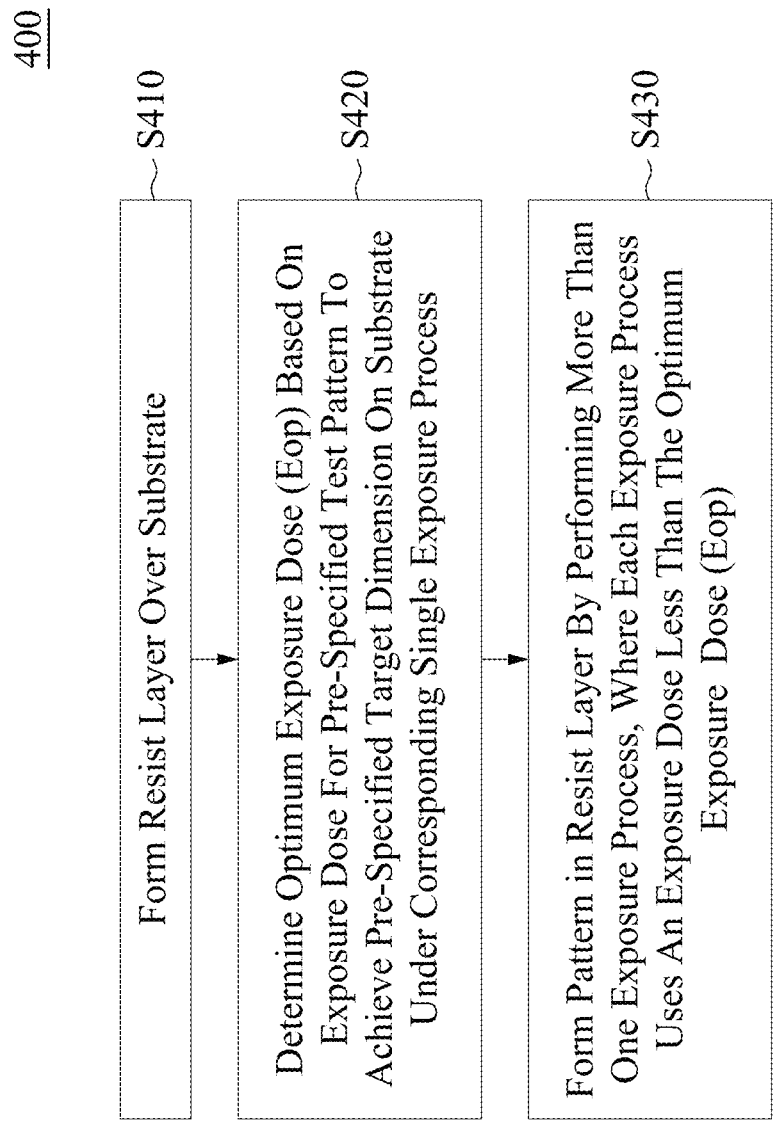
FIG. 6 is a flow chart of a method for forming a patterned resist layer according to embodiments of the present disclosure.

FIG. 6 is a flow chart of a method for forming a patterned resist layer according to embodiments of the disclosure. The method 400 begins at operation S410 where a resist layer is formed over a substrate. At operation S420, an optimum exposure dose ($E_{OP}$) is determined. A given resist layer undergoing a given lithographic process has a definite threshold exposure dose ($E_{TH}$) that is the minimum exposure dose to reliably alter the behavior of an exposed portion of the resist layer compared to an unexposed portion (when patterns on the mask are large compared to the wavelength of the employed radiation source). For example, where the resist layer includes a positive-tone resist material, the exposed portions of the resist layer become soluble beyond the threshold exposure dose, such that the exposed portions of the resist layer are removed during a developing process and the developed resist layer includes the pattern. In another embodiment, where the resist layer includes a negative-tone resist material, the exposed portions of the resist layer become insoluble beyond the threshold exposure dose, such that the unexposed portions of the resist layer are removed during a developing process and the developed resist layer includes the pattern. However, a variety of real-world effects may cause the threshold dose to be insufficient. For example, the effect of diffraction, which reduces the contrast of the aerial image, becomes prominent when the size of patterns on the mask is close to or smaller than the wavelength of the employed radiation source. In another embodiment, a post-exposure baking process exhibits effects such as acid diffusion in a chemically amplified resist, acid annihilation by a quencher, etc. To correct for these, in some embodiments, an optimum exposure dose is determined based on an exposure dose for a pre-specified test pattern to achieve a pre-specified target dimension on a wafer under a corresponding single exposure process. At operation S430, a pattern is formed in the resist layer by performing a multiple exposure process. In some embodiments, the multiple exposure process is performed using extreme ultraviolet radiation (EUV), and the radiation for each exposure process has approximately the same wavelength. In the multiple exposure process of operation S430, each exposure process utilizes an exposure dose that is less than the optimum exposure dose and the total exposure dose ($E_T$) of the multiple exposure process approximately equals the optimum exposure dose (in other words, $E_1 < E_{OP}$, $E_2 < E_{OP}$, . . . , $E_N < E_{OP}$ and $E_T = E_1 + E_2 + E_3 + \ldots + E_N \approx E_{OP}$, where N is a total number of exposure processes performed). In some embodiments, the total exposure dose ($E_T$) of the multiple exposure processes is within a range of about 90% to about 110% of the optimum exposure dose ($E_{OP}$).

During each exposure process, the resist layer is exposed to the same pattern, such as a same integrated circuit pattern. In an embodiment, each exposure process uses a different portion of a single phase-shifting mask to expose the resist layer, where each portion of the mask has the same pattern. In another embodiment, each exposure process uses a different phase-shifting mask to expose the resist layer, where each mask has the same pattern. The single phase-shifting mask and the different phase-shifting masks can include defects (such as bump defects, pit defects, other types of defects, or combinations thereof) and phase-defect regions. Forming the pattern in the resist layer further includes a developing process, where a developing solution is applied to the exposed resist layer. The resist layer is also exposed to a baking process before and/or after the resist layer is exposed in some embodiments. Additional steps can be provided before, during, and after the method 400, and some of the steps described can be replaced, eliminated, or moved around for additional embodiments of the method 400. The discussion that follows illustrates various embodiments of a resist layer that are patterned according to the method 400 of FIG. 6.

Figure 7:
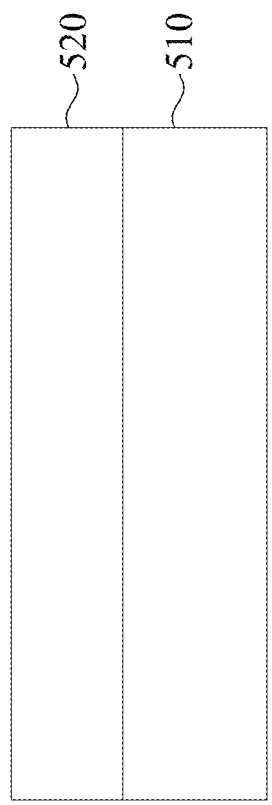
FIG. 7 is a diagrammatic cross-sectional view of a resist layer during a stage of a method of manufacturing a semiconductor device according to embodiments of the disclosure.

FIGS. 7-8D and 8F are various diagrammatic cross-sectional views of a resist layer during various stages of the method 400 of FIG. 6. FIGS. 7-8D and 8F have been simplified for the sake of clarity to better understand the inventive concepts of the present disclosure. In FIG. 7, a semiconductor substrate 510, such as a wafer 510 is provided. In some embodiments, the substrate 510 is any base material on which processing is conducted to provide layers of material to form various features of an integrated circuit (IC) device. In the depicted embodiment, the wafer 510 includes silicon (i.e., a silicon wafer). Alternatively or additionally, the wafer 510 includes another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another embodiment, the semiconductor substrate 510 is a semiconductor on insulator (SOI) substrate. The semiconductor substrate 510 may alternatively be referred to as a material layer, or the semiconductor substrate 510 may include a material layer upon which a resist layer will be formed. In an embodiment, the material layer is a metal layer, a semiconductor layer, or a dielectric layer. In another embodiment, the material layer is a hard mask layer, such as a silicon oxide layer or a silicon nitride layer.

A resist layer 520 is deposited over the wafer 510, for example, by a spin-on coating technique. The resist layer 520 is also referred to as a photoresist layer, photosensitive layer, imaging layer, patterning layer, or radiation sensitive layer. A rinsing process, such as a de-ionized (DI) water rinse, may be performed on the wafer 510 before depositing the resist layer 520. The resist layer 520 may be subjected to a baking process, such as a soft baking process (also referred to as a post-applied baking process). In the depicted embodiment, the resist layer 520 includes positive-tone resist material. Alternatively, the resist layer 520 includes negative-tone resist material. The resist layer 520 has any suitable thickness, such as a thickness of about 10 nm to about 1,000 nm.

In FIGS. 8A-8F, the resist layer 520 is patterned to form a patterned resist layer 520A. Patterning the resist layer 520 includes performing more than one exposure process as depicted in FIGS. 8A-8D, where each exposure process uses an exposure dose less than the optimum exposure dose $E_{OP}$ for a corresponding single exposure process. In the depicted embodiment, a first exposure process 530 (FIG. 8A), a second exposure process 540 (FIG. 8B), a third exposure process 550 (FIG. 8C), and a fourth exposure process 560 (FIG. 8D) each use a different phase-shifting mask or different regions of a single phase-shifting mask having the same circuit pattern to selectively illuminate the resist layer 520 respectively with a first exposure dose ($E_1$), a second exposure dose ($E_2$), a third exposure dose ($E_3$), and a fourth exposure dose ($E_4$) of radiation, thereby forming a latent image pattern 532D in the resist layer 520. The first exposure dose ($E_1$), the second exposure dose ($E_2$), the third exposure dose ($E_3$), and the fourth exposure dose ($E_4$) are each less than the optimum exposure dose ($E_{OP}$). Further, in the present embodiment, a total exposure dose ($E_T$) of the first exposure dose ($E_1$), second exposure dose ($E_2$), third exposure dose ($E_3$), and the fourth exposure dose ($E_4$) is approximately equal to the optimum exposure dose ($E_{OP}$) (in other words, $E_T=E_1+E_2+E_3+E_4=E_{OP}$), so that the latent image pattern 532 is developable after the fourth exposure process 560. In some embodiments, the total exposure dose ($E_T$) of the multiple exposure processes is within a range of about 90% to about 110% of the optimum exposure dose ($E_{OP}$).

In the depicted embodiment, the first exposure process 530, the second exposure process 540, the third exposure process 550, and the fourth exposure process 560 illuminate the resist layer 520 with radiation having a wavelength less than about 100 nm, such as radiation in an extreme ultraviolet (EUV) range, x-ray range, deep ultraviolet range, vacuum ultraviolet range, or combinations thereof. In an embodiment, the radiation is EUV radiation having a wavelength equal to about 13.5 nm. Alternatively, in some embodiments, the radiation has a wavelength range greater than about 100 nm. For example, a radiation source may be a light source, such as a krypton fluoride (KrF) excimer laser with a wavelength of 248 nm, an argon fluoride (ArF) excimer laser with a wavelength of 193 nm, a fluorine dimer ($F_2$) excimer laser with a wavelength of 157 nm, or other light sources. In some embodiments, only two exposure processes or more than four exposure processes may form a developable latent image pattern in the resist layer 520.

The phase-shifting masks used in the first exposure process 530, the second exposure process 540, the third exposure process 550, and the fourth exposure process 560 include a pattern, such as an integrated circuit pattern according to a design layout, that is transferred to the resist layer 520 during each of the exposure processes 530, 540, 550, and 560. In an embodiment, the phase-shifting mask is a reflective mask. In an example, different phase-shifting masks (Mask 1, Mask 2, Mask 3, Mask 4) having the same integrated circuit pattern are used in the first exposure process 530, the second exposure process 540, the third exposure process 550, and the fourth exposure process 560. In some embodiments, Mask 1, Mask 2, Mask 3, and Mask 4 are different areas of a single phase-shifting mask, as shown in FIG. 8E.

Figures 8C, 8D:
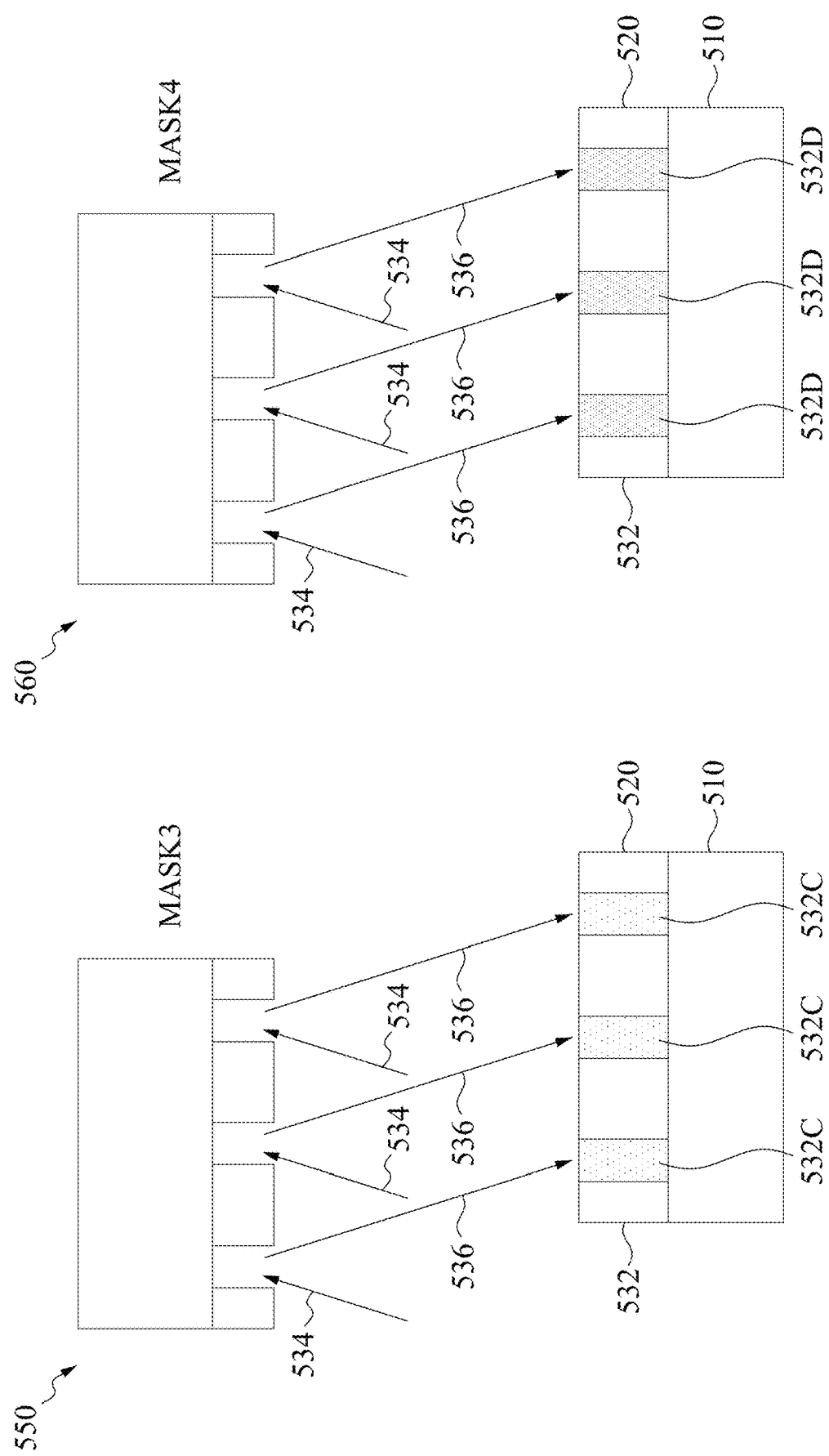
Figure 8E:
FIG. 8E is a plan view of a phase-shifting mask according to an embodiment of the disclosure.

Referring to FIG. 8A, the first exposure process 530 projects radiation of the first exposure dose ($E_1$) onto phase-shifting mask (PSM) MASK 1, and a portion of the radiation is reflected to the resist layer 520, thereby transferring the pattern of PSM MASK 1 to the resist layer 520 to form the latent image pattern 532 that includes latent image portions 532A. In some embodiments, where the resist layer 520 includes a positive-tone resist material, the latent image portions 532A become partially soluble. Then, referring to FIG. 8B, the second exposure process 540 projects radiation of the second exposure dose ($E_2$) onto PSM MASK 2, and a portion of the radiation is reflected to the resist layer 520, thereby transferring the pattern of PSM MASK 2 to the resist layer 520 to increase solubility of the latent image pattern 532, particularly latent image portions 532A. The latent image pattern 532 thus includes latent image portions 532B, which are more soluble than the latent image portions 532A. The solubility of the latent image portions is increased because of the additional exposure dose provided in the second exposure process 540. Referring to FIG. 8C, the third exposure process 550 projects radiation of the third exposure dose ($E_3$) onto PSM MASK 3, and a portion of the radiation is reflected to the resist layer 520, thereby transferring the pattern of PSM MASK 3 to the resist layer 520 to further increase the solubility of the latent image pattern 532, particularly latent image portions 532B. The latent image pattern 532 thus includes latent image portions 532C, which are more soluble than the latent image portions 532B. Referring to FIG. 8D, the fourth exposure process 560 projects radiation of the fourth exposure dose ($E_4$) onto PSM MASK 4, and a portion of the radiation is reflected to the resist layer 520, thereby transferring the pattern of PSM MASK 4 to the resist layer 520 to further increase the solubility of the latent image pattern 532, particularly latent image portions 532C. The latent image pattern 532 thus includes latent image portions 532D, which are more soluble than the latent image portions 532C. Because the total exposure dose of the first exposure dose ($E_1$), second exposure dose ($E_2$), third exposure dose ($E_3$), and fourth exposure dose ($E_4$) are approximately equal to the optimum exposure dose ($E_{OP}$) (within a range of about 90% to about 110% of the optimum exposure dose), the latent image portions 532D are soluble so that latent image pattern 532 is developable.

The aforementioned multiple exposure process is fully compatible with the actions taken by a scanner when exposing the whole wafer by stepping and scanning. The impact to wafer throughput resulting from the multiple exposure process can be minimized according to embodiments of the disclosure. The phase-shifting mask (PSM) allows a reduced exposure dose to be used. Therefore, even though multiple exposures are used, each exposure dose is less than what would be required if a PSM were not used, thereby increasing wafer throughput. Therefore, embodiments of the disclosure provide a synergy of increased wafer throughput and reduced rejected workpieces because of mask defects. Besides reducing the impact of randomly distributed mask defects, embodiments of the disclosure are also effective in reducing the impacts of other random errors, such as line edge roughness and registration errors of mask patterns.

Using a multiple exposure process to form the latent image pattern 532 in the resist layer 520, where each exposure process exposes the resist layer 520 to a same pattern using an exposure dose that is less than the optimum exposure dose, reduces impact of defects or defect regions of the masks used during the multiple exposure process. For example, in the depicted embodiment, the masks or mask areas used during the first exposure process 530, the second exposure process 540, the third exposure process 550, and the fourth exposure process 560 have defects or defect regions. In the example where different phase-shifting masks are used, MASK 1, MASK 2, MASK 3, MASK 4 include a phase-defect region. Or, in the embodiment where different portions of the MASK are used, one or more of the different portions include a phase-defect region. Because the exposure dose projected onto MASK 1, MASK 2, MASK 3, and MASK 4 or the different portions of the phase-shifting mask is less than the optimum exposure dose, the impact of such phase-defect regions in MASK 1, MASK 2, MASK 3, and MASK 4 or the different portions of the phase-shifting mask is greatly reduced. Since such defects or defect regions are randomly located on the various masks or various mask areas, no defect or defect region will receive a full exposure dose. More specifically, an aerial image intensity impacted by each individual defect or defect region is reduced, thereby reducing printability of such defect or defect region.

Different embodiments may have different advantages, and no particular advantage is required of any embodiment. In one embodiment, the exposure dose for each exposure approximately equals the optimum exposure dose ($E_{OP}$) divided by N, where N is a total number of exposures. Accordingly, in the present embodiment, the first exposure dose ($E_1$), the second exposure dose ($E_2$), the third exposure dose ($E_3$), and the fourth exposure dose ($E_4$) are substantially equal to one fourth of the optimum exposure dose ($E_{OP}$). Alternatively, the first exposure dose ($E_1$), the second exposure dose ($E_2$), the third exposure dose ($E_3$), and the fourth exposure dose ($E_4$) are approximately equal to varying fractions of the optimum exposure dose ($E_{OP}$). The exposure dose of each of the plurality of EUV exposure processes can be adjusted according to defect printability. Therefore, if a defect on a mask or a mask region is more printable, the exposure dose for the mask or the mask region is then reduced. In some embodiments, wherein a total exposure dose ($E_T$) of the multiple exposure doses is within 90% to 110% of the optimum exposure dose ($E_{OP}$).

Figure 8F:
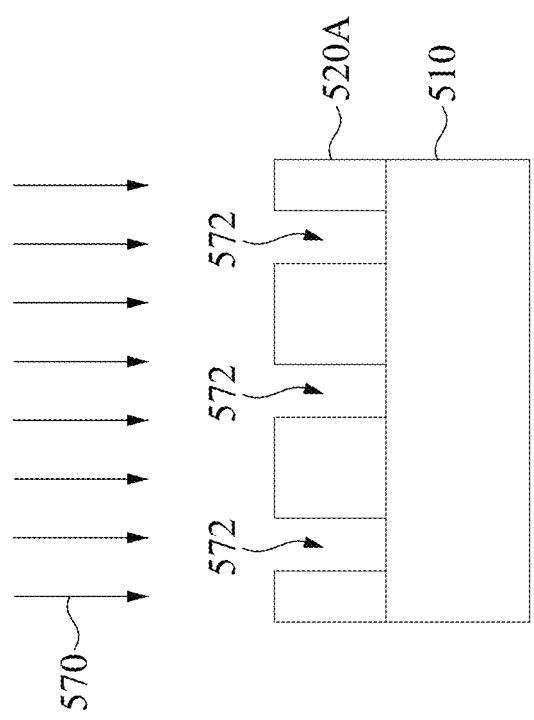

After the resist layer 520 receives a full exposure, the resist layer 520 may be subjected to a post-exposure bake (PEB) process. Referring to FIG. 8F, a developing process 570 is performed on the resist layer 520, thereby providing the patterned resist layer 520A. During the developing process 570, a developing solution is applied to the resist layer 520. In an embodiment, the developing solution is a basic solution, such as tetramethylammonium hydroxide (TMAH). Any concentration level of TMAH developer solution is utilized depending on characteristics of the resist layer 520, such as approximately 2.38% TMAH developer solution. The developing solution removes exposed or unexposed portions of the resist layer 520 depending on the resist material. For example, in the present embodiment, the resist layer 520 includes a positive-tone resist material, so the developing process 570 removes (dissolves) the exposed portions of the resist layer 520 (the latent image pattern 522), leaving the unexposed portions of the resist layer 520 over the wafer 510. Alternatively, where the resist layer 520 includes negative-tone resist material, the developing process 570 removes (dissolves) the unexposed portions of the resist layer 520, leaving the exposed portions of the resist layer 520 over the wafer 510. A rinsing process, such as a de-ionized (DI) water rinse is performed in some embodiments. In some embodiments, the rinsing process removes residue particles.

The patterned resist layer 520A includes openings 572 that expose portions of the underlying wafer 510. Subsequent processing may include removing portions of the exposed wafer 510 by etching. Alternatively, metal deposition, ion implantation, or other processes can be carried out over/on the wafer 510. The patterned resist layer 520A may then be removed (or stripped) by any suitable process. For example, the patterned resist layer 520A may be removed with a fluid (or stripping solution). In some instances, where the exposed portions of the wafer 510 are subjected to an ion bombardment or plasma treatment process, the fluid strips the ion bombarded, patterned resist layer 520A and/or the plasma treated, patterned resist layer 520A. After the patterned resist layer 520A is removed, subsequent processing may continue to complete fabrication of an integrated circuit device. In some embodiments, additional patterning processes, etching processes, deposition processes, and other processes may be performed to form additional features of the integrated circuit device.

Figure 9:
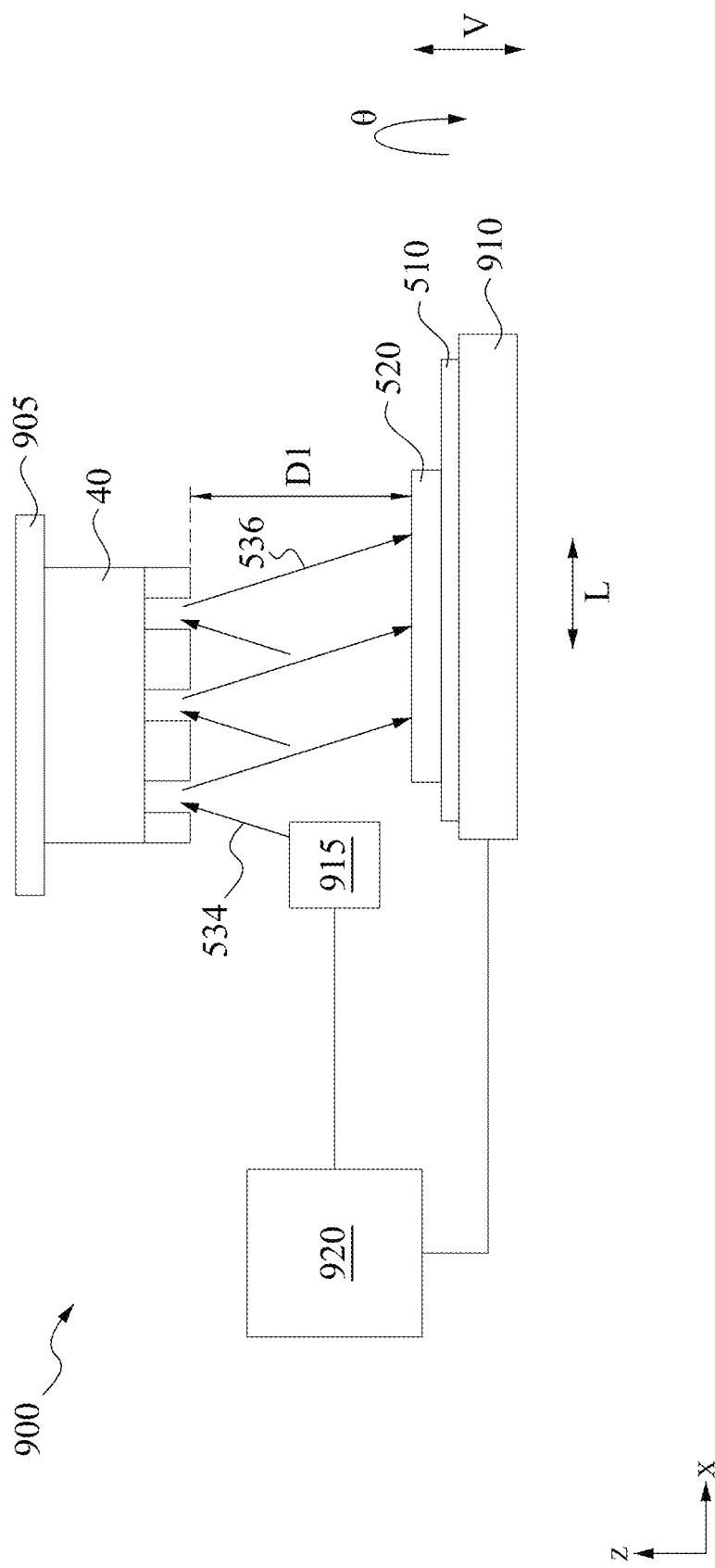
FIG. 9 shows a photolithography apparatus according to an embodiment of the disclosure.

A photolithography apparatus 900 according to an embodiment of the disclosure is illustrated in FIG. 9. A semiconductor substrate 510 having a photoresist layer 520 coated thereon is exposed to radiation in the photolithography apparatus 900. The photoresist coated semiconductor substrate is supported by a wafer stage 910. A photomask 40 is supported by a mask stage 905. In some embodiments, the photomask 40 and the photoresist layer are separated by a distance D1. The wafer stage 910 is configured to move laterally L or vertically V relative to a photomask 40 in some embodiments. The lateral motion L includes motion along the X-axis or the Y-axis (into the page). The vertical motion V is along the Z-axis. In some embodiments, the wafer stage 910 is moved vertically relative to photomask 40, thereby changing the distance between the photomask 40 and the photoresist layer 520. Thus, in some embodiments, the distance between the photomask 40 and the photoresist layer 520 increases or decreases relative to the initial distance D1. In some embodiments, the wafer stage is configured to tilt about the X-axis or Y-axis.

In some embodiments, the radiation is extreme ultraviolet radiation, and the photomask 40 is a reflective EUV phase-shifting photomask. In some embodiments, the extreme ultraviolet radiation is generated in an EUV radiation source 915. The EUV radiation source 915 generates EUV radiation 534 that is directed towards the photomask 40 and is reflected off the reflective photomask 40. The reflected EUV radiation 536 includes pattern information according to the pattern in the photomask 40. The reflected EUV radiation 536 carrying the pattern information exposes the photoresist layer 520 in a patternwise manner, thereby forming a latent pattern in the photoresist layer 520 corresponding to the photomask pattern. A pattern is formed in the patternwise exposed photoresist layer by developing the exposed photoresist layer using a suitable developer. The photoresist is a positive-tone resist or a negative-tone resist. The pattern in the photoresist is extended into an underlying layer using a suitable etching operation in some embodiments. The etching operation may be a wet etching operation or a dry etching operation. After forming the pattern in the underlying layer, the remaining photoresist is removed by a suitable photoresist stripping or plasma ashing operation.

The EUV lithography apparatus 900 employs the EUV radiation source 915 to generate EUV light, such as EUV light having a wavelength ranging between about 1 nm and about 100 nm. In one particular example, the EUV radiation source 915 generates an EUV light with a wavelength centered at about 13.5 nm. In the present embodiment, the EUV radiation source 915 utilizes a mechanism of laser-produced plasma (LPP) to generate the EUV radiation.

The EUV radiation source 915 includes a target droplet generator a LPP collector. In some embodiments, the target droplets are droplets of tin (Sn), lithium (Li), or an alloy of Sn and Li. In some embodiments, the target droplets each have a diameter in a range from about 10 microns ($\mu$m) to about 100 $\mu$m. For example, in an embodiment, the target droplets are tin droplets, having a diameter of about 10 $\mu$m to about 100 $\mu$m. In other embodiments, the target droplets are tin droplets having a diameter of about 25 $\mu$m to about 50 $\mu$m. In some embodiments, the target droplets are supplied through the nozzle of the target droplet generator. The target droplets are subsequently heated by laser that pulses in synchronization with the ejection of target droplets through the nozzle. In some embodiments, as the target droplets move through the excitation zone, a laser pre-pulse heats the target droplets and transform them into low-density target plumes, which are subsequently heated by a main pulse of the laser generating a high-temperature plasma. The plasma emits EUV radiation, which is collected by a collector and focused for the lithography exposure process.

In some embodiments, the laser includes a carbon dioxide ($CO_2$) or a neodymium-doped yttrium aluminum garnet (Nd:YAG) laser source with a wavelength in the infrared region of the electromagnetic spectrum. In some embodiments, the laser has a wavelength of 9.4 $\mu$m or 10.6 $\mu$m.

In some embodiments, there are additional optics between the EUV radiation source 915 and the photomask 40, or between the photomask 40 and the photoresist layer 520, as needed, to further reduce the size of the pattern on the photoresist layer 520 or focus EUV radiation. As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gratings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, neither the term "optic", as used herein, are meant to be limited to components which operate solely or to advantage within one or more specific wavelength range(s) such as at the EUV output light wavelength, the irradiation laser wavelength, a wavelength suitable for metrology or any other specific wavelength.

Figure 10A:
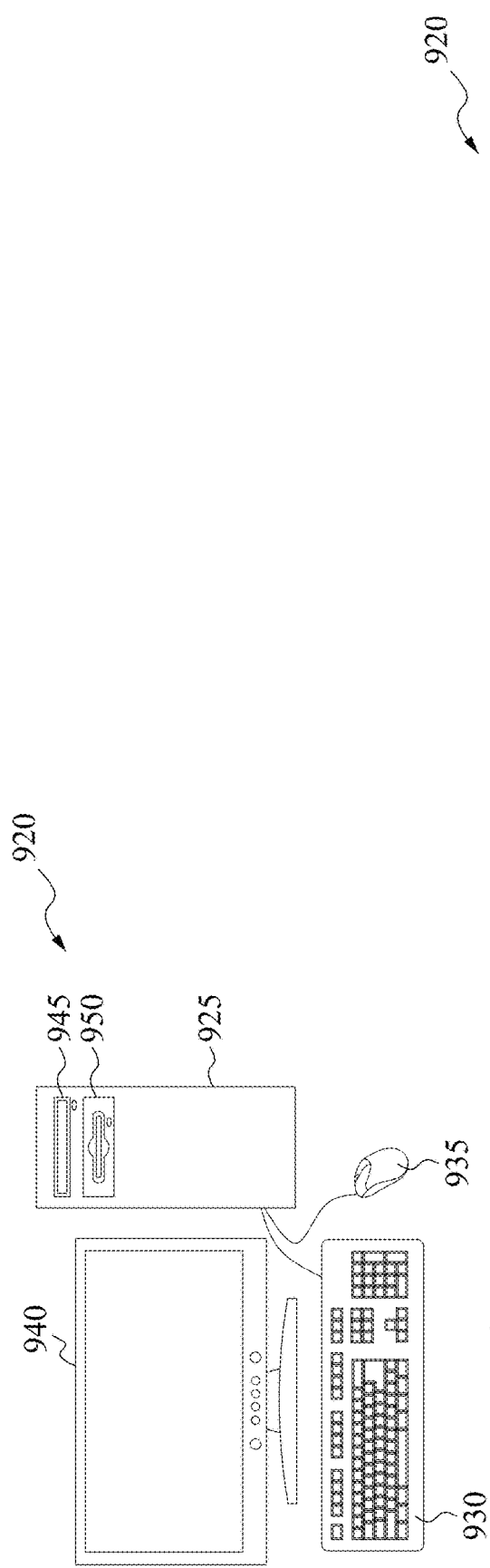
FIGS. 10A and 10B show an embodiment of a controller for a photolithography apparatus according to an embodiment of the disclosure.
Figure 10B:
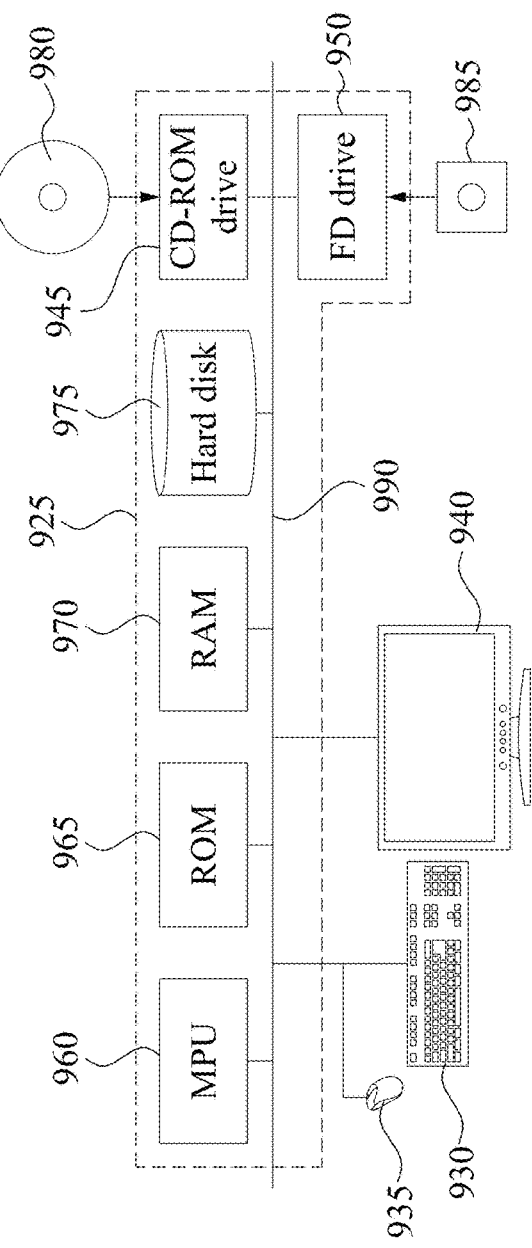

In some embodiments, the motion of the wafer stage 910 and the generation of the exposure radiation is controlled by a controller. FIGS. 10A and 10B illustrate a controller 920 according to some embodiments of the present disclosure. In some of the embodiments, the controller 920 is a computer system, including computer hardware and computer programs. FIG. 10A is a schematic view of a computer system that controls the radiation generation and the wafer stage motion. All of or a part of the processes, method and/or operations of the foregoing embodiments can be realized using computer hardware and computer programs executed thereon. The operations include the motion of the wafer stage, exchanging one phase-shifting mask for another phase-shifting mask, sequence of exposure shots, exposure dose, generation of EUV radiation, including the frequency of Sn droplet generation and timing of the laser pulses. In some embodiments, the computer system is provided with a computer 925 including an optical disk read only memory (e.g., CD-ROM or DVD-ROM) drive 945 and a magnetic disk drive 950, a keyboard 930, a mouse 935, and a monitor 940.

FIG. 10B is a diagram showing an internal configuration of some embodiments of the controller 920. In FIG. 10B, the computer 925 is provided with, in addition to the optical disk drive 945 and the magnetic disk drive 950, one or more processors 960, such as a micro processing unit (MPU) 960, a ROM 965 in which a program such as a boot up program is stored, a random access memory (RAM) 970 that is connected to the MPU 960 and in which a command of an application program is temporarily stored and a temporary storage area is provided, a hard disk 975 in which an application program, a system program, and data are stored, and a bus 990 that connects the MPU 960, the ROM 965, and the like. Note that the computer 925 may include a network card (not shown) for providing a connection to a LAN.

The program for causing the controller 920 to execute the functions of the sequence of the exposure shots, exposure dose, and wafer stage movement of the foregoing embodiments may be stored in an optical disk 980 or a magnetic disk 985, which are inserted into the optical disk drive 945 or the magnetic disk drive 950, and transmitted to the hard disk 975. Alternatively, the program may be transmitted via a network (not shown) to the computer 925 and stored in the hard disk 975. At the time of execution, the program is loaded into the RAM 970. The program may be loaded from the optical disk 980 or the magnetic disk 985, or directly from a network. The program does not necessarily have to include, for example, an operating system (OS) or a third party program to cause the computer 925 to execute the functions of the photomask data generating and merging apparatus in the foregoing embodiments. The program may only include a command portion to call an appropriate function (module) in a controlled mode and obtain desired results.

Figure 11:
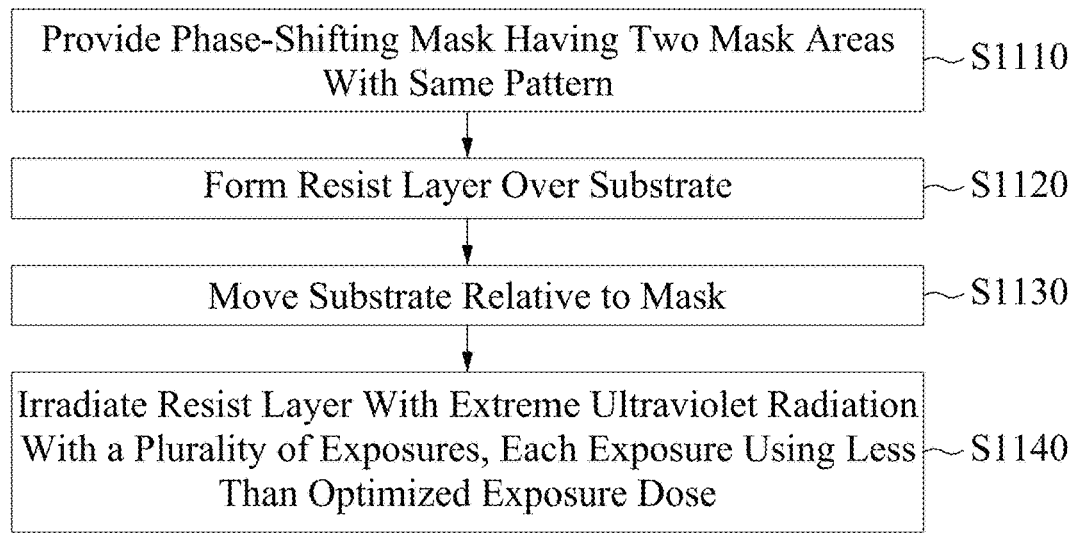
FIG. 11 is a flow chart illustrating a method of manufacturing a semiconductor device according to an embodiment of the present disclosure.

FIG. 11 is a flow chart illustrating an extreme ultraviolet lithography method 1 according to an embodiment of the present disclosure. In operation S1110, a phase-shifting mask having at least two mask areas having a same circuit pattern is provided. A resist layer is formed over a substrate in operation S1120. An optimum exposure dose Eop is determined for the photoresist layer 520 in operation S1130. In operation S1140, the resist layer is irradiated with extreme ultraviolet radiation using the phase-shifting mask to expose a same area of the resist layer multiple times through the two mask areas. For example, when the same pattern is exposed four times by using four different mask or mask regions each dose is equal to Eop/4. The irradiating the resist layer with extreme ultraviolet radiation includes a plurality of exposure processes, and each of the plurality of exposure processes uses an exposure dose of extreme ultraviolet radiation that is less than the optimum exposure dose.

In some embodiments, at least one of the two mask areas of the phase-shifting mask includes a defect. In some embodiments, the optimum exposure dose is based on the exposure for a pattern on either one of the at least two mask areas to achieve a target dimension under a corresponding single exposure process. In some embodiments, the total exposure dose is the optimum exposure dose for the photoresist layer 520. In some embodiments, the optimum exposure dose is previously determined and is stored in a memory. The optimum exposure doses can be determined and stored for various wafer sizes, photoresist compositions, and photoresist layer thicknesses. In some embodiments, the stored optimum exposure dose is input to the controller 900 prior to the exposure operations.

In some embodiments, the exposure is a scanning exposure, and the semiconductor substrate 510 is moved during the scanning exposure operation so that scanning radiation exposes the desired pattern in the photoresist layer 520. The moving of the semiconductor substrate 510 relative to the photomask 40 between exposure operations includes moving the wafer stage 910 supporting the semiconductor wafer closer to or further away from the photomask 40, e.g. —in a vertical direction, or moving (stepping) the wafer stage 910 in a lateral direction, e.g.—from one die on the semiconductor substrate 510 to another die. During the stepping operation, the wafer stage 910 is stepped so that a same portion of the mask is positioned over a different die in a subsequent exposure operation than in a prior exposure operation. The first portion and second portion of the photoresist layer 520 are exposed simultaneously during the exposure operation in some embodiments.

Then, in some embodiments, the semiconductor substrate 510 is moved relative to the photomask 40, and the first portion of the photoresist layer 520 is exposed to a third exposure dose of extreme ultraviolet radiation using a third mask area, the second portion of the photoresist layer 520 is exposed to the third exposure dose of extreme ultraviolet radiation using the second mask area, and a third portion of the photoresist layer 520 is exposed to the third exposure dose using the first mask area. In some embodiments, the first, second, and third portions of the photoresist layer 520 are exposed substantially simultaneously during the exposure operation.

In some embodiments, the semiconductor substrate 510 is then moved relative to the photomask 40, and the first portion of the photoresist layer 520 is exposed to a fourth exposure dose of extreme ultraviolet radiation using a fourth mask area, the second portion of the photoresist layer 520 is exposed to the fourth exposure dose of extreme ultraviolet radiation using the third mask area, a third portion of the photoresist layer 520 is exposed to the fourth exposure dose using the second mask area, and a fourth portion of the photoresist layer 520 is exposed to the fourth exposure dose of extreme ultraviolet radiation using the first mask area. The first, second, third, and fourth portions of the photoresist layer 520 are exposed substantially simultaneously during the exposure operation in some embodiments.

In some embodiments, the first mask area, the second mask area, the third mask area, and the fourth mask area each have a same circuit or chip pattern. Thus, the same pattern images are superimposed in the first portion of the photoresist layer 520.

In some embodiments, the first exposure dose, the second exposure dose, the third exposure dose, and the fourth exposure dose are different. In some embodiments, the first exposure dose and the third exposure dose are the same, and the second exposure dose and the fourth exposure dose are the same, and in some embodiments, the first and third exposure doses are different from the second and fourth exposure doses. In some embodiments, each of the first exposure dose, the second exposure dose, the third exposure dose, and the fourth exposure dose is less than the target exposure dose. In some embodiments, a total of all the exposure doses received by each portion of the photoresist layer is substantially equal to the optimum exposure dose. In some embodiments, each of the first, second, third, and fourth exposure doses are about one quarter of the optimum total exposure dose.

In some embodiments, the method includes performing additional exposure steps (shots) such that each portion of the photoresist layer 520 is exposed the same number of times.

Figure 12:
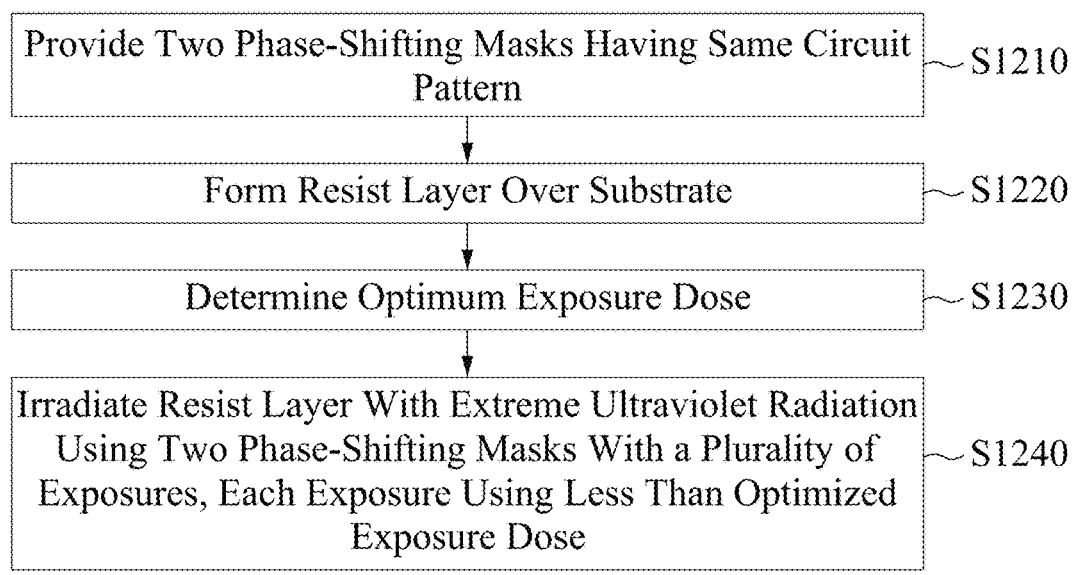
FIG. 12 is a flow chart illustrating a method of manufacturing a semiconductor device according to an embodiment of the present disclosure.

FIG. 12 is a flow chart illustrating an extreme ultraviolet exposure method 1200 according to an embodiment of the present disclosure. In operation S1210, two phase-shifting masks having a same circuit pattern are provided. A resist layer is formed over a substrate in operation S1220. An optimum exposure dose is determined for the photoresist layer 520 in operation S1230. In operation S1240, the resist layer is irradiated with extreme ultraviolet radiation using the two phase-shifting masks to expose a same area of the resist layer multiple times through the two phase-shifting masks. The irradiating the resist layer with extreme ultraviolet radiation includes a plurality of exposure processes, and each of the plurality of exposure processes uses an exposure dose of extreme ultraviolet radiation that is less than the optimum exposure dose.

In some embodiments, at least one of the two phase-shifting masks includes a defect. In some embodiments, the optimum exposure dose is based on the exposure for a pattern on either one of the at least two phase-shifting masks to achieve a target dimension under a corresponding single exposure process. In some embodiments, the total exposure dose is the optimum exposure dose for the photoresist layer 520. In some embodiments, the optimum exposure dose is previously determined and is stored in a memory. The optimum exposure doses can be determined and stored for various wafer sizes, photoresist compositions, and photoresist layer thicknesses. In some embodiments, the stored optimum exposure dose is input to the controller 900 prior to the exposure operations.

In some embodiments, the exposure is a scanning exposure, and the semiconductor substrate 510 is moved during the scanning exposure operation so that scanning radiation exposes the desired pattern in the photoresist layer 520. The moving of the semiconductor substrate 510 relative to the masks 40 between exposure operations includes moving the wafer stage 910 supporting the semiconductor wafer closer to or further away from the photomask 40, e.g. —in a vertical direction, or moving (stepping) the wafer stage 910 in a lateral direction, e.g.—from one die on the semiconductor substrate 510 to another die. During the stepping operation, the wafer stage 910 is stepped so that the one mask is positioned over a different die in a subsequent exposure operation than in a prior exposure operation. The first portion and second portion of the photoresist layer 520 are exposed simultaneously during the exposure operation in some embodiments.

Then, in some embodiments, the semiconductor substrate 510 is moved relative to the masks 40, and the first portion of the photoresist layer 520 is exposed to a third exposure dose of extreme ultraviolet radiation a third phase-shifting mask, the second portion of the photoresist layer 520 is exposed to the third exposure dose of extreme ultraviolet radiation using the second phase-shifting mask, and a third portion of the photoresist layer 520 is exposed to the third exposure dose using the first phase-shifting mask. In some embodiments, the first, second, and third portions of the photoresist layer 520 are exposed substantially simultaneously during each exposure operation.

In some embodiments, the semiconductor substrate 510 is then moved relative to the masks 40, and the first portion of the photoresist layer 520 is exposed to a fourth exposure dose of extreme ultraviolet radiation using a fourth phase-shifting mask, the second portion of the photoresist layer 520 is exposed to the fourth exposure dose of extreme ultraviolet radiation using the third phase-shifting mask, a third portion of the photoresist layer 520 is exposed to the fourth exposure dose using the second phase-shifting mask, and a fourth portion of the photoresist layer 520 is exposed to the fourth exposure dose of extreme ultraviolet radiation using the first phase-shifting mask. The first, second, third, and fourth portions of the photoresist layer 520 are exposed substantially simultaneously during the exposure operation in some embodiments.

In some embodiments, the first phase-shifting mask, the second phase-shifting mask, the third phase-shifting mask, and the fourth phase-shifting mask each have a same circuit or chip pattern. Thus, the same pattern images are superimposed in the first portion of the photoresist layer 520.

In some embodiments, the first exposure dose, the second exposure dose, the third exposure dose, and the fourth exposure dose are different. In some embodiments, the first exposure dose and the third exposure dose are the same, and the second exposure dose and the fourth exposure dose are the same, and in some embodiments, the first and third exposure doses are different from the second and fourth exposure doses. In some embodiments, each of the first exposure dose, the second exposure dose, the third exposure dose, and the fourth exposure dose is less than the target exposure dose. In some embodiments, a total of all the exposure doses received by each portion of the photoresist layer is substantially equal to the optimum exposure dose. In some embodiments, each of the first, second, third, and fourth exposure doses are about one quarter of the optimum total exposure dose.

In some embodiments, the method includes performing additional exposure steps (shots) such that each portion of the photoresist layer 520 is exposed the same number of times.

Figure 13:
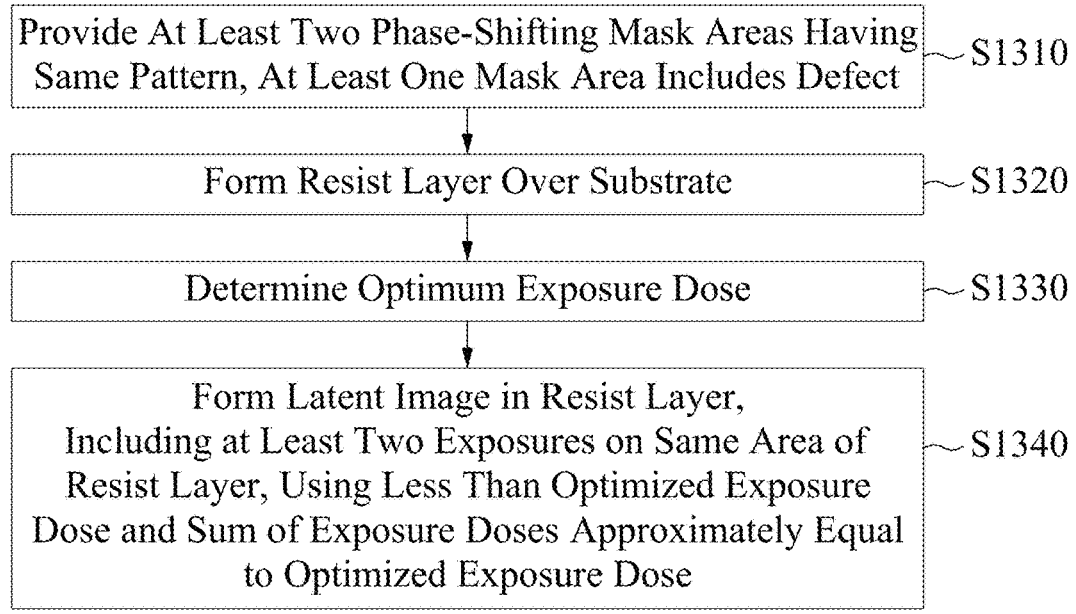
FIG. 13 is a flow chart illustrating a method of manufacturing a semiconductor device according to an embodiment of the present disclosure.

FIG. 13 is a flow chart illustrating an extreme ultraviolet lithography method 1300 according to an embodiment of the present disclosure. In operation S1310, at least two phase-shifting mask areas having a same pattern is provided. A resist layer is formed over a substrate in operation S1320. An optimum exposure dose is determined for the resist layer 520 in operation S1330. The optimum exposure dose is based on an exposure dose for pre-specified patter on one of the at least two phase-shifting mask areas to achieve a target dimension under a corresponding a single exposure process. In operation S1140, a latent image is formed in the resist layer using the two phase-shifting mask areas. The forming the latent image includes performing at least two exposures on a same area of the resist layer. Each of the at least two exposures uses an exposure dose that is less than the optimum exposure dose. The sum of the exposure dose of each of the at least two exposures is approximately equal to the optimum exposure dose.

In some embodiments, the performing at least two exposures includes each of the at least two exposure processes projecting the same pattern of the at least two phase-shifting mask areas on the same area of the resist layer. In some embodiments, the at least two phase-shifting mask areas are from a single phase-shifting mask. In some embodiments, the at least two phase-shifting mask areas are from at least two phase-shifting masks. In some embodiments, the exposure dose of each of the at least two exposures are substantially equal to each other. In some embodiments, exposure dose of each of the at least two exposures are different from each other. In some embodiments, the method includes performing additional exposure steps (shots) such that each portion of the photoresist layer 520 is exposed the same number of times.

Figure 14:
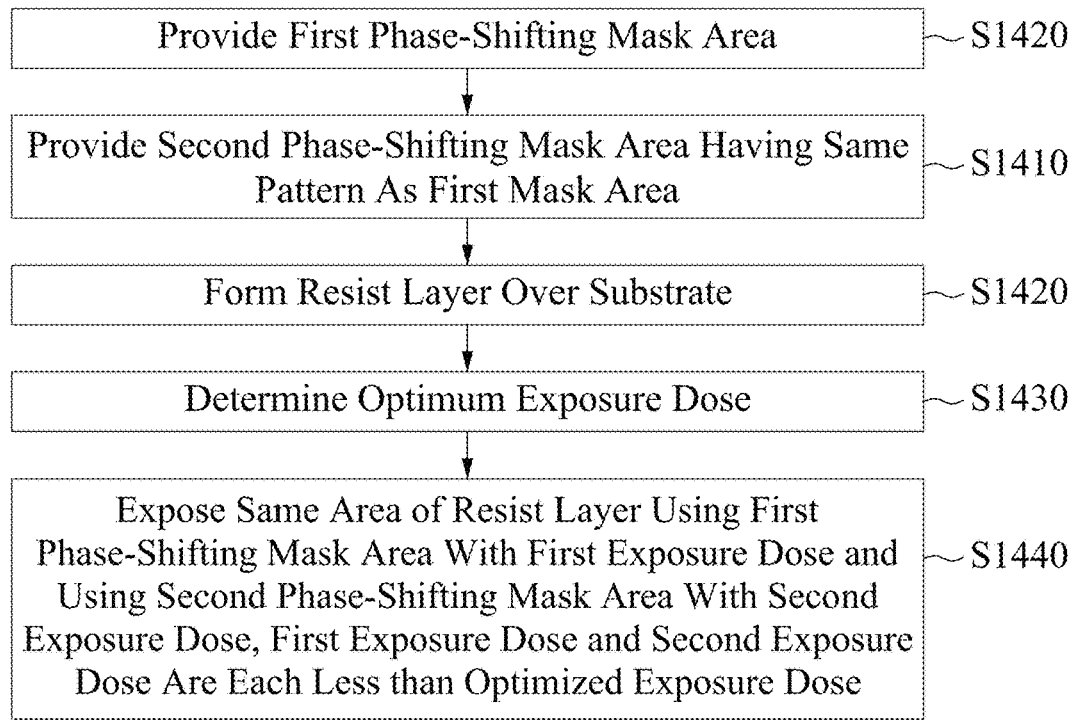
FIG. 14 is a flow chart illustrating a method of manufacturing a semiconductor device according to an embodiment of the present disclosure.

FIG. 14 is a flow chart illustrating an extreme ultraviolet lithography method 1400 according to an embodiment of the present disclosure. In operation S1410, a first phase-shifting mask area is provided. A second phase-shifting mask area having a same pattern as the first phase-shifting mask area is provided in operation S1420. A resist layer is formed over a substrate in operation S1430. An optimum exposure dose is determined for the resist layer 520 in operation S1440. A same area of the resist layer is exposed using the first phase-shifting mask area with a first exposure dose and using the second phase-shifting mask area with a second exposure dose. The first and second exposure dose are each less than the optimum exposure dose.

In some embodiments, the first phase-shifting mask area and the second phase-shifting mask area are from single phase-shifting mask 40. In some embodiments, the first phase-shifting mask area and the second phase-shifting mask area are from two phase-shifting masks 40. In some embodiments, at least one of the first phase-shifting mask area and the second phase-shifting mask area has a defect. In some embodiments, the first exposure dose is different from the second exposure dose. In some embodiments, the first exposure dose is the same as the second exposure dose. In some embodiments, the same area of the resist layer 520 is exposed to four exposure doses. In some embodiments, a sum of all the exposure doses of the same area of the resist layer is exposed to is substantially equal to the optimum exposure dose. In some embodiments, the method includes performing additional exposure steps (shots) such that each portion of the photoresist layer 520 is exposed the same number of times.

To improve exposure resolution in an EUVL operation multiple exposures of the photoresist covered wafer is using one or more phase-shifting masks performed. For example, in some embodiments each die on the photoresist covered wafer is exposed four times with the same pattern on one or more phase-shifting masks.

In some embodiments, the phase-shifting mask includes the same pattern in four adjacent locations on the mask and as the wafer is moved relative to the exposure beam, each die is exposed four times to the same pattern. To prevent overexposure of a given die, the exposure dose from each exposure is one-fourth the desired total exposure dose. The reduced exposure dose at each exposure is achieved by moving the wafer stage quicker at each exposure, in some embodiments. For example, the wafer stage can be moved at four times the normal speed during the scanning exposure so that at each exposure each die is exposed for only one-fourth the total exposure time. The present disclosure is not limited to four exposures of each die, and the multiple number of exposures can be two, three, or five or more. The multiple exposures by different portions of a single phase-shifting mask or a plurality of phase-shifting masks with the same pattern smoothes out any defects that may be present in a given position of the phase-shifting mask(s) in some embodiments.

Figure 15:
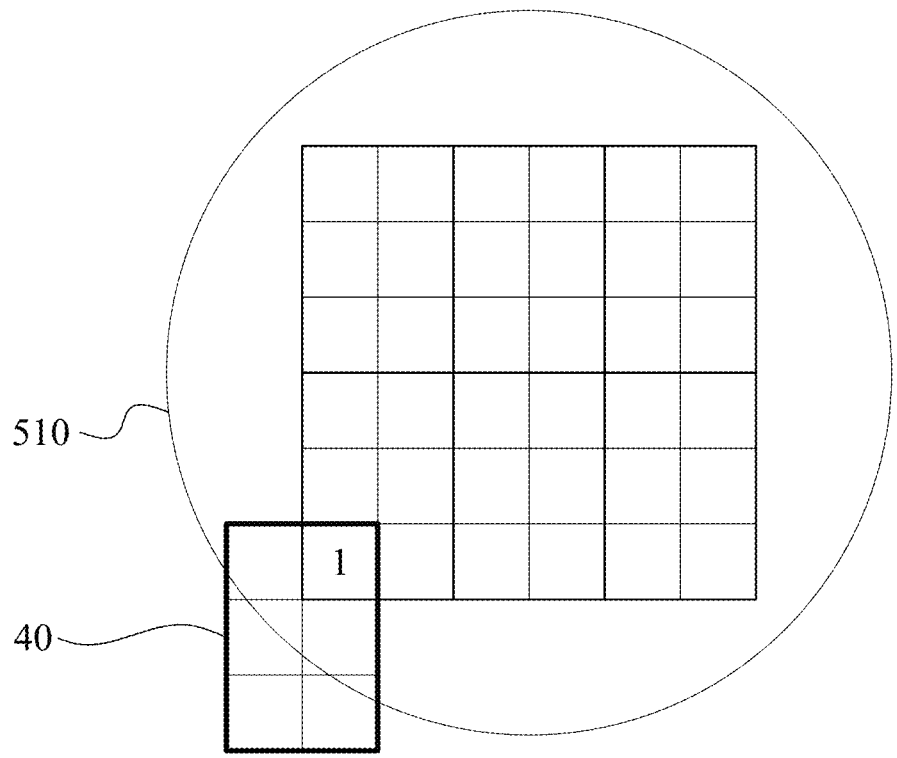
FIG. 15 shows one of various sequential operations in a method of exposing a semiconductor substrate according to an embodiment of the present disclosure.

FIGS. 15-49 show a method of exposing a photoresist-coated semiconductor wafer 510 according to an embodiment of the present disclosure. As shown in FIG. 15, a lower left side die is first exposed to radiation at a radiation dose less than the optimum dose using a reflective phase-shifting mask.

Figure 16:
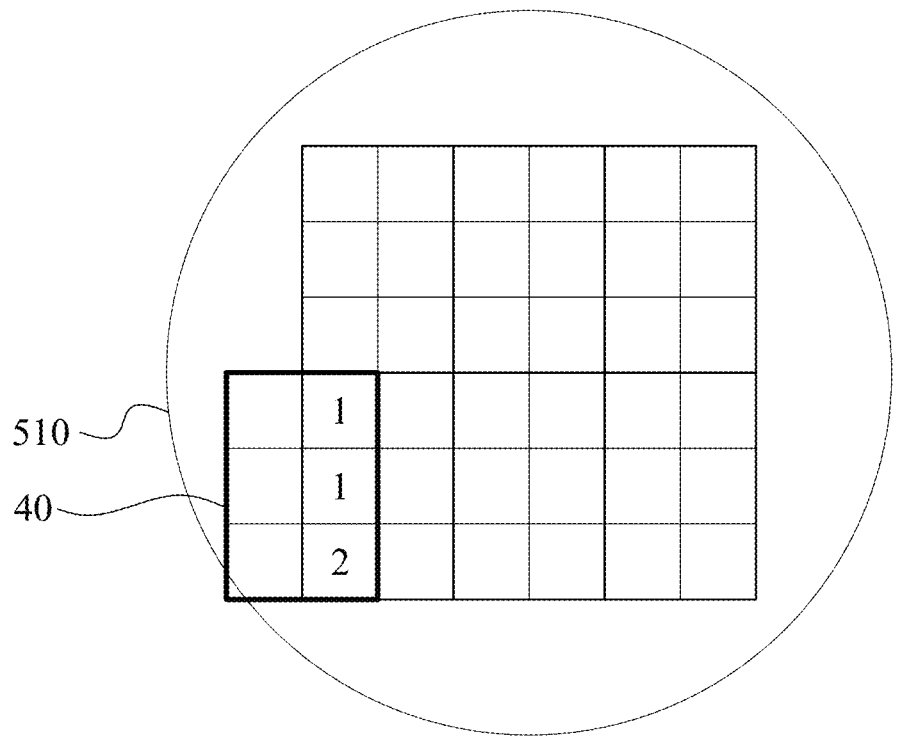
FIG. 16 shows one of various sequential operations in a method of exposing a semiconductor substrate according to an embodiment of the present disclosure.

The photomask 40 is subsequently moved up relative to the wafer 510 in FIG. 16, and three dies are exposed at a radiation dose less than the optimum dose. Thus, the originally exposed die (lower left die) has been exposed twice. The two dies above the first die have each been exposed once.

The photomask 40 is shown as having six pattern areas having the same pattern, and thus up to six dies can be exposed at once. However, the present disclosure is not limited to masks having six of the same pattern, and in some embodiments, the mask contains two, three, four, five, or more than six of the same pattern enabling two, three, four, five, or more dies on the wafer to be imaged at the same time.

Figure 17:
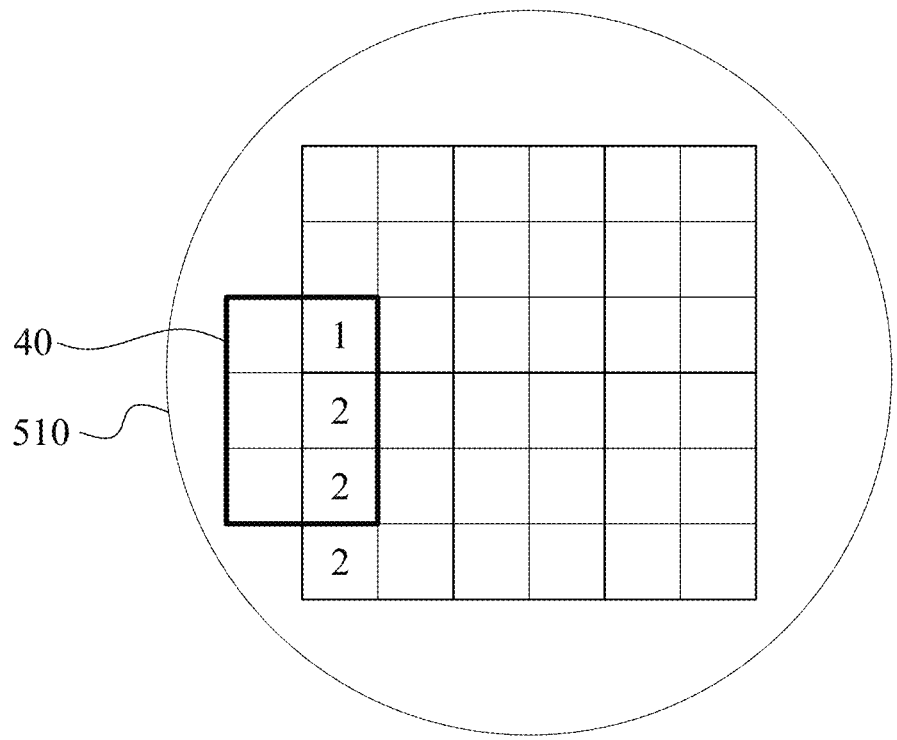
FIG. 17 shows one of various sequential operations in a method of exposing a semiconductor substrate according to an embodiment of the present disclosure.

In FIG. 17, the photomask 40 is moved up relative to the wafer 510 and the wafer 510 is exposed using an exposure dose less than the optimum exposure dose. As explained herein, moving the mask 40 relative to the wafer 510 is accomplished by moving the wafer stage 910 in some embodiments.

Figure 18:
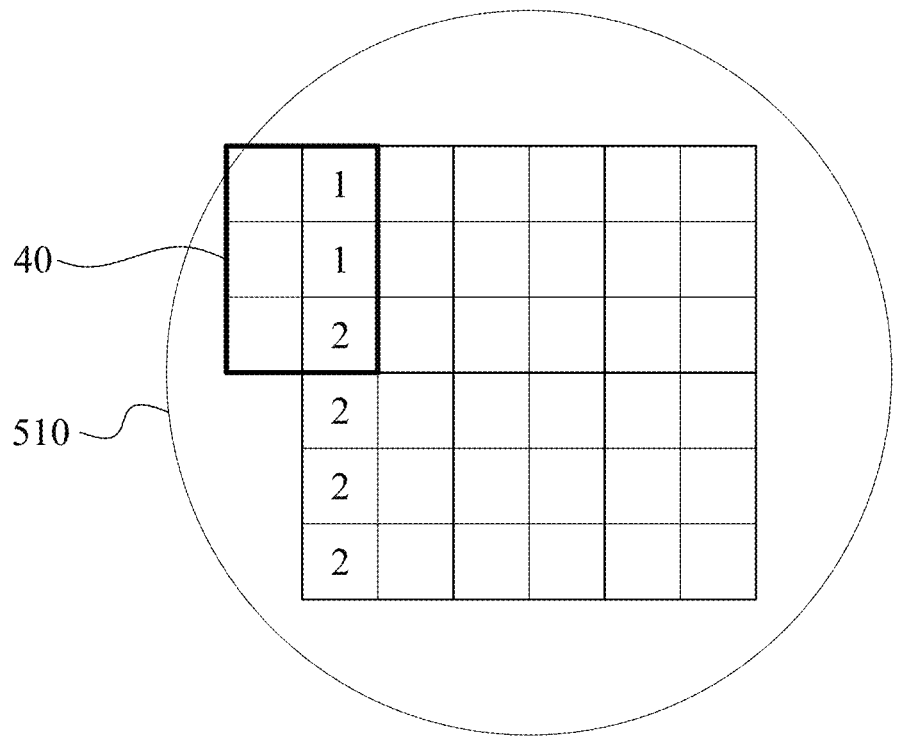
FIG. 18 shows one of various sequential operations in a method of exposing a semiconductor substrate according to an embodiment of the present disclosure.

As shown in FIG. 18, the mask 40 is moved up relative to the wafer 510 and an exposure using an exposure dose less than the optimum exposure dose is performed. The two uppermost dies have been exposed once, and the four lower dies have been exposed twice.

Figure 19:
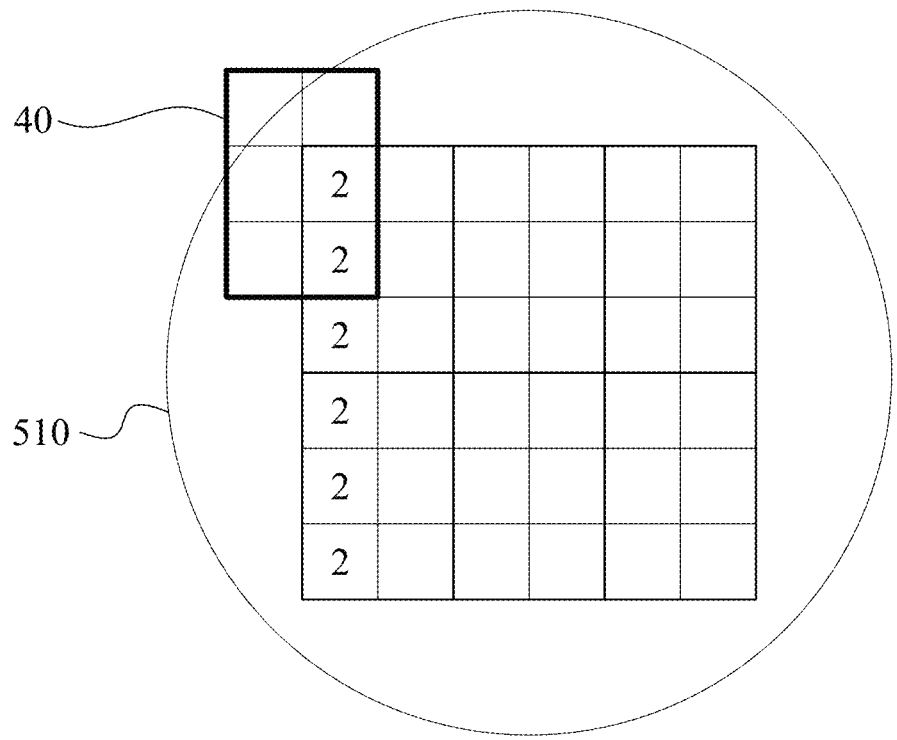
FIG. 19 shows one of various sequential operations in a method of exposing a semiconductor substrate according to an embodiment of the present disclosure.

As shown in FIG. 19, the mask 40 is moved up relative to the wafer 510 and the two upper lower left side dies are exposed a second time at an exposure dose less than the optimum exposure dose. Thus, each die in the left side first column of dies have been exposed twice.

Figure 20:
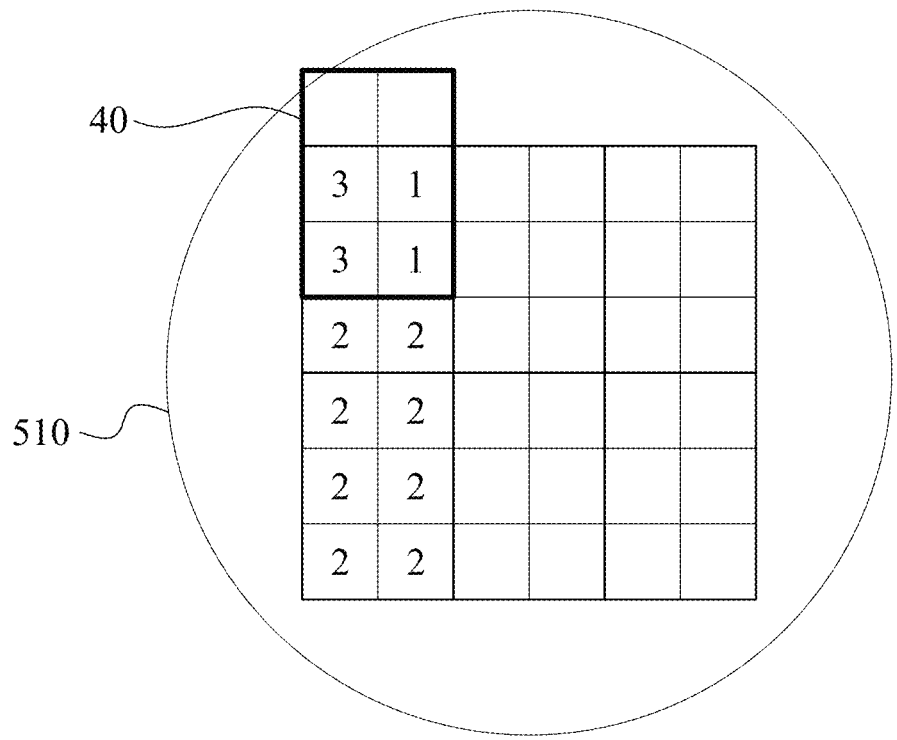
FIG. 20 shows one of various sequential operations in a method of exposing a semiconductor substrate according to an embodiment of the present disclosure.

The mask 40 is subsequently moved to the right relative to the wafer 510 in FIG. 20, and four dies are exposed, resulting in the two uppermost dies in the first column being exposed three times, and the two uppermost dies in the second column having been exposed once at exposure doses less than the optimum exposure dose.

Figure 21:
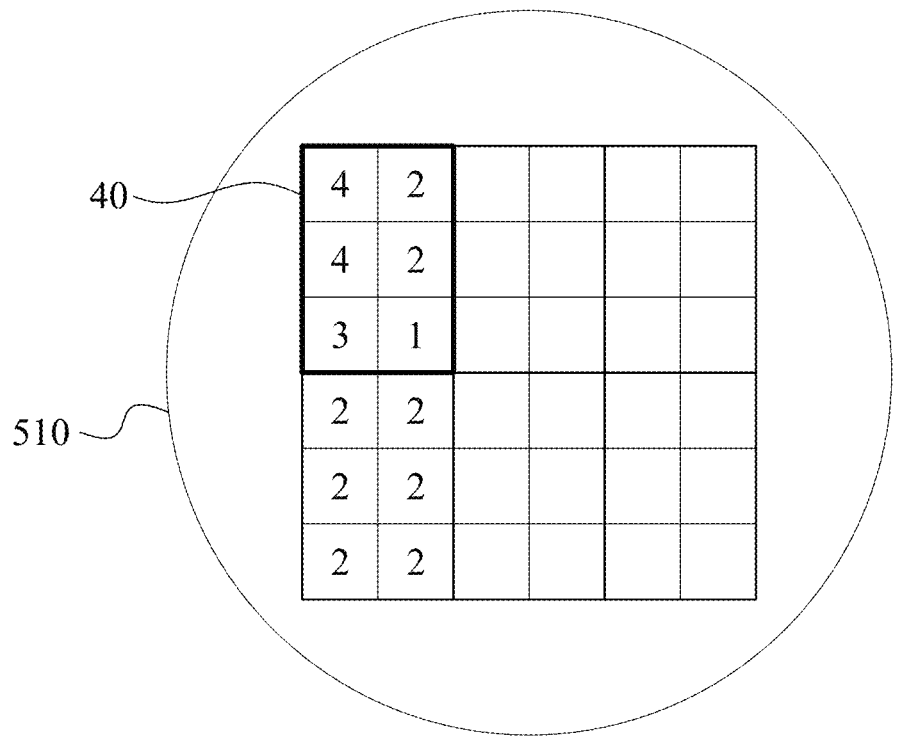
FIG. 21 shows one of various sequential operations in a method of exposing a semiconductor substrate according to an embodiment of the present disclosure.

In FIG. 21, the mask 40 is moved down relative to the wafer 510 and the wafer 510 is exposed EUV radiation. Thus, the two uppermost dies in the first column have been exposed four times, and the two uppermost dies in the second column have been exposed twice. The third dies from the top in the first and second columns have been exposed three times and once, respectively.

Figure 22:
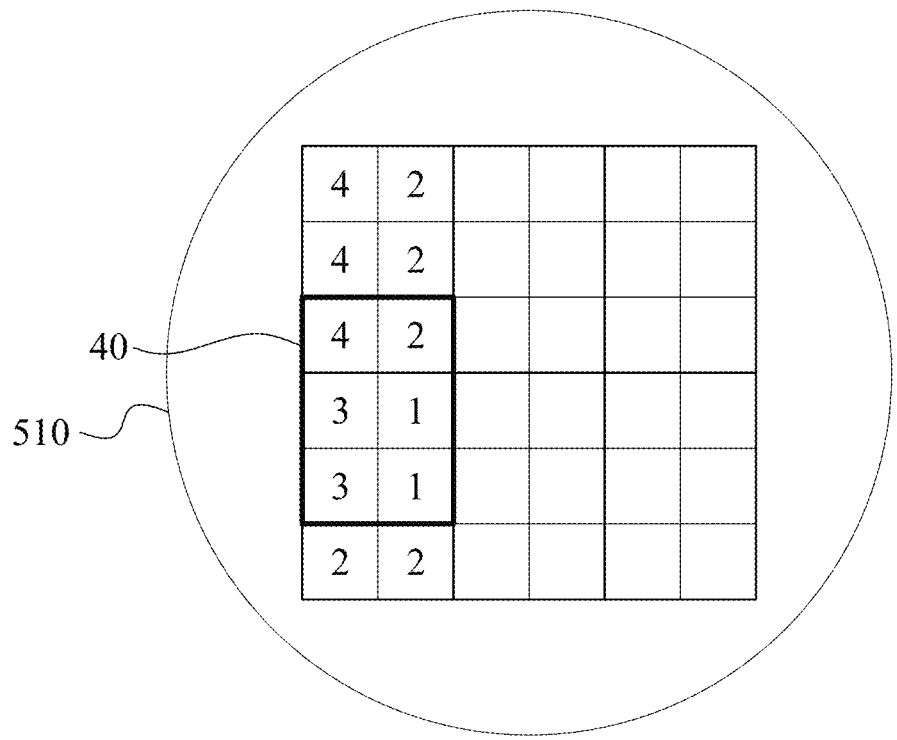
FIG. 22 shows one of various sequential operations in a method of exposing a semiconductor substrate according to an embodiment of the present disclosure.

As shown in FIG. 22, the mask 40 is moved down relative to the wafer 510 and an exposure at less than the optimum exposure dose is performed. The third die from the top of first column has now been exposed four times, the third die from the top of the second column has been exposed twice, the second and third dies from the bottom of the first column have been exposed three times, and the second and third dies from the bottom of the second column have been exposed once.

Figure 23:
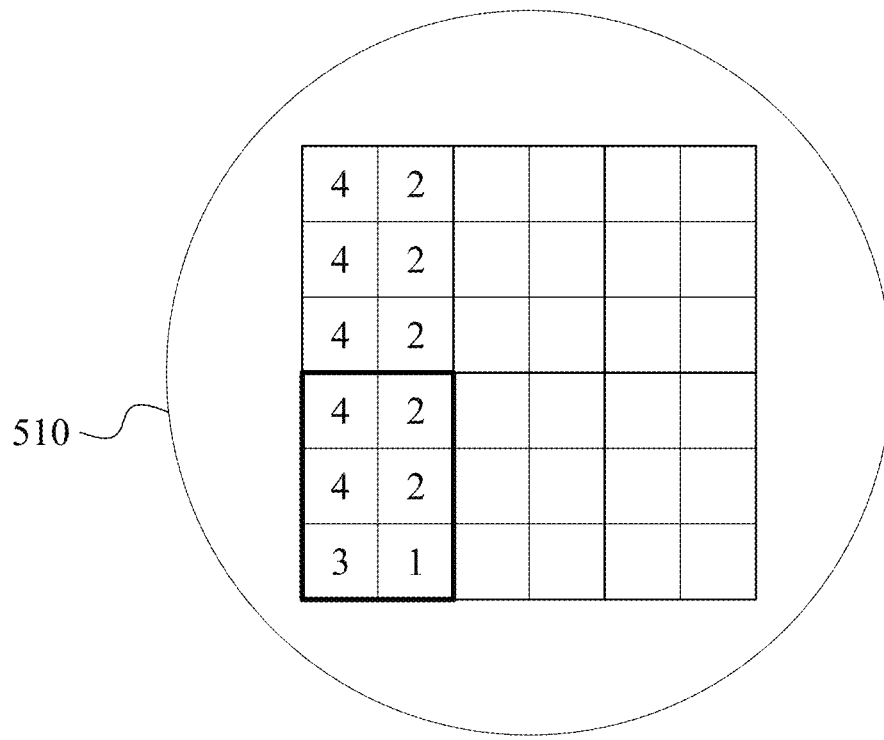
FIG. 23 shows one of various sequential operations in a method of exposing a semiconductor substrate according to an embodiment of the present disclosure.

The mask 40 is subsequently moved to down relative to the wafer 510 in FIG. 23, and the three lower dies in both the first and second columns are exposed at an exposure dose less than the optimum exposure dose. Thus, the second and third dies from bottom of the first column have been exposed four times. The second and third dies from bottom of the second columns have been exposed twice. The bottom die in first column has been exposed three times, and the bottom die in the second column has been exposed once.

Figure 24:
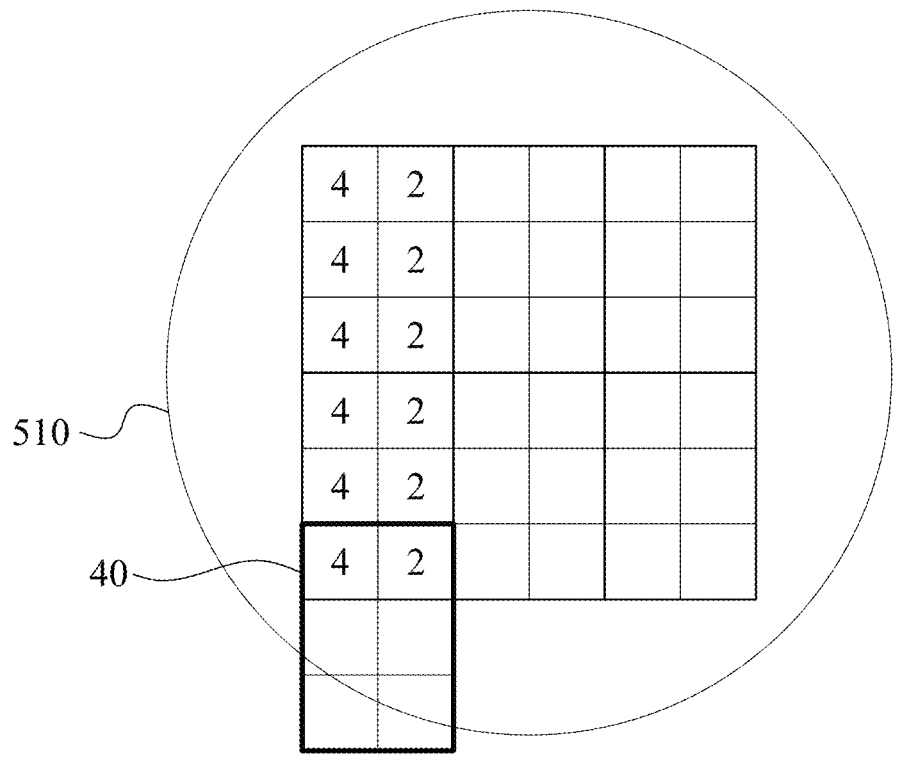
FIG. 24 shows one of various sequential operations in a method of exposing a semiconductor substrate according to an embodiment of the present disclosure.

In FIG. 24, the mask 40 is moved down relative to the wafer 510 and the wafer 510 is exposed at an exposure dose less than optimum exposure dose. After this step, all the dies in the first column have been exposed four times and all the dies in the second column have been exposed twice. In embodiments where each exposure is about one-fourth of the total exposure dose each die in the first column is now fully exposed.

Figure 25:
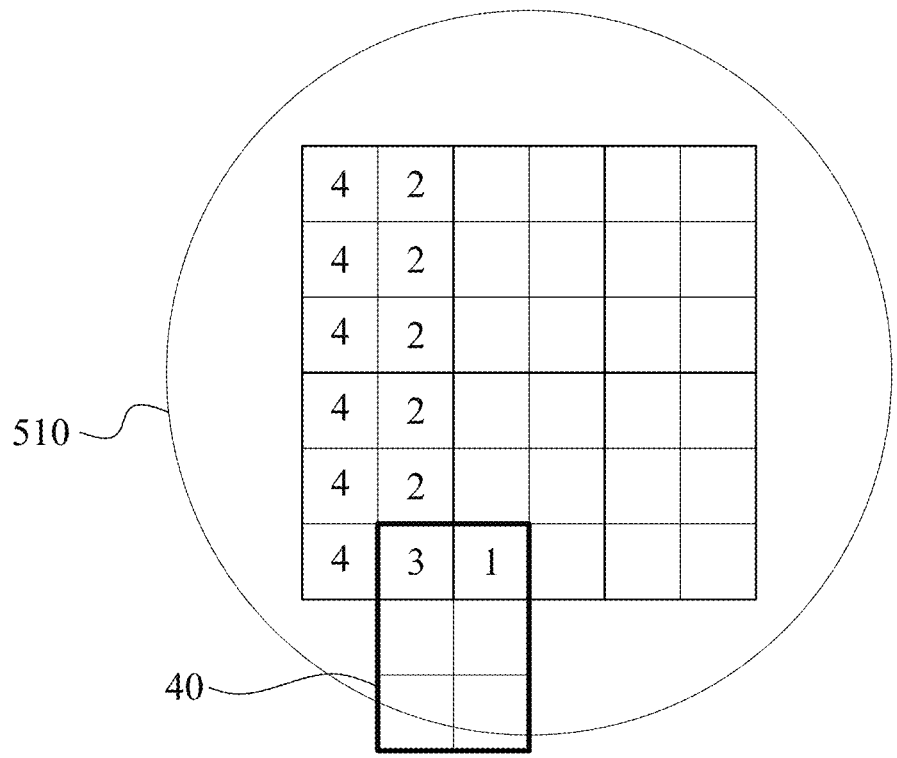
FIG. 25 shows one of various sequential operations in a method of exposing a semiconductor substrate according to an embodiment of the present disclosure.

As shown in FIG. 25, the mask 40 is moved to the right relative to the wafer 510 and an exposure at less than the optimum exposure dose is performed. The bottom die in the second column has now been exposed three times, and the bottom die in the third column has been exposed once.

Figure 26:
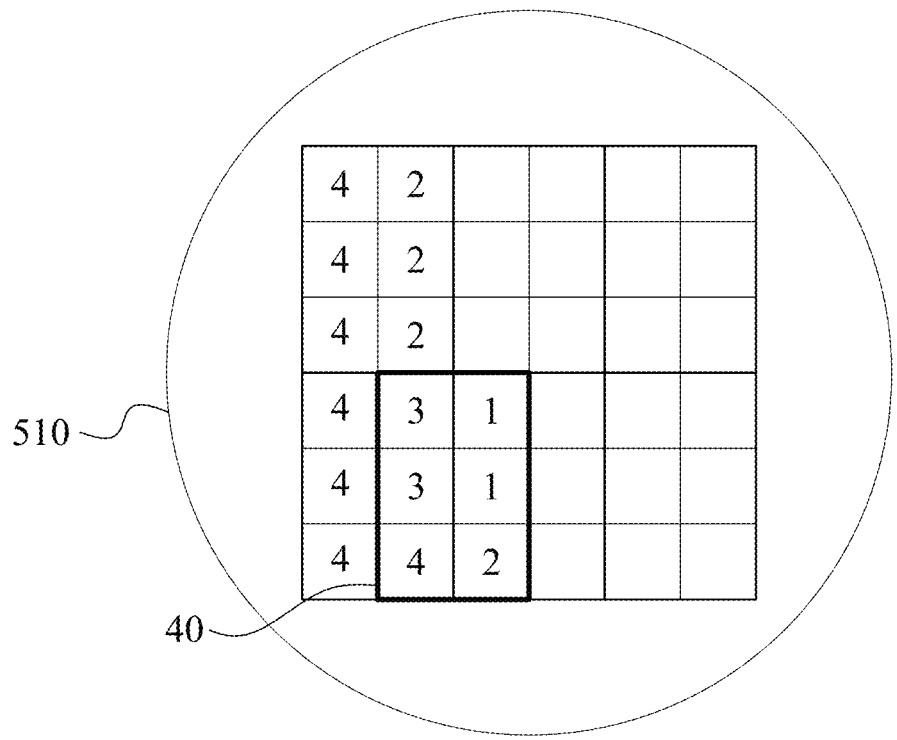
FIG. 26 shows one of various sequential operations in a method of exposing a semiconductor substrate according to an embodiment of the present disclosure.

The mask 40 is subsequently moved up relative to the wafer 510 in FIG. 26, and six dies are exposed at less than the optimum exposure dose. Thus, the second and third dies from the bottom of the second column have been exposed three times, once above the target focus and twice below the target focus, and the second and third dies from the bottom of the third column have been exposed once. The bottom dies of the second and third columns have been exposed four times and twice, respectively.

Figure 27:
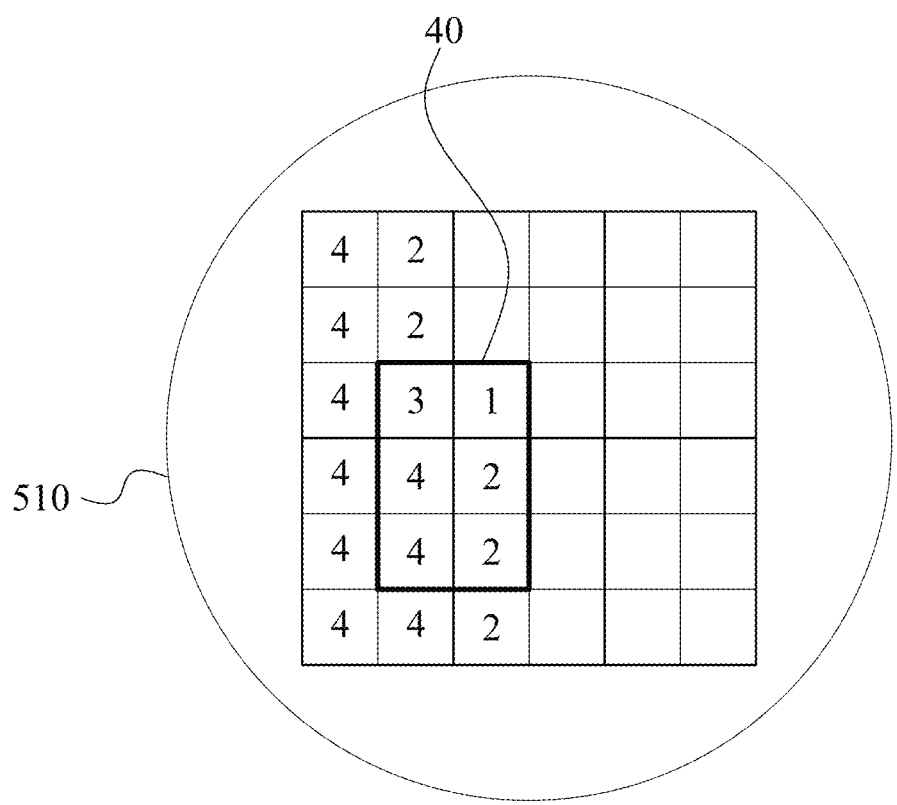
FIG. 27 shows one of various sequential operations in a method of exposing a semiconductor substrate according to an embodiment of the present disclosure.

In FIG. 27, the mask 40 is moved up relative to the wafer 510 and the wafer 510 is exposed at an exposure dose less than the optimum exposure dose. Thus, the second and third dies from the bottom of the second column have been exposed four times, and the third die from the top of the second column has been exposed three times. The second and third dies from the bottom of the third have been exposed twice, and the third die from the top of the third column has been exposed once.

Figure 28:
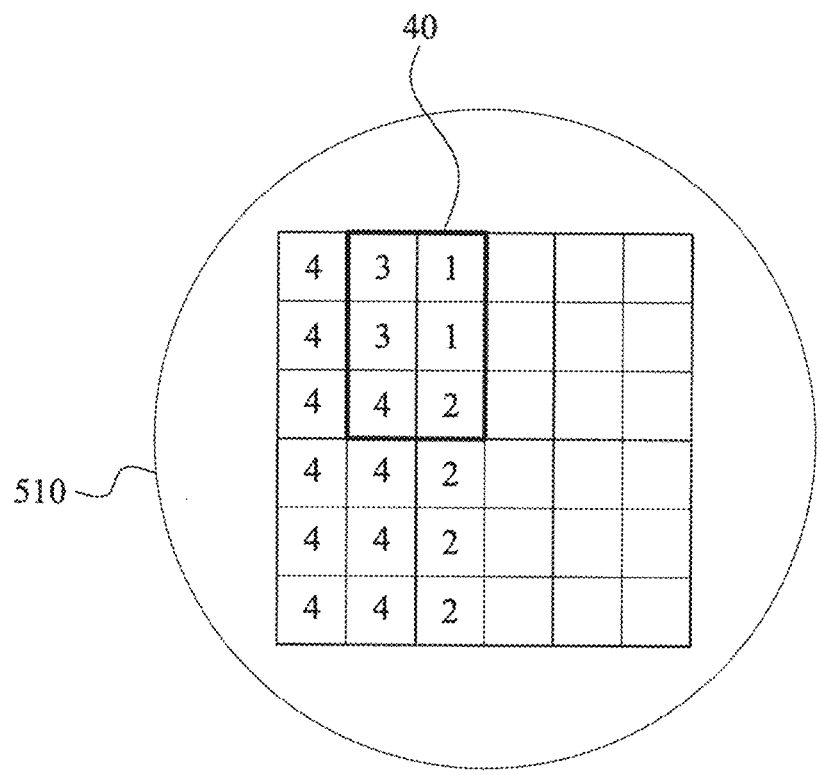
FIG. 28 shows one of various sequential operations in a method of exposing a semiconductor substrate according to an embodiment of the present disclosure.

As shown in FIG. 28, the mask 40 is moved up relative to the wafer 510 and an exposure at less than the optimum exposure dose is performed. The two uppermost dies in the second column are exposed a third time, and the third die from the top of second column has now been exposed four times. The two uppermost dies in the third column have been exposed once, and the third die from the top of the third column has been exposed twice.

Figure 29:
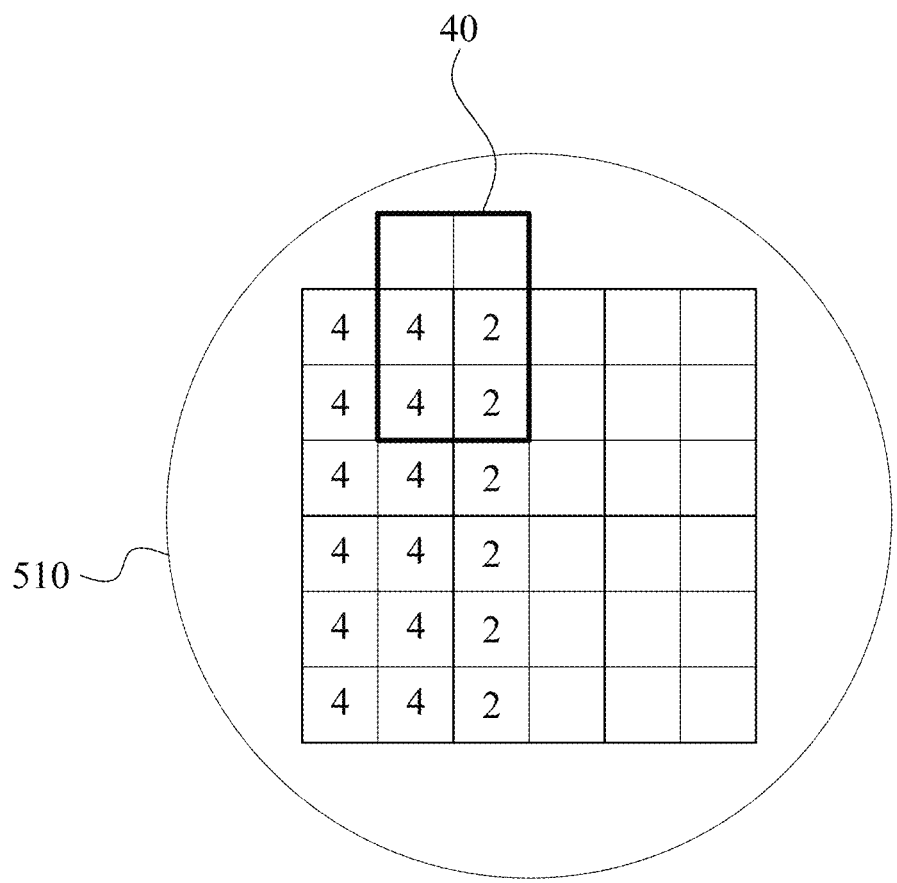
FIG. 29 shows one of various sequential operations in a method of exposing a semiconductor substrate according to an embodiment of the present disclosure.

The mask 40 is subsequently moved up relative to the wafer 510 in FIG. 29, and the two uppermost dies in the second and third columns are exposed at an exposure dose less than the optimum exposure dose. Thus, the two uppermost dies in the second column have been exposed four times, and the two uppermost dies in the third column have been exposed twice.

Figure 30:
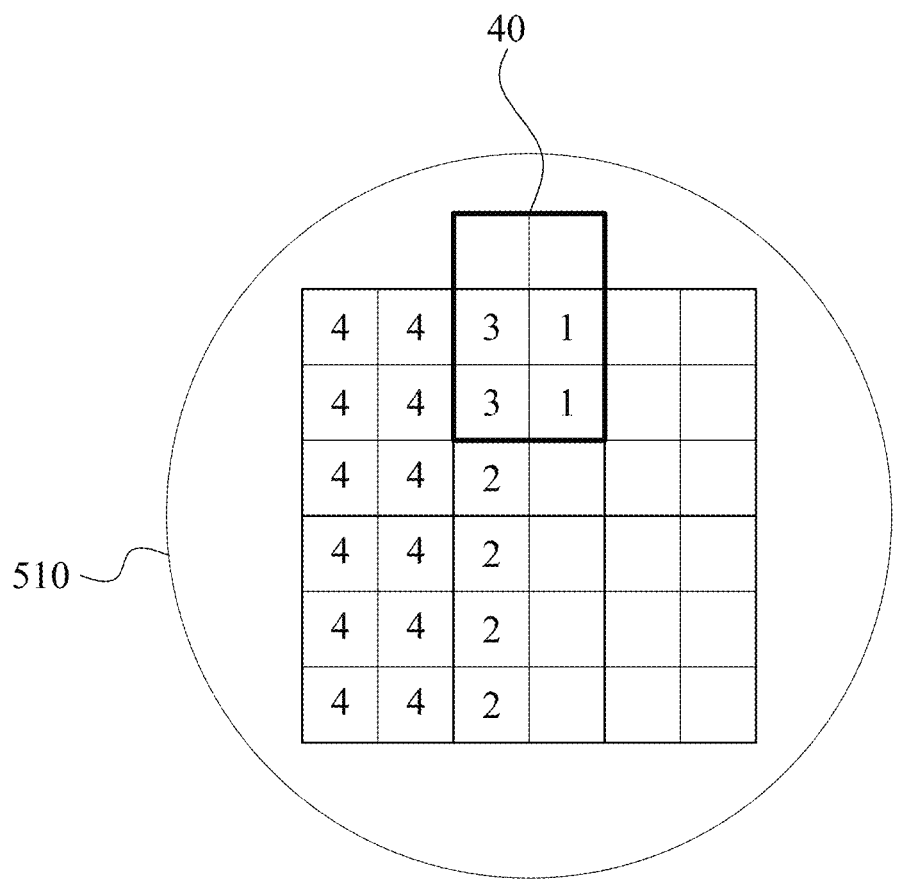
FIG. 30 shows one of various sequential operations in a method of exposing a semiconductor substrate according to an embodiment of the present disclosure.

In FIG. 30, the mask 40 is moved to the right relative to the wafer 510 and the wafer 510 is exposed at an exposure dose less than the optimum exposure dose. Thus, the two uppermost dies in the third column and the two uppermost dies in the fourth column have been exposed three times and once, respectively.

Figure 31:
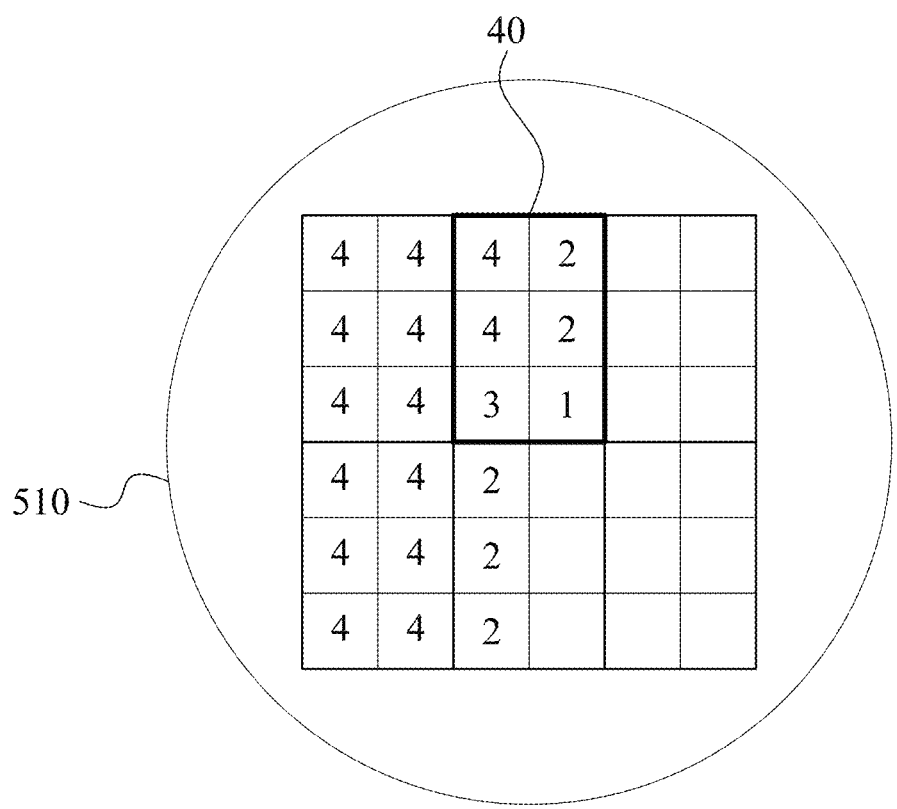
FIG. 31 shows one of various sequential operations in a method of exposing a semiconductor substrate according to an embodiment of the present disclosure.

As shown in FIG. 31, the mask 40 is subsequently moved down relative to the wafer 510 and an exposure at less than the optimum exposure dose is performed. The two uppermost dies in the third and fourth column have now been exposed four and two times, respectively. The third die from the top of the third column has been exposed three times, and the third die from the top of the fourth column has been exposed once.

Figure 32:
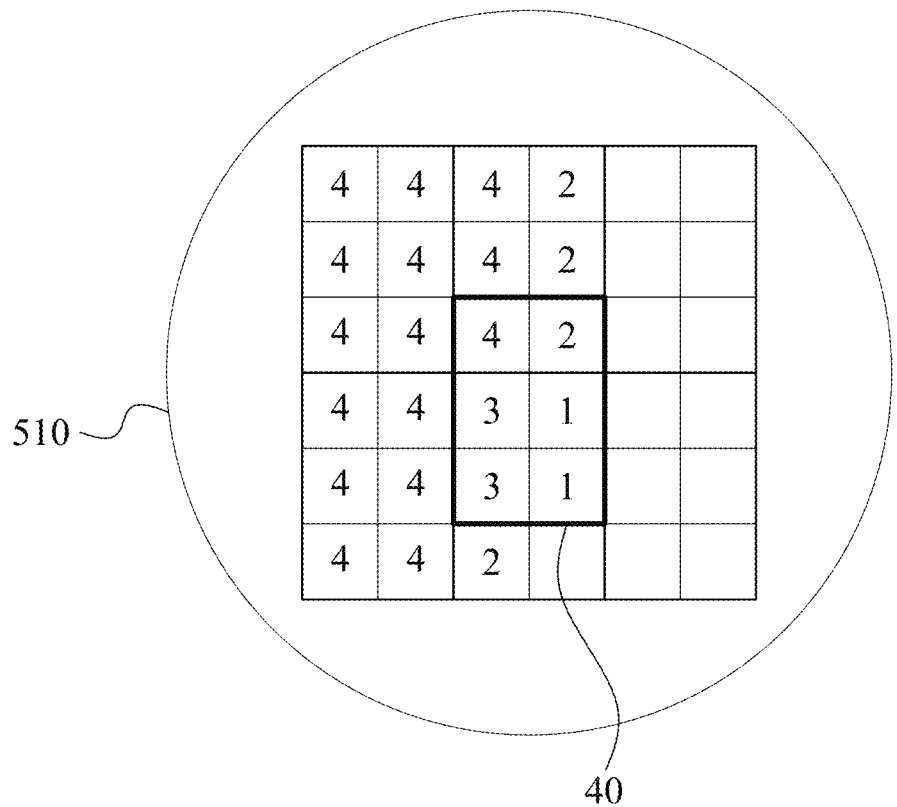
FIG. 32 shows one of various sequential operations in a method of exposing a semiconductor substrate according to an embodiment of the present disclosure.

As shown in FIG. 32, the mask 40 is moved down relative to the wafer 510 and six dies are exposed at an exposure dose less than the optimum exposure dose. Thus, the third dies from the top of the third and fourth columns have been exposed four and two times, respectively. The second and third dies from the bottom of the third column have been exposed three times. The second and third dies from the bottom of the fourth column have been exposed once.

Figure 33:
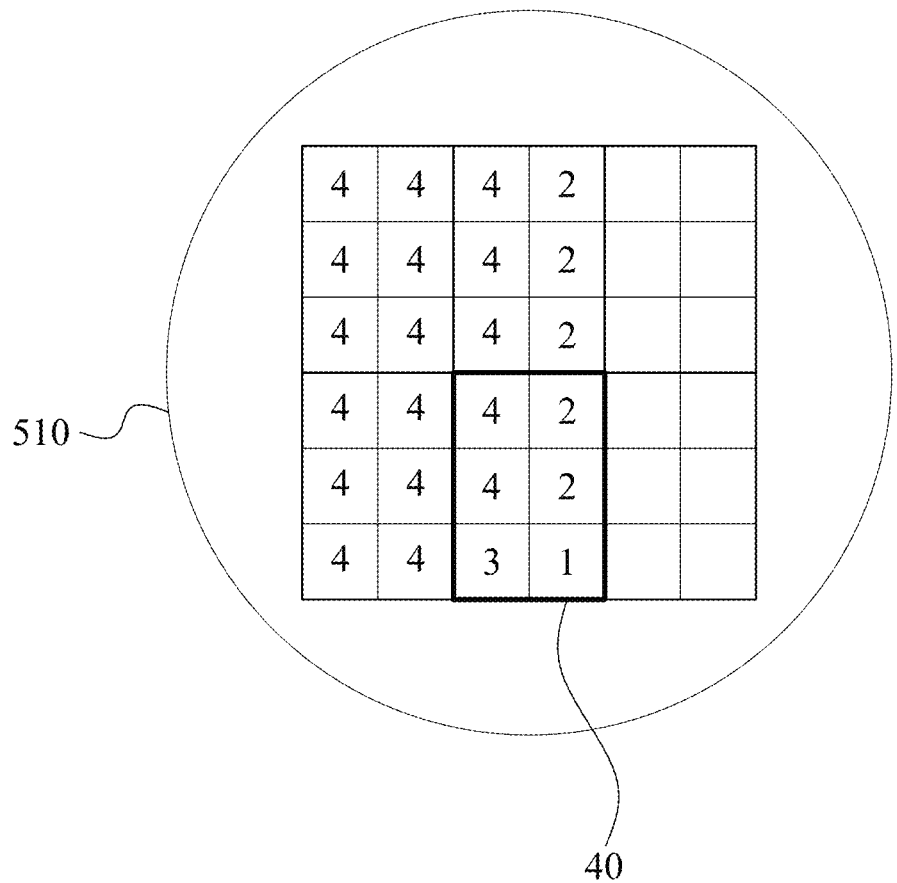
FIG. 33 shows one of various sequential operations in a method of exposing a semiconductor substrate according to an embodiment of the present disclosure.

The mask 40 is subsequently moved down relative to the wafer 510 in FIG. 33, and six dies are exposed at an exposure dose less than the optimum exposure dose. Thus, the second and third dies from the bottom of the third column have been exposed four times. The second and third dies from the bottom of the fourth column have been exposed twice. The bottom dies of the third and fourth columns have been exposed three times and once, respectively.

Figure 34:
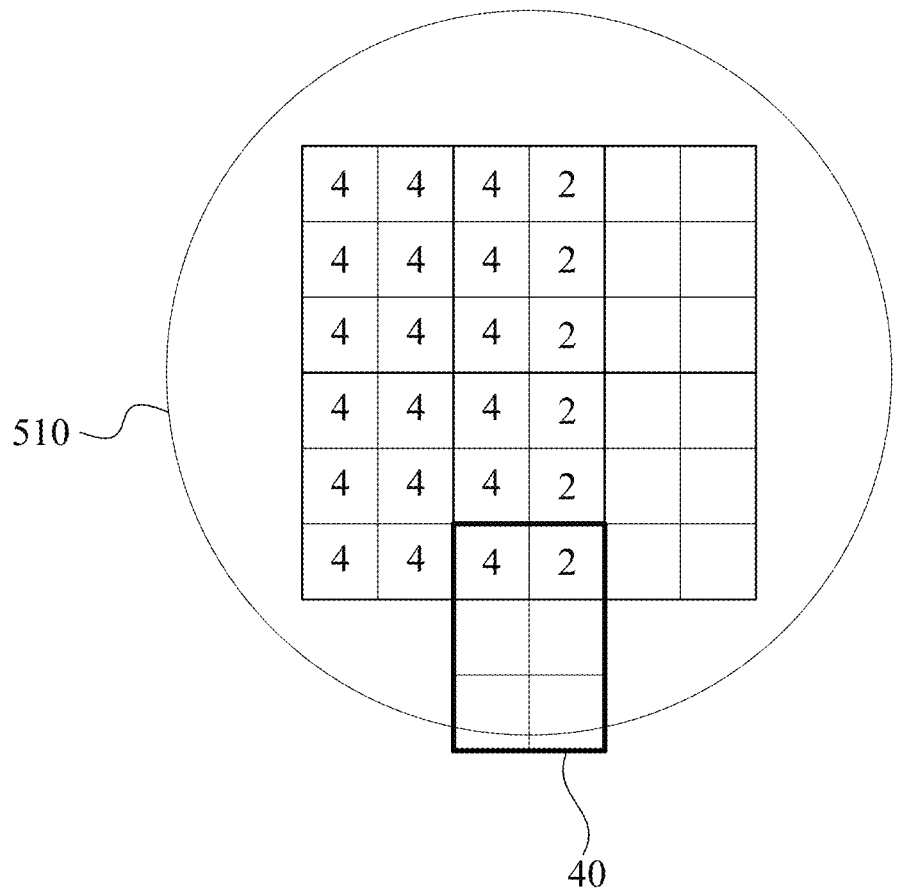
FIG. 34 shows one of various sequential operations in a method of exposing a semiconductor substrate according to an embodiment of the present disclosure.

In FIG. 34, the mask 40 is moved down relative to the wafer 510 and the wafer 510 is exposed at less than the optimum exposure dose. Thus, the bottom dies in the third and fourth column have been exposed four times and twice, respectively.

Figure 35:
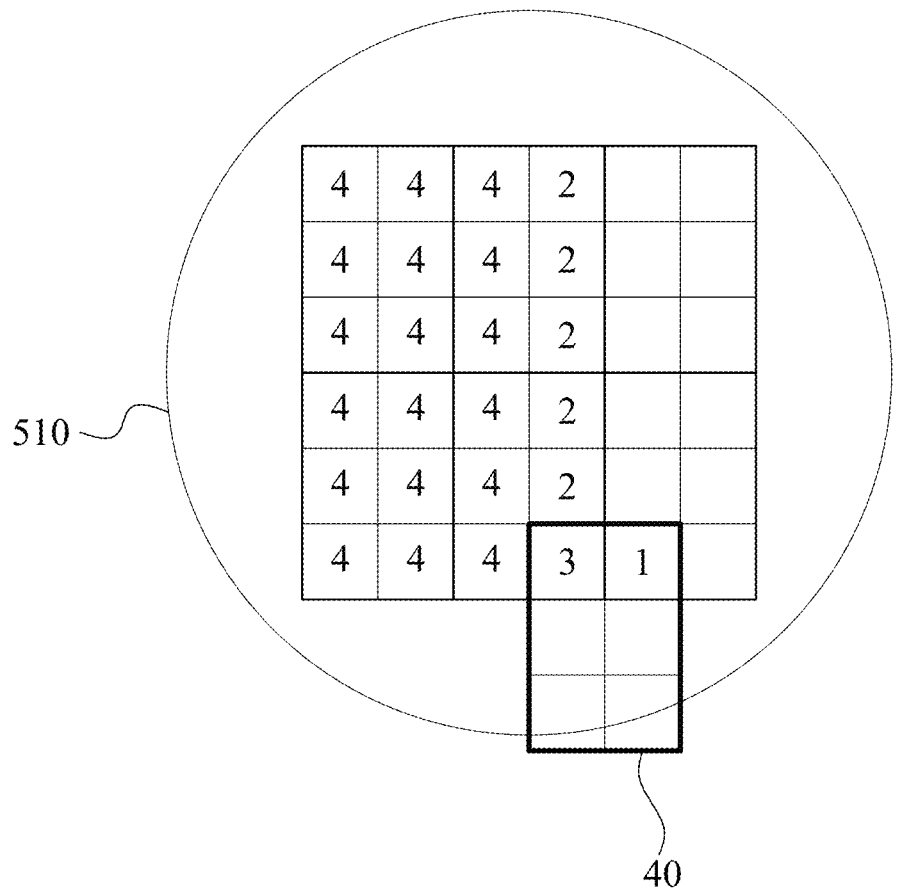
FIG. 35 shows one of various sequential operations in a method of exposing a semiconductor substrate according to an embodiment of the present disclosure.

As shown in FIG. 35, the mask 40 is moved to the right relative to the wafer 510 and an exposure at less than the optimum exposure dose is performed. The bottom dies of the fourth and fifth columns have now been exposed three times and once, respectively.

Figure 36:
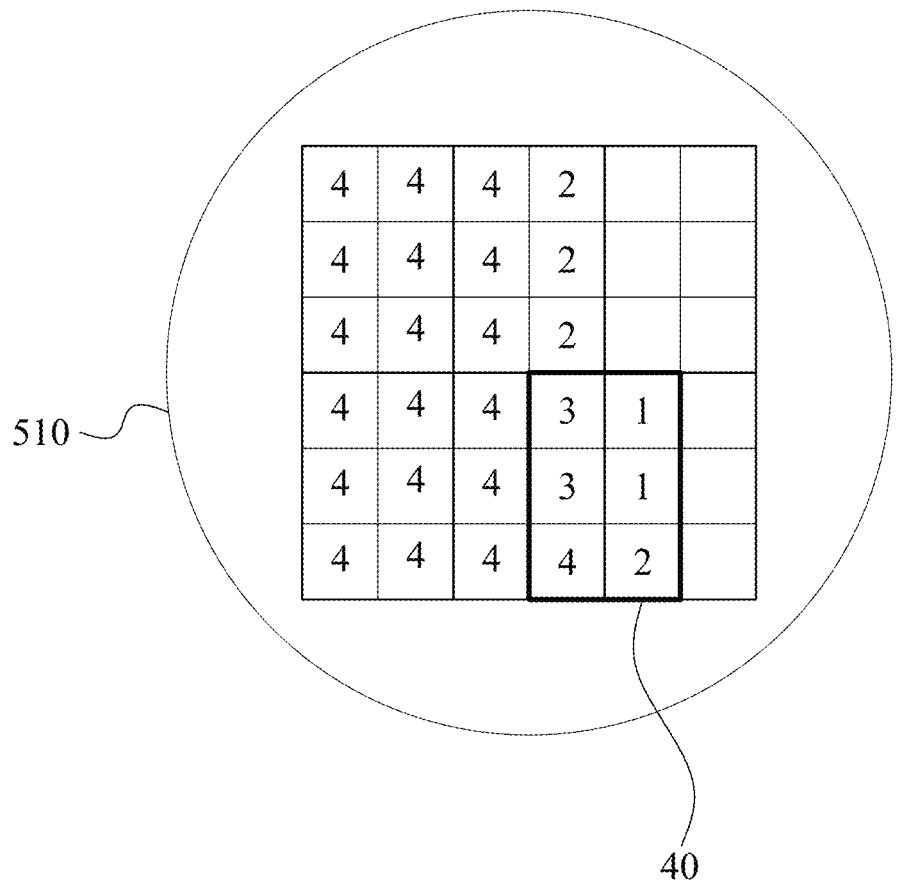
FIG. 36 shows one of various sequential operations in a method of exposing a semiconductor substrate according to an embodiment of the present disclosure.

The mask 40 is subsequently moved up relative to the wafer 510 in FIG. 36, and the six lower dies in the fourth and fifth columns are exposed at an exposure dose less than the optimum exposure dose. Thus, the second and third dies from bottom of the fourth column have been exposed three times. The second and third dies from bottom of the fifth column have been exposed once. The bottom die in fourth column has been exposed four times, and the bottom die in the fifth column has been exposed twice.

Figure 37:
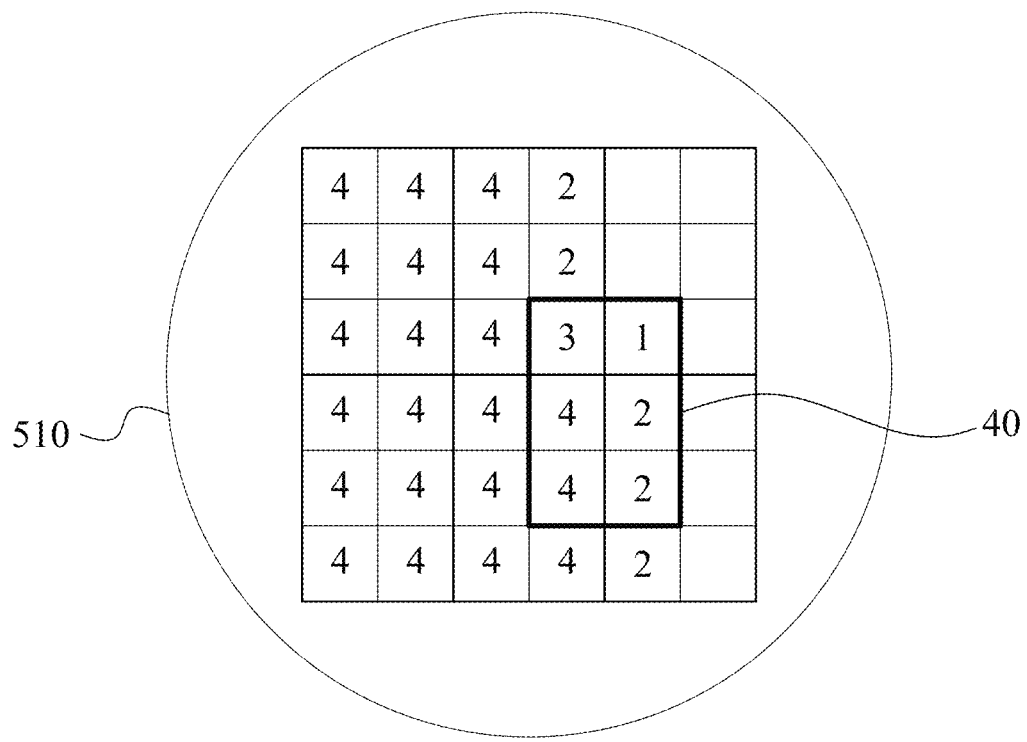
FIG. 37 shows one of various sequential operations in a method of exposing a semiconductor substrate according to an embodiment of the present disclosure.

In FIG. 37, the mask 40 is moved up relative to the wafer 510 and the wafer 510 is exposed at an exposure dose less than the optimum exposure dose. The second and third dies from the bottom of the fourth column have now been exposed four times and the second and third dies from the bottom of the fifth column have been exposed twice. The third die from the top of the fourth column has been exposed three times and the third die from the top of the fifth column has been exposed once.

Figure 38:
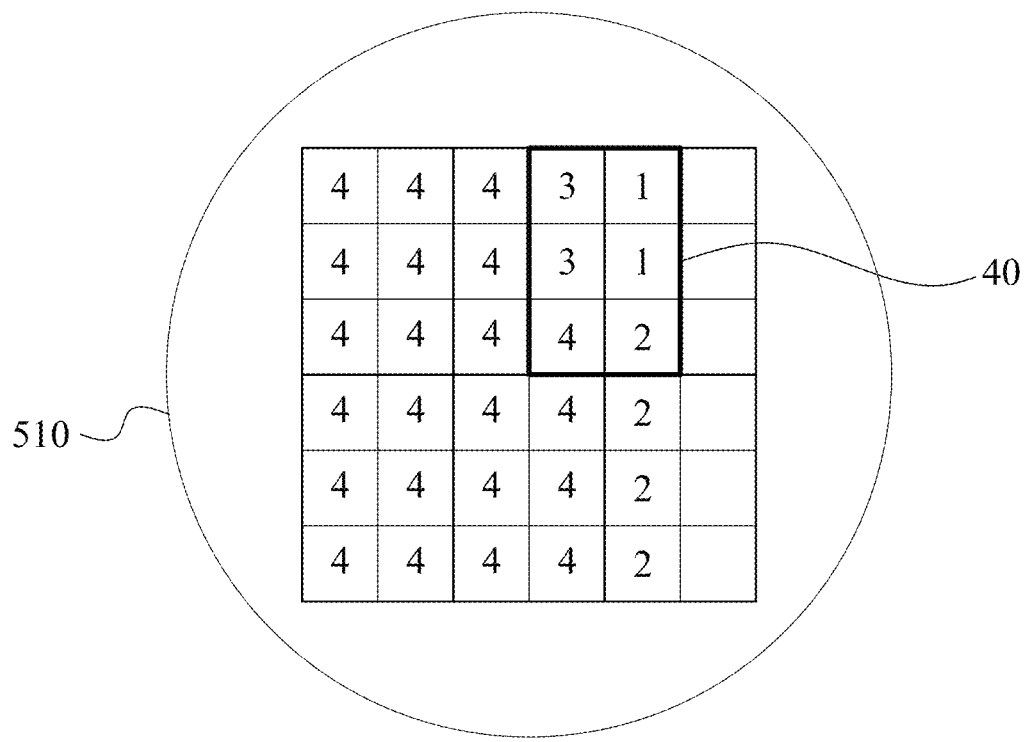
FIG. 38 shows one of various sequential operations in a method of exposing a semiconductor substrate according to an embodiment of the present disclosure.

As shown in FIG. 38, the mask 40 is moved up relative to the wafer 510 and an exposure at less than the optimum exposure dose is performed. The two uppermost dies in the fourth column have now been exposed three times, and the two uppermost dies in the fifth column have been exposed once. The third die from the top of the fourth column has been exposed four times and the third die from the top of the fifth column has been exposed twice.

Figure 39:
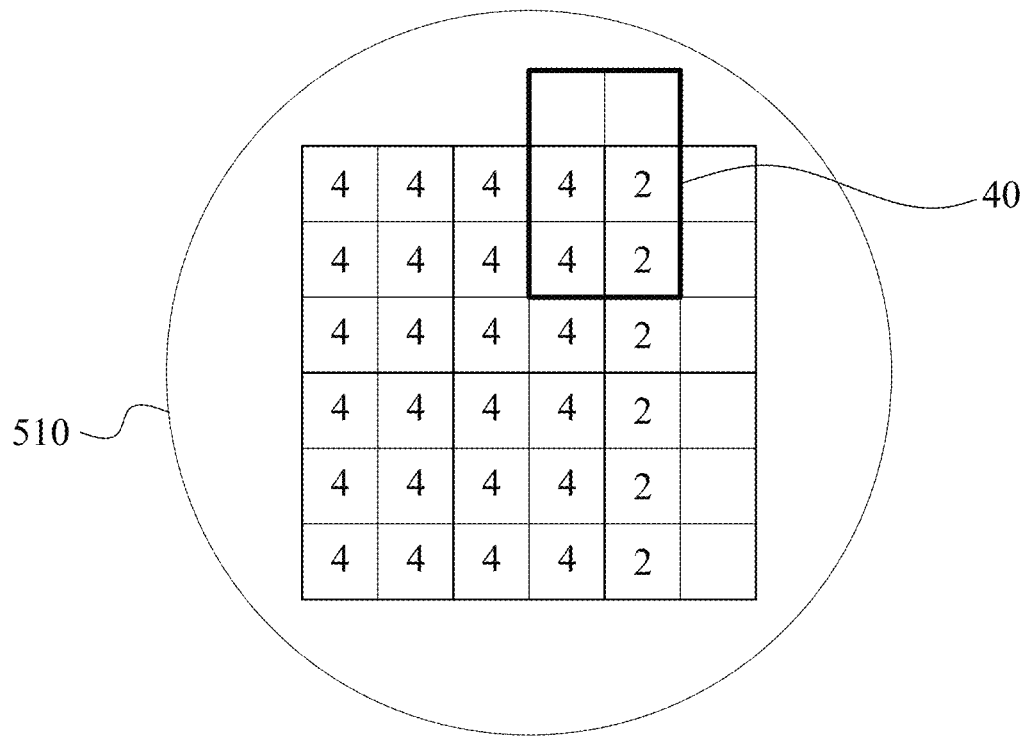
FIG. 39 shows one of various sequential operations in a method of exposing a semiconductor substrate according to an embodiment of the present disclosure.

In FIG. 39, the mask 40 is moved up relative to the wafer 510 and four dies are exposed at an exposure dose less than the optimum exposure dose. The two uppermost dies of the fourth column have been exposed four times, and the two uppermost dies of the fifth column have been exposed twice.

Figure 40:
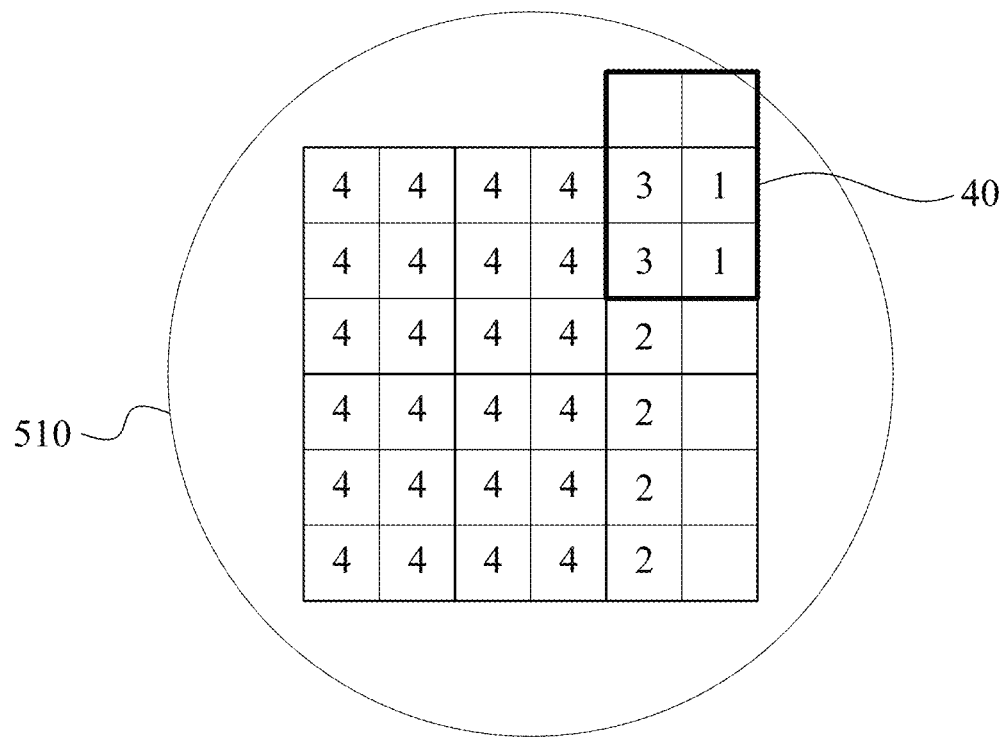
FIG. 40 shows one of various sequential operations in a method of exposing a semiconductor substrate according to an embodiment of the present disclosure.

As shown in FIG. 40, the mask 40 is moved to the right relative to the wafer 510 and an exposure at less than the optimum exposure dose is performed. The two uppermost dies in the fifth column are exposed a third time, and the two uppermost dies in the fifth column have been exposed once.

Figure 41:
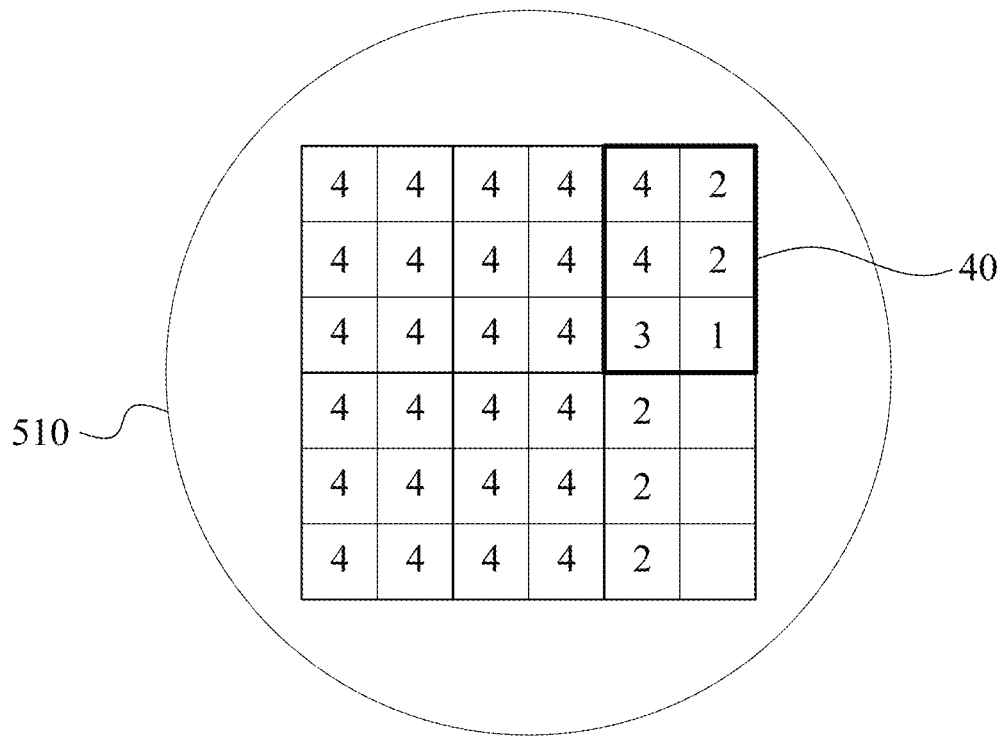
FIG. 41 shows one of various sequential operations in a method of exposing a semiconductor substrate according to an embodiment of the present disclosure.

The mask 40 is subsequently moved down relative to the wafer 510 in FIG. 41, and the six dies in the upper right corner of the fifth and sixth columns are exposed at less than the optimum exposure dose. Thus, the two uppermost dies in the fourth column have been exposed four times, and the two uppermost dies in the sixth column have been exposed twice. The third die from the top of the fifth column has been exposed three times and the third die from the top of the sixth column has been exposed once.

Figure 42:
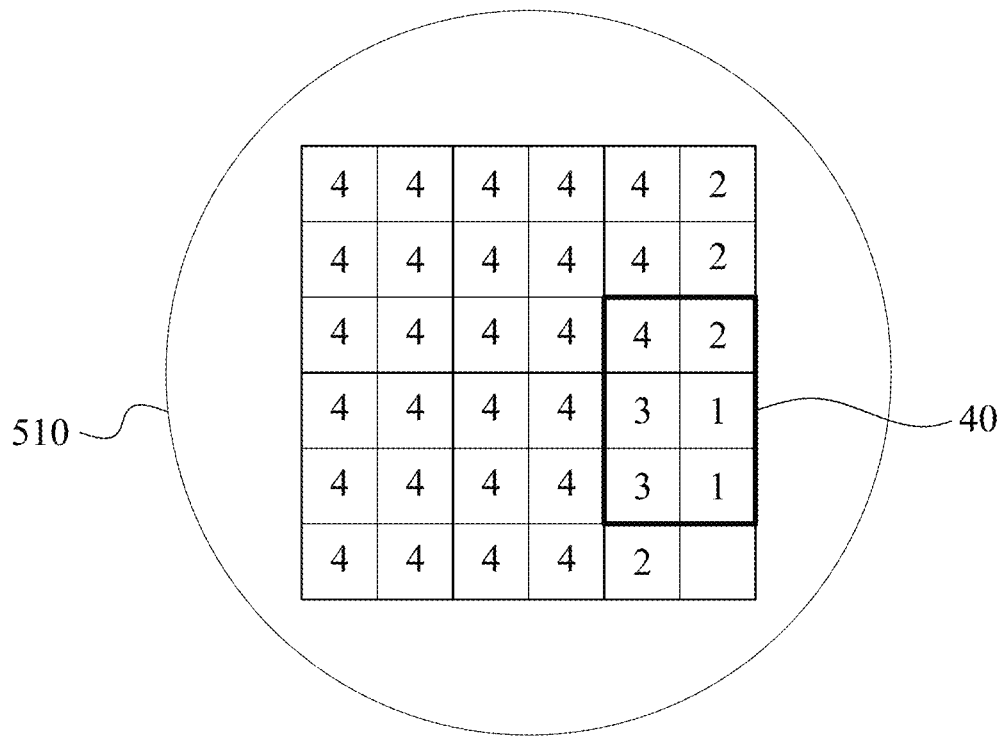
FIG. 42 shows one of various sequential operations in a method of exposing a semiconductor substrate according to an embodiment of the present disclosure.

In FIG. 42, the mask 40 is moved down right relative to the wafer 510 and the wafer 510 is exposed at less than the optimum exposure dose. Thus, the second and third dies from the bottom of the fifth column and the second and third dies from the bottom of the have been exposed three times and once, respectively. The third die from the top of the fifth column and third die from the top of the sixth column have been exposed four times and twice, respectively.

Figure 43:
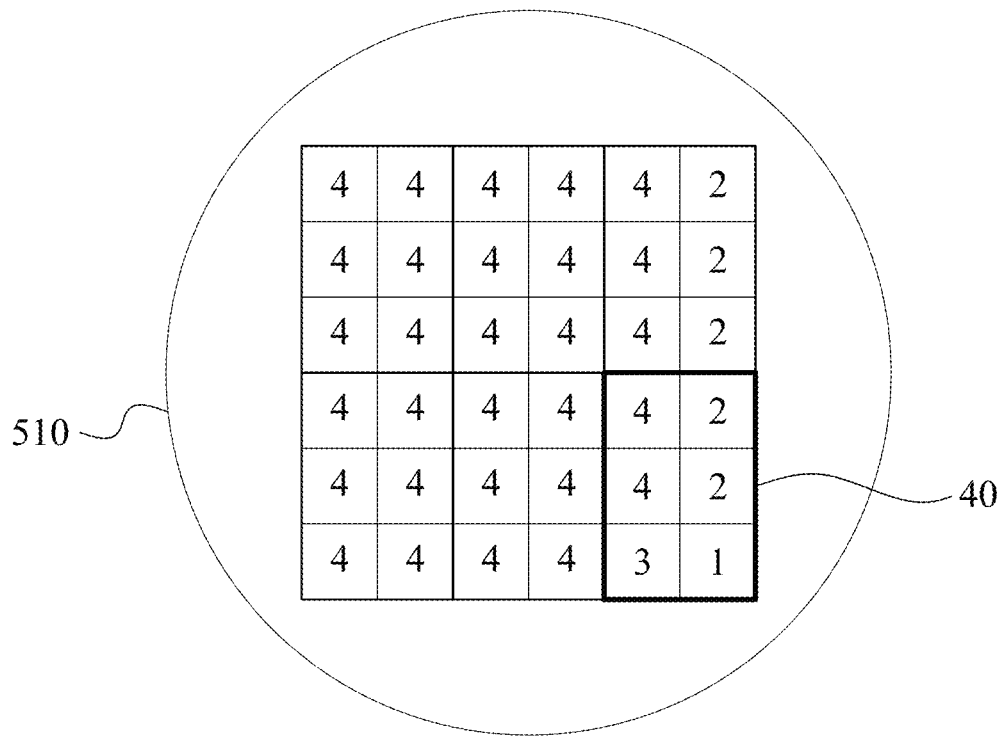
FIG. 43 shows one of various sequential operations in a method of exposing a semiconductor substrate according to an embodiment of the present disclosure.

As shown in FIG. 43, the mask 40 is subsequently moved down relative to the wafer 510 and an exposure at less than the optimum exposure dose is performed. The second and third dies from the bottom of fifth and sixth columns have now been exposed four and two times, respectively. The bottom dies of the fifth and sixth columns have been exposed three times and once, respectively.

Figure 44:
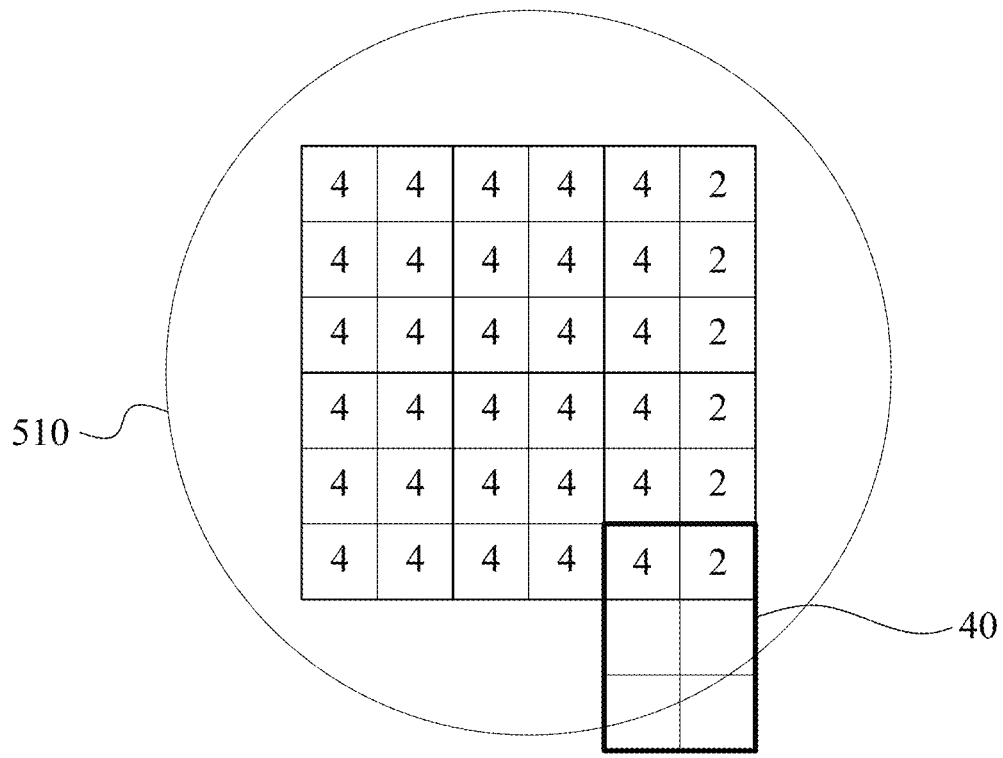
FIG. 44 shows one of various sequential operations in a method of exposing a semiconductor substrate according to an embodiment of the present disclosure.

As shown in FIG. 44, the mask 40 is moved down relative to the wafer 510 and an exposure at less than the optimum exposure dose is performed. The two bottom dies in the fifth and sixth columns have now been exposed four times and twice, respectively.

Figure 45:
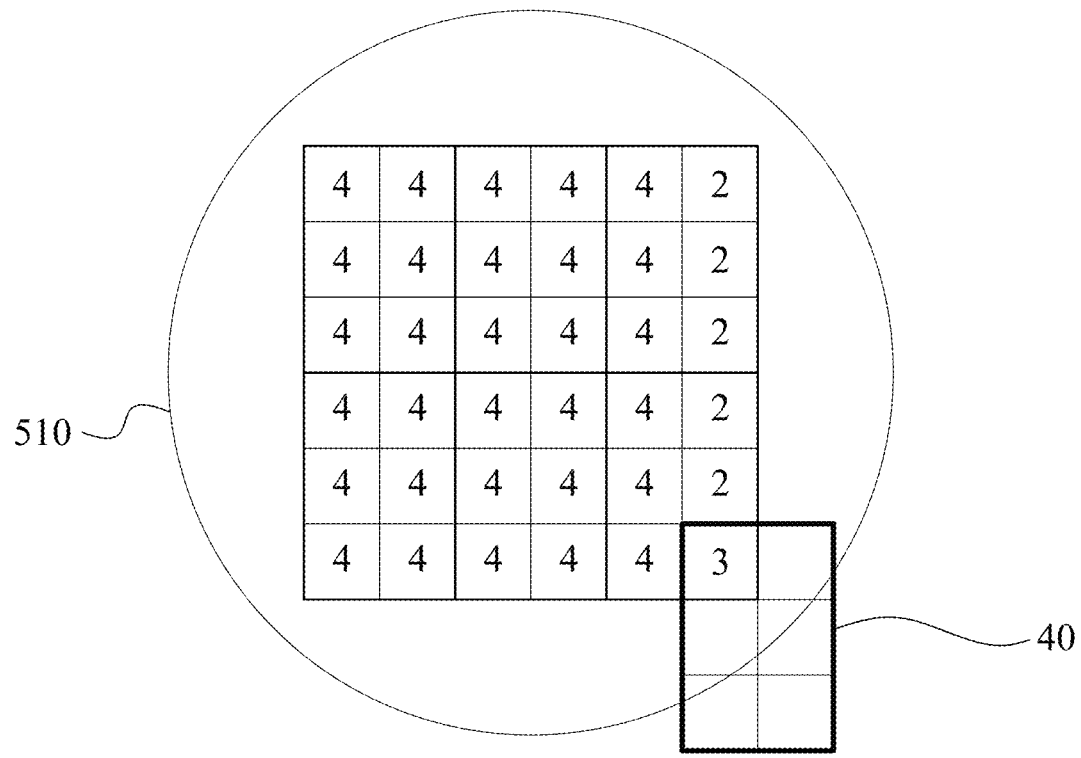
FIG. 45 shows one of various sequential operations in a method of exposing a semiconductor substrate according to an embodiment of the present disclosure.

The mask 40 is subsequently moved to the right relative to the wafer 510 in FIG. 45, and the bottom die in the sixth column is exposed at less than the optimum exposure dose. Thus, the bottom die of the sixth column has been exposed three times.

Figure 46:
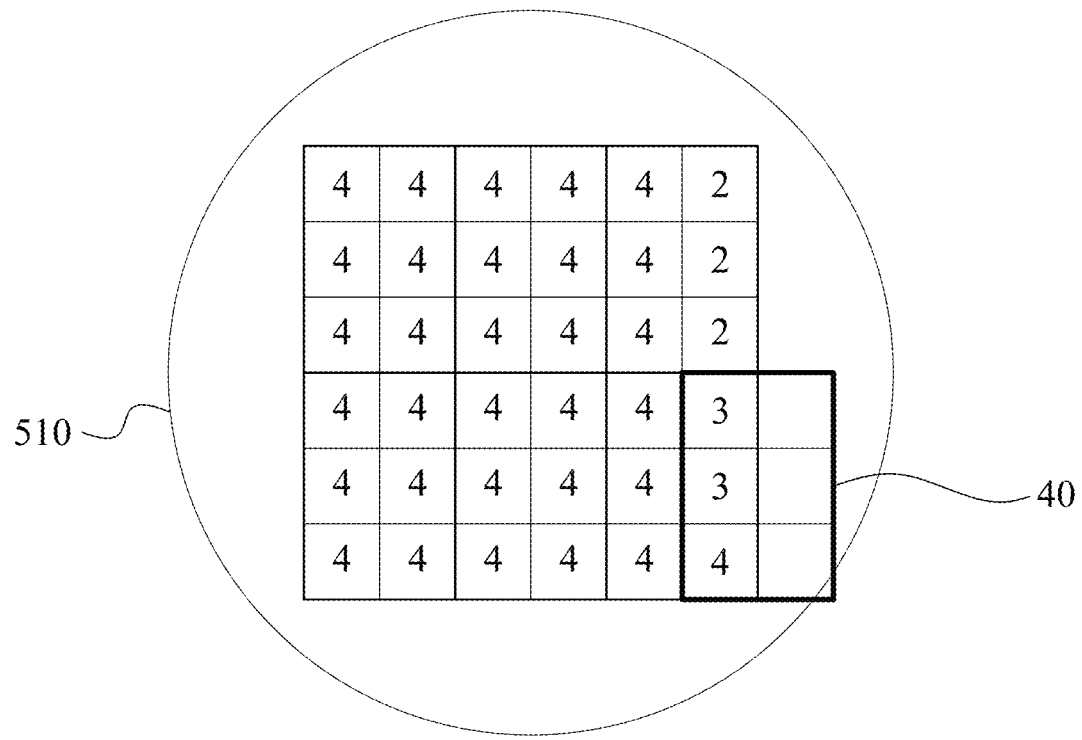
FIG. 46 shows one of various sequential operations in a method of exposing a semiconductor substrate according to an embodiment of the present disclosure.

In FIG. 46, the mask 40 is moved up relative to the wafer 510 and four dies are exposed at less than the optimum exposure dose. The bottom die in the sixth column has now been exposed four times, and the second and third dies from the bottom of the sixth column have been exposed three times.

Figure 47:
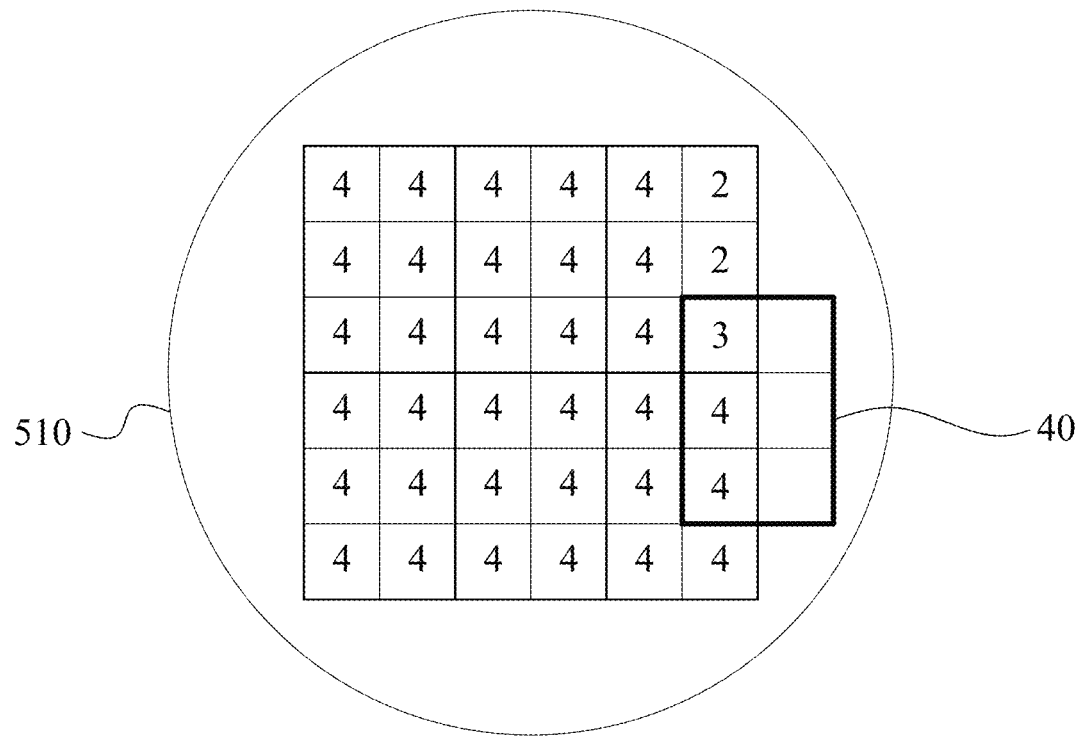
FIG. 47 shows one of various sequential operations in a method of exposing a semiconductor substrate according to an embodiment of the present disclosure.

As shown in FIG. 47, the mask 40 is moved up relative to the wafer 510 and an exposure at an exposure dose less than the optimum exposure dose is performed. The second and third dies from the bottom of the sixth column have been exposed four times and the third die from the top of the sixth column has been exposed once.

Figure 48:
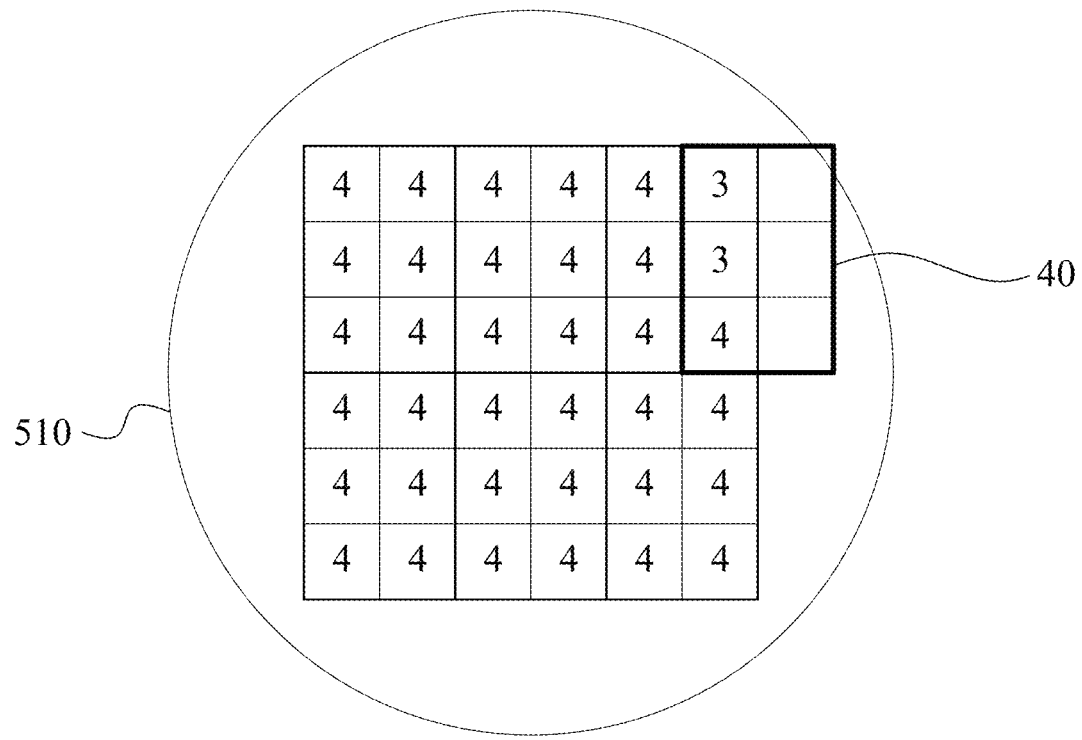
FIG. 48 shows one of various sequential operations in a method of exposing a semiconductor substrate according to an embodiment of the present disclosure.

The mask 40 is subsequently moved up relative to the wafer 510 in FIG. 48, and an exposure at less than the optimum exposure dose is performed. The two uppermost dies in the sixth column have now been exposed three times, and the third die from the top of the sixth column has been exposed four times.

Figure 49:
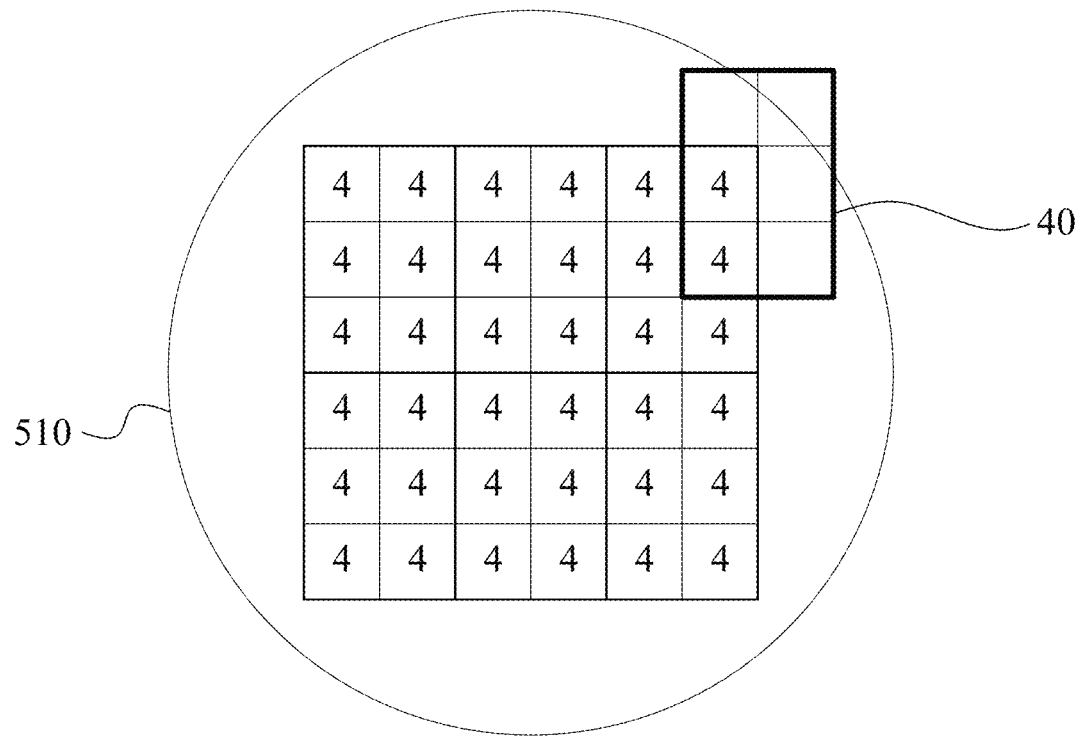
FIG. 49 shows one of various sequential operations in a method of exposing a semiconductor substrate according to an embodiment of the present disclosure.

In FIG. 49, the mask 40 is moved up relative to the wafer 510 and the wafer 510 is exposed at less than the optimum exposure dose is performed. The two uppermost dies of the sixth column have been exposed four times, thus, all the dies in the 6×6 array have been exposed four times.

The 6×6 array of dies on the semiconductor wafer 510 or the 2×3 array of dies in one phase-shifting mask of FIGS. 15-49 are examples of the disclosure and the present disclosure is not limited to a wafer with 36 dies or a mask with 6 identical die patterns. In some embodiments, fewer than 36 dies or more than 36 dies are exposed. In the embodiment of FIGS. 15-49, the mask 40 was moved or stepped relative to the wafer 510 in a cycle of stepping from one die to an adjacent die, then stepping two dies away, followed by stepping to an adjacent die, and alternating between a one-die step and a two-die step.

In some embodiments, the phase-shifting mask has a 2×2 array of dies, with each die having the same pattern. When a phase-shifting mask having a 2×2 array of dies is used the mask is stepped one die at a time between exposure shots.

Figure 50:
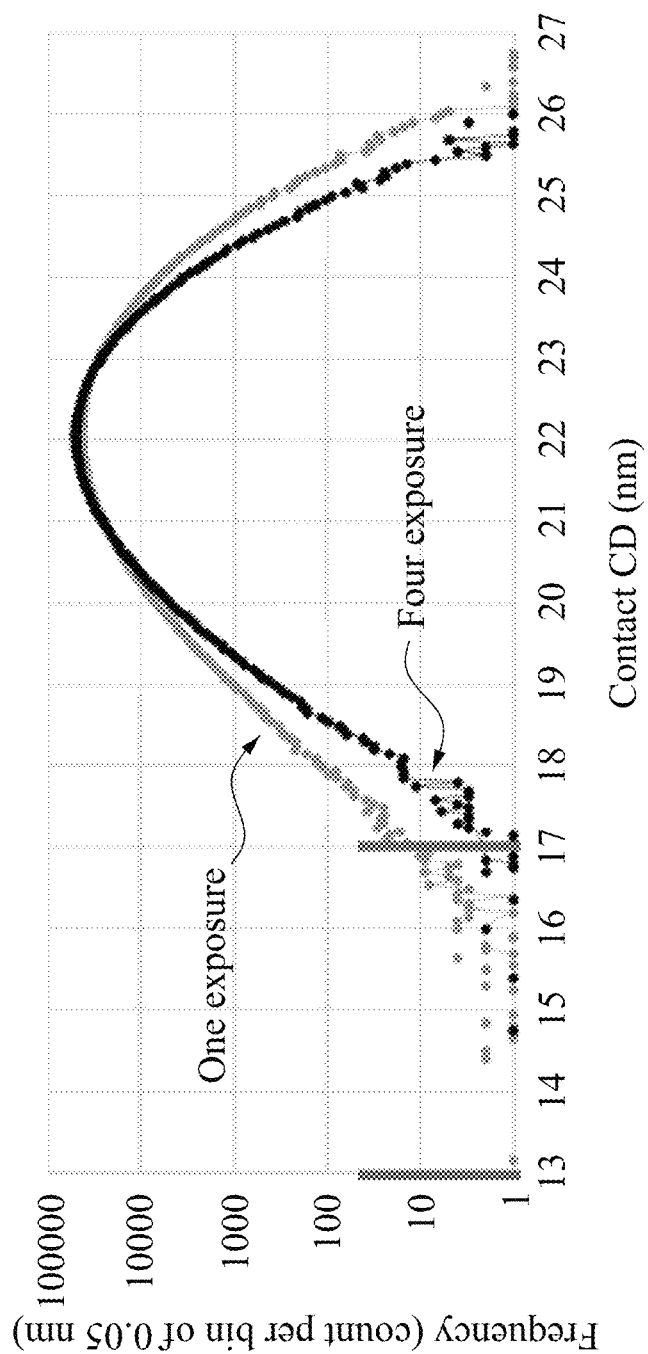
FIG. 50 shows a comparison between a single exposure and 4 exposures using 4 different masks on the same region of a semiconductor wafer according to embodiments of the disclosure.

As shown in FIG. 50, methods according to the disclosed embodiments provide an unexpected decrease in defects. For example, CD variation is dramatically reduced especially at the ends of the distribution, which correspond to features close to the edge of printability, as shown in the histograms. A single exposure process produced 120 failures at a critical dimension of 22+/−5 nm, while a four exposure process reduced the number of failures to 12 in some embodiments, as shown in the region between the vertical bars in FIG. 50. The region bounded by the vertical bars is below 17 nm (the lower acceptable limit of the critical dimension).

In some embodiments, a method of inspecting a phase-shifting mask is provided. The method includes inspecting a phase-shifting mask including a plurality of the same circuit patterns. The phase-shifting mask is inspected. If a defect is found at a specific location of one of the circuit patterns and not found at the same locations in other same circuit patterns on the phase-shifting mask the mask passes the inspection. If a defect is found in one mask pattern it will not be resolved in the imaged photoresist in some embodiments.

In some embodiments, a phase-shifting mask having a plurality of the same circuit patterns is provided. One of the plurality of the same circuit patterns has a defect at a specific location. The other same circuit patterns do not have the same defect at the same location. The phase-shifting mask is acceptable for use in a photolithography process in some embodiments because the defect on only one of the plurality of same circuit patterns will not be resolved in the imaged photoresist exposed using the mask with the defect.

It is desirable to improve resolution of the EUVL operation in order to increase the yield of semiconductor devices. In some cases, pattern defects in a mask or particulate contamination on a mask surface cause defects in a photoresist layer pattern when the photomask with the defect or contaminant is used to form the pattern in the photoresist layer. To improve exposure resolution in an EUVL operation and to avoid defective patterns due to particles or mask defects, multiple exposures of the photoresist-covered wafer is performed. For example, in some embodiments each die on the photoresist-coated wafer is exposed four times with the same pattern, using a different portion of the mask. In some embodiments, the exposure mask includes the same pattern in four adjacent locations on the mask, and as the wafer is moved relative to the exposure beam, each die is exposed four times to the same pattern. To prevent overexposure of a given die, the exposure dose from each exposure is one-fourth the desired total exposure dose. The reduced exposure dose at each exposure is achieved by scanning the exposure beam quicker at each exposure, in some embodiments. Thus, the photoresist-coated wafer is exposed for a shorter period of time during each scanning exposure. For example, the scanning beam can be moved relative to the photoresist layer at four times the normal speed so that at each exposure each die is exposed for one-fourth the total exposure time. In some embodiments, the reduced exposure dose is achieved by moving the wafer stage quicker at each scanning exposure. It is not likely that a defect in or a particle contaminant on one pattern would be found in the same location in another pattern of the mask. Because each exposure is below the desired total exposure, isolated defects or particles on one portion of the mask will not be imaged into the photoresist layer. The cumulative exposure doses of the multiple exposures using different portions of the mask having the same circuit or chip pattern will reproduce the pattern in the photoresist without imaging the isolated defects or particles, according to embodiments of the disclosure.

Although performing the multiple exposures at different depths of focus may increase the time it takes to expose all the dies on the wafer, the overall semiconductor device manufacturing method is more efficient because of the decrease in defects and increased device yield provided by embodiments of the disclosure. Multiple exposures of the same portion of a photoresist layer by different portions of a phase-shifting mask having the same circuit pattern prevents defects or contaminant particles formed on a single mask pattern from adversely affecting the pattern formed in the photoresist layer using the mask with the defect or particulate contamination. Performing the methods of the present disclosure provides improved image log slope (ILS), which is a measure of the steepness of an image in the transition from bright to dark, and improved mask error enhancement factor (MEEF), which is the ratio of the change in resist feature width to the change in mask feature width.

An embodiment of the disclosure is an extreme ultraviolet lithography (EUVL) method, including providing at least two phase-shifting mask areas having a same pattern, and forming a resist layer over a substrate. An optimum exposure dose of the resist layer is determined. A latent image is formed on a same area of the resist layer by a multiple exposure process. The multiple exposure process includes a plurality of exposure processes and each of the plurality of exposure processes uses a different phase-shifting mask area from the at least two phase-shifting mask areas having a same pattern. In an embodiment, at least one of the at least two phase-shifting mask areas includes a defect. In an embodiment, the at least two phase-shifting mask areas are from a single phase-shifting mask. In an embodiment, the at least two phase-shifting mask areas are from at least two phase-shifting masks. In an embodiment, the optimum exposure dose is based on an exposure dose for a pattern on one of the at least two phase-shifting mask areas to achieve a target dimension under a corresponding single exposure process. In an embodiment, the exposure dose of each of the plurality of exposure processes is less than the optimum exposure dose. In an embodiment, the exposure dose of each of the plurality of exposure processes is equal to each other. In an embodiment, the exposure dose of each of the plurality of exposure processes is different from each other. In an embodiment, a sum of the exposure doses of the plurality of exposure processes is within a range of 90% to 110% of the optimum exposure dose. In an embodiment, the forming a latent image on a same area of the resist layer includes performing four exposure processes, each of which uses a different phase-shifting mask area having the same pattern.

Another embodiment of the disclosure is an extreme ultraviolet lithography (EUVL) method, including providing at least two phase-shifting masks having a same circuit pattern, and forming a resist layer over a substrate. An optimum exposure dose of the resist layer is determined, and the resist layer is irradiated with extreme ultraviolet radiation using the at least two phase-shifting masks to expose a same area of the resist layer multiple times using each of the at least two phase-shifting masks. The irradiating the resist layer with extreme ultraviolet radiation includes a plurality of exposures, and each of the plurality of exposures uses an exposure dose of extreme ultraviolet radiation that is less than the optimum exposure dose. In an embodiment, at least one of the at least two phase-shifting masks includes a defect. In an embodiment, the optimum exposure dose is based on an exposure dose for a pattern on one of the two phase-shifting masks to achieve a target dimension under a corresponding single exposure process. In an embodiment, a sum of the exposure dose of each of the plurality of exposure processes is within a range of 90% to 110% of the optimum exposure dose. In an embodiment, the exposure dose of each of the plurality of exposure processes is different from each other. In an embodiment, the exposure dose of each of the plurality of exposure processes is equal to each other. In an embodiment, the exposure of each area of the resist layer is an accumulation of four exposures, each of which uses a different mask area with a same circuit pattern.

Another embodiment of the disclosure is an extreme ultraviolet lithography (EUVL) method, including providing at least two phase-shifting mask areas having a same pattern, and at least one of the at least two phase-shifting mask areas includes a defect. A resist layer is formed over a substrate. An optimum exposure dose is determined based on an exposure dose for a pre-specified pattern on one of the at least two phase-shifting mask areas to achieve a target dimension under a corresponding single exposure process. A latent image is formed in the resist layer using the at least two phase-shifting mask areas. The forming a latent image includes: performing at least two exposures on a same area of the resist layer, wherein each of the at least two exposures uses an exposure dose that is less than the optimum exposure dose, and a sum of the exposure doses of the at least two exposures is within 90% to 110% of the optimum exposure dose. In an embodiment, the performing at least two exposures includes projecting the same pattern of the at least two phase-shifting mask areas on the same area of the resist layer. In an embodiment, the at least two phase-shifting mask areas are from a single phase-shifting mask. In an embodiment, the at least two phase-shifting mask areas are from at least two phase-shifting masks. In an embodiment, the exposure dose of each of the at least two exposures are equal to each other. In an embodiment, the exposure dose of each of the at least two exposures are different from each other.

Another embodiment of the disclosure is a method including providing a first phase-shifting mask area, and providing a second phase-shifting mask area having a same pattern as the first phase-shifting mask area. A resist layer is formed over a substrate, and an optimum exposure dose is determined for the resist layer. A same area of the resist layer is exposed using at least the first phase-shifting mask area with a first exposure dose and to the second phase-shifting mask area with a second exposure dose. The first exposure dose and the second exposure dose are both less than the optimum exposure dose. In an embodiment, the first phase-shifting mask area and the second phase-shifting mask area are from a single phase-shifting mask. In an embodiment, the first phase-shifting mask area and the second phase-shifting mask area are from two phase-shifting masks. In an embodiment, at least one of the first phase-shifting mask area and the second phase-shifting mask area has a defect. In an embodiment, the first exposure dose is different from the second exposure dose. In an embodiment, the first exposure dose is equal to the second exposure dose. In an embodiment, a sum of all the exposure doses to the same area of the resist layer is within 90% to 110% of the optimum exposure dose.

Another embodiment of the disclosure is a photolithography apparatus, including a radiation source, and a phase-shifting mask including a first mask area and a second mask area, both having a same pattern. A mask stage is configured to support the phase-shifting mask, and a wafer stage is configured to support a wafer. A controller is configured to: determine an optimum exposure dose for a resist layer coated on the wafer, control an exposure of a first portion of the resist layer to a first exposure dose using the first mask area of the phase-shifting mask, control moving of the wafer relative to the phase-shifting mask; and control an exposure of the first portion of the resist layer to a second exposure dose using the second mask area of the phase-shifting mask, and an exposure of a second portion of the resist layer to the second exposure dose using the first mask area of the phase-shifting mask. In an embodiment, the phase-shifting mask is a reflective mask. In an embodiment, the radiation source is an extreme ultraviolet radiation source. In an embodiment, the phase-shifting mask includes a third mask area and a fourth mask area, both having the same pattern as that in the first mask area or the second mask area. In an embodiment, the controller is further configured to control an exposure of the first portion of the resist layer to a third exposure dose using a third mask area of the phase-shifting mask, an exposure of the second portion of the resist layer to the third exposure dose using the second mask area of the phase-shifting mask, and an exposure of a third portion of the resist layer to the third exposure dose using the first mask area of the phase-shifting mask, wherein the third mask area has the same pattern as that in the first mask area or the second mask area. In an embodiment, the controller is further configured to control an exposure of the first portion of the resist layer to a fourth exposure dose using a fourth mask area of the phase-shifting mask, an exposure of the second portion of the resist layer to the fourth exposure dose using the third mask area of the phase-shifting mask, an exposure of the third portion of the resist layer to the fourth exposure dose using the second mask area of the phase-shifting mask, and an exposure of a fourth portion of the resist layer to the fourth exposure dose using the first mask area of the phase-shifting mask, wherein the fourth mask area has the same pattern as that in the first mask area or the second mask area or the third mask area. In an embodiment, the controller is further configured to control additional exposures such that each portion of the resist layer is exposed by a same number of different mask areas. In an embodiment, the wafer stage is configured for lateral movement during scanning exposure operations and stepping movement from one die to another die. In an embodiment, the wafer stage is further configured to move in a vertical direction and configured to rotate around a horizontal axis.

Another embodiment of the disclosure is a photolithography apparatus, including a radiation source, and a first phase-shifting mask and a second phase-shifting mask, both having a same pattern. A mask stage is configured to support the first phase-shifting mask, and a wafer stage is configured to support a wafer. A controller is configured to: determine an optimum exposure dose for a resist layer coated on the wafer, control an exposure of a portion of the resist layer to a first exposure dose using the first phase-shifting mask, control exchanging the first phase-shifting mask for the second phase-shifting mask on the mask stage, and control an exposure of the portion of the resist layer to a second exposure dose using the second phase-shifting mask. In an embodiment, both the first phase-shifting mask and the second phase-shifting mask are reflective masks. In an embodiment, the radiation source is an extreme ultraviolet radiation source. In an embodiment, the wafer stage is configured for lateral movement during scanning exposure operations and stepping movement from one die to another die. In an embodiment, the controller is further configured to control the movements of the wafer stage. In an embodiment, the photolithographic apparatus includes a third phase-shifting mask, wherein the third phase-shifting mask has the same circuit pattern as the first phase-shifting mask and the second phase-shifting mask. In an embodiment, the photolithographic apparatus includes a fourth phase-shifting mask, wherein the fourth phase-shifting mask has the same circuit pattern as the first, second, and third phase-shifting masks. In an embodiment, the controller is further configured to control an exposure of the first portion of the photoresist layer to a third exposure dose of radiation using a third phase-shifting mask, an exposure of the second portion of the photoresist layer to the third exposure dose of radiation using the second phase-shifting mask, and an exposure of a third portion of the photoresist layer to the third exposure dose using the first phase-shifting mask, wherein the third phase-shifting mask has the same circuit pattern as the first phase-shifting mask and the second phase-shifting mask. In an embodiment, the controller is further configured to control an exposure of the first portion of the photoresist layer to a fourth exposure dose of radiation using a fourth phase-shifting mask, an exposure of the second portion of the photoresist layer to the fourth exposure dose of radiation using the third phase-shifting mask, an exposure of the third portion of the photoresist layer to the fourth exposure dose of radiation using the second phase-shifting mask, and an exposure of a fourth portion of the photoresist layer to the fourth exposure dose of radiation using the first phase-shifting mask, wherein the fourth phase-shifting mask has the same circuit pattern as the first, second, and third phase-shifting masks. In an embodiment, the controller is further configured to control additional exposure steps such that each portion of the photoresist layer is exposed a same number of times. In an embodiment, the wafer stage is further configured to move in a vertical direction and configured to rotate around a horizontal axis.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet lithography (EUVL) method, comprising:
   providing at least two phase-shifting mask areas having a same pattern;
   forming a resist layer over a substrate;
   determining an optimum exposure dose of the resist layer; and
   forming a latent image on a same area of the resist layer by a multiple exposure process,
   wherein the multiple exposure process comprises a plurality of exposure processes and each of the plurality of exposure processes uses a different phase-shifting mask area from the at least two phase-shifting mask areas having a same pattern.

2. The EUVL method of claim 1, wherein at least one of the at least two phase-shifting mask areas includes a defect.

3. The EUVL method of claim 1, wherein the at least two phase-shifting mask areas are from a single phase-shifting mask.

4. The EUVL method of claim 1, wherein the at least two phase-shifting mask areas are from at least two phase-shifting masks.

5. The EUVL method of claim 1, wherein the optimum exposure dose is based on an exposure dose for a pattern on one of the at least two phase-shifting mask areas to achieve a target dimension under a corresponding single exposure process.

6. The EUVL method of claim 1, wherein the exposure dose of each of the plurality of exposure processes is less than the optimum exposure dose.

7. The EUVL method of claim 1, wherein the exposure dose of each of the plurality of exposure processes is equal to each other.

8. The EUVL method of claim 1, wherein the exposure dose of each of the plurality of exposure processes is different from each other.

9. The EUVL method of claim 1, wherein a sum of the exposure doses of the plurality of exposure processes is within a range of 90% to 110% of the optimum exposure dose.

10. The EUVL method of claim 1, wherein the forming a latent image on a same area of the resist layer includes performing four exposure processes, each of which uses a different phase-shifting mask area having the same pattern.

11. An extreme ultraviolet lithography (EUVL) method, comprising:
    providing at least two phase-shifting masks having a same circuit pattern;
    forming a resist layer over a substrate;
    determining an optimum exposure dose of the resist layer; and
    irradiating the resist layer with extreme ultraviolet radiation using the at least two phase-shifting masks to expose a same area of the resist layer multiple times using each of the at least two phase-shifting masks,
    wherein the irradiating the resist layer with extreme ultraviolet radiation comprises a plurality of exposures,
    each of the plurality of exposures is through the same circuit pattern on a different one of the at least two phase-shifting masks, and
    each of the plurality of exposures uses an exposure dose of extreme ultraviolet radiation that is less than the optimum exposure dose.

12. The method of claim 11, wherein at least one of the at least two phase-shifting masks includes a defect.

13. The method of claim 11, wherein the optimum exposure dose is based on an exposure dose for a pattern on one of the two phase-shifting masks to achieve a target dimension under a corresponding single exposure process.

14. The method of claim 11, wherein a sum of the exposure dose of each of the plurality of exposure processes is within a range of 90% to 110% of the optimum exposure dose.

15. The method of claim 11, wherein the exposure dose of each of the plurality of exposure processes is different from each other.

16. The method of claim 11, wherein the exposure of each area of the resist layer is an accumulation of four exposures, each of which uses a different mask area with a same circuit pattern.

17. An extreme ultraviolet lithography (EUVL) method, the EUVL method comprising: providing at least two phase-shifting mask areas having a same pattern,
- wherein at least one of the at least two phase-shifting mask areas includes a defect;
- forming a resist layer over a substrate;
- determining an optimum exposure dose based on an exposure dose for a pre-specified pattern on one of the at least two phase-shifting mask areas to achieve a target dimension under a corresponding single exposure process; and
- forming a latent image in the resist layer using the at least two phase-shifting mask areas, wherein the forming a latent image includes:
- performing at least two exposures on a same area of the resist layer,
- wherein each of the at least two exposures uses an exposure dose that is less than the optimum exposure dose,
- wherein a sum of the exposure doses of the at least two exposures is within 90% to 110% of the optimum exposure dose, and
- each of the at least two exposures is through the same pattern on a different one of the at least two phase-shifting masks.

18. The EUVL method of claim 17, wherein the performing at least two exposures includes projecting the same pattern of the at least two phase-shifting mask areas on the same area of the resist layer.

19. The EUVL method of claim 17, wherein the at least two phase-shifting mask areas are from a single phase-shifting mask.

20. The EUVL method of claim 17, wherein the at least two phase-shifting mask areas are from at least two phase-shifting masks.

* * * * *